US012805183B2

(12) United States Patent
Kim et al.

(10) Patent No.: US 12,805,183 B2
(45) Date of Patent: Nov. 17, 2026

(54) ORGANIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Hyeongmin Kim, Yongin-si (KR); Youngjin Park, Yongin-si (KR); Heechoon Ahn, Yongin-si (KR); Hyunah Um, Yongin-si (KR); Juhui Yun, Yongin-si (KR); Yeseul Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 410 days.

(21) Appl. No.: 18/478,518

(22) Filed: Sep. 29, 2023

(65) Prior Publication Data

US 2024/0315127 A1 Sep. 19, 2024

(30) Foreign Application Priority Data

Mar. 3, 2023 (KR) ........................ 10-2023-0028748

(51) Int. Cl.

| | |
|---|---|
| ***H10K 85/40*** | (2023.01) |
| ***C07F 7/08*** | (2006.01) |
| ***C09K 11/06*** | (2006.01) |
| ***H10K 50/11*** | (2023.01) |
| ***H10K 85/60*** | (2023.01) |

(52) U.S. Cl.

CPC ........... *H10K 85/40* (2023.02); *C07F 7/0816* (2013.01); *C09K 11/06* (2013.01); *C07B 2200/05* (2013.01); *C09K 2211/1018* (2013.01); *H10K 50/11* (2023.02); *H10K 85/654* (2023.02); *H10K 85/6572* (2023.02)

(58) Field of Classification Search

CPC ........... C07F 7/0816; C09K 2211/1059; C09K 2211/1029

See application file for complete search history.

(56) References Cited

FOREIGN PATENT DOCUMENTS

| | | | | |
|---|---|---|---|---|
| JP | 2021-066689 A | | 4/2021 | |
| KR | 10-1311934 B1 | | 9/2013 | |
| KR | 10-2014-0079306 A | | 6/2014 | |
| KR | 10-2015-0005331 A | | 1/2015 | |
| KR | 20170090942 A | * | 8/2017 | ............ C07F 7/0807 |
| WO | WO-2011055912 A1 | * | 5/2011 | ............ C07F 7/0807 |

* cited by examiner

*Primary Examiner* — Alexander R Pagano
*Assistant Examiner* — Frank S. Hou
(74) *Attorney, Agent, or Firm* — Womble Bond Dickinson (US) LLP

(57) ABSTRACT

A light-emitting device includes a first electrode, a second electrode facing the first electrode, an interlayer between the first electrode and the second electrode and including an emission layer, and an organic compound represented by Formula 1:

Formula 1

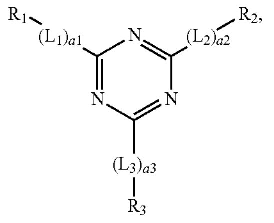

where, in Formula 1, $R_3$ is a group represented by Formula 2:

Formula 2

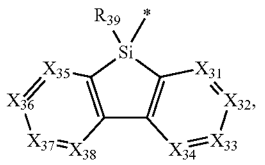

where, in Formula 2, at least one selected from among $X_{31}$ to $X_{38}$ is N.

17 Claims, 6 Drawing Sheets

ORGANIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2023-0028748, filed on Mar. 3, 2023, in the Korean Intellectual Property Office, the content of which is incorporated by reference herein in its entirety.

BACKGROUND

1. Field

One or more embodiments of the present disclosure relate to an organic compound, a light-emitting device including the organic compound, and an electronic apparatus including the light-emitting device.

2. Description of the Related Art

A light-emitting device may include a first electrode, a hole transport region, an emission layer, an electron transport region, and a second electrode that are sequentially arranged. Holes provided from the first electrode may move toward the emission layer through the hole transport region. Electrons provided from the second electrode may move toward the emission layer through an electron injection layer and/or an electron transport layer in the electron transport region. Carriers, such as the holes and the electrons, may combine in the emission layer to generate excitons. The excitons may transition and decay from an excited state to a ground state, thereby generating light.

SUMMARY

One or more aspects of embodiments of the present disclosure are directed toward an organic compound that emits blue light and has improved charge transfer characteristics, and a light-emitting device and electronic apparatus that have improved luminescence efficiency, improved maximum quantum efficiency, and/or excellent or suitable triplet energy by including the organic compound.

Additional aspects will be set forth in part in the description which follows and, in part, will be apparent from the description, or may be learned by practice of the presented embodiments of the present disclosure.

According to one or more embodiments of the present disclosure, a light-emitting device includes:

a first electrode, a second electrode facing the first electrode, an interlayer between the first electrode and the second electrode and including an emission layer, and an organic compound represented by Formula 1:

Formula 1

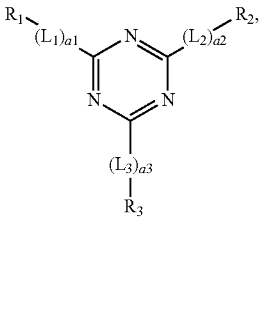

wherein, in Formula 1, $L_1$ to $L_3$, $R_1$, and $R_2$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, each of a1 to a3 may be an integer from 0 to 2, when a1 is 0, $(L_1)_{a1}$ may be a single bond, and when a1 is 2, two of $L_1$(s) may be identical to or different from each other, when a2 is 0, $(L_2)_{a2}$ may be a single bond, and when a2 is 2, two of $L_2$(s) may be identical to or different from each other, when a3 is 0, $(L_3)_{a3}$ may be a single bond, and when a3 is 2, two of $L_3$(s) may be identical to or different from each other, and $R_3$ may be a group represented by Formula 2, Formula 2

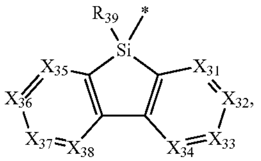

wherein, in Formula 2, $X_{31}$ may be N or $C(R_{31})$, $X_{32}$ may be N or $C(R_{32})$, $X_{33}$ may be N or $C(R_{33})$, $X_{34}$ may be N or $C(R_{34})$, $X_{35}$ may be N or $C(R_{35})$, $X_{36}$ may be N or $C(R_{36})$, $X_{37}$ may be N or $C(R_{37})$, $X_{38}$ may be N or $C(R_{38})$, at least one selected from among $X_{31}$ to $X_{38}$ may be N, $R_{10a}$ and $R_{31}$ to $R_{39}$ may each independently be:

hydrogen, deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_{11}$ to $Q_{13}$, $Q_{21}$ to $Q_{23}$, and $Q_{31}$ to $Q_{33}$ may each independently be:

hydrogen, deuterium, —F, a cyano group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a biphenyl group, or a terphenyl group;

a $C_3$-$C_{60}$ carbocyclic group unsubstituted or substituted with deuterium, —F, a cyano group, a $C_1$-$C_{60}$ alkyl group, a phenyl group, a biphenyl group, a terphenyl group, or any combination thereof;

a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof; or a $C_3$-$C_{60}$ carbocyclic group or a $C_1$-$C_{60}$ heterocyclic group, each unsubstituted or substituted with a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof, and

* indicates a binding site to a neighboring atom.

According to one or more embodiments of the present disclosure, an electronic apparatus includes the light-emitting device; a thin-film transistor electrically connected to the light-emitting device; and a color filter, a color conversion layer, a touch screen layer, a polarizing layer, or any combination thereof.

According to one or more embodiments of the present disclosure, electronic equipment includes the light-emitting device, wherein the electronic equipment is at least one of a flat panel display, a curved display, a computer monitor, a medical monitor, a television, a billboard, a light for indoor or outdoor lighting and/or signaling, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro display, a 3D display, a virtual or augmented reality display, a vehicle, a video wall including multiple displays tiled together, a theater or stadium screen, a phototherapy device, or a signboard.

According to one or more embodiments of the present disclosure, provided is an organic compound represented by Formula 1.

BRIEF DESCRIPTION OF THE DRAWINGS

The accompanying drawings are included to provide a further understanding of the present disclosure and are incorporated in and constitute a part of the present disclosure. The drawings illustrate embodiments of the present disclosure and, together with the description, serve to explain principles of the present disclosure. The above and other aspects, features, and advantages of certain embodiments of the disclosure will be more apparent from the following description taken in conjunction with the accompanying drawings, in which.

DETAILED DESCRIPTION

Figure 1:
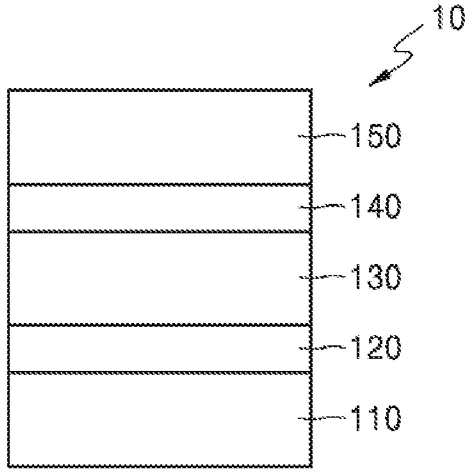
FIG. 1 is a schematic view of a light-emitting device according to one or more embodiments of the present disclosure.

Reference will now be made in more detail to embodiments, examples of which are illustrated in the accompanying drawings, wherein like reference numerals refer to like elements throughout the present disclosure, and duplicative descriptions thereof may not be provided for conciseness. In this regard, the embodiments of the present disclosure may have different forms and should not be construed as being limited to the descriptions set forth herein. Accordingly, the embodiments of the present disclosure are merely described, by referring to the drawings, to explain aspects of the present disclosure. As utilized herein, the term "and/or" or "or" may include any and all combinations of one or more of the associated listed items. Throughout the disclosure, the expressions such as "at least one of," "one of," and "selected from," when preceding a list of elements, modify the entire list of elements and do not modify the individual elements of the list. For example, "at least one of a, b or c", "at least one selected from a, b, and c", "at least one selected from among a to c", etc., may indicate only a, only b, only c, both (e.g., simultaneously) a and b, both (e.g., simultaneously) a and c, both (e.g., simultaneously) b and c, all of a, b, and c, or variations thereof. The "/" utilized herein may be interpreted as "and" or as "or" depending on the situation.

According to one or more embodiments of the present disclosure, a light-emitting device may include:

a first electrode;

a second electrode facing the first electrode;

an interlayer between the first electrode and the second electrode and including an emission layer; and an organic compound represented by Formula 1:

Formula 1

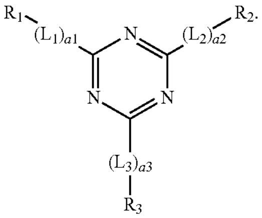

In Formula 1, $L_1$ to $L_3$, $R_1$, and $R_2$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, each of a1 to a3 may be an integer from 0 to 2, when a1 is 0, $(L_1)_{a1}$ may be a single bond, and when a1 is 2, two of $L_1$(s) may be identical to or different from each other, when a2 is 0, $(L_2)_{a2}$ may be a single bond, and when a2 is 2, two of $L_2$(s) may be identical to or different from each other, when a3 is 0, $(L_3)_{a3}$ may be a single bond, and when a3 is 2, two of $L_3$(s) may be identical to or different from each other, and $R_3$ may be a group represented by Formula 2:

Formula 2

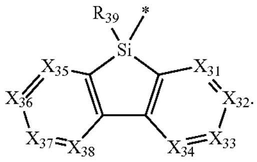

In Formula 2, $X_{31}$ may be N or $C(R_{31})$, $X_{32}$ may be N or $C(R_{32})$, $X_{33}$ may be N or $C(R_{33})$, $X_{34}$ may be N or $C(R_{34})$, $X_{35}$ may be N or $C(R_{35})$, $X_{36}$ may be N or $C(R_{36})$, $X_{37}$ may be N or $C(R_{37})$, $X_{38}$ may be N or $C(R_{38})$, at least one selected from among $X_{31}$ to $X_{38}$ may be N, $R_{10a}$ and $R_{31}$ to $R_{39}$ may each independently be:

hydrogen, deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_{11}$ to $Q_{13}$, $Q_{21}$ to $Q_{23}$, and $Q_{31}$ to $Q_{33}$ may each independently be:

hydrogen, deuterium, —F, a cyano group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a biphenyl group, or a terphenyl group;

a $C_3$-$C_{60}$ carbocyclic group unsubstituted or substituted with deuterium, —F, a cyano group, a $C_1$-$C_{60}$ alkyl group, a phenyl group, a biphenyl group, a terphenyl group, or any combination thereof;

a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof; or a $C_3$-$C_{60}$ carbocyclic group or a $C_1$-$C_{60}$ heterocyclic group, each unsubstituted or substituted with a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof, and

* indicates a binding site to a neighboring atom.

In one or more embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the interlayer may include the organic compound. For example, in one or more embodiments, the emission layer may include the organic compound.

In one or more embodiments, the emission layer may be to emit blue light. For example, in some embodiments, the emission layer may be to emit light having a maximum emission wavelength in a range of about 430 nm to about 475 nm, about 440 nm to about 475 nm, about 450 nm to about 475 nm, about 430 nm to about 470 nm, about 440 nm to about 470 nm, about 450 nm to about 470 nm, about 430 nm to about 465 nm, about 440 nm to about 465 nm, about 450 nm to about 465 nm, about 430 nm to about 460 nm, about 440 nm to about 460 nm, or about 450 nm to about 460 nm.

In one or more embodiments, the light-emitting device may include a capping layer arranged outside (e.g., on) the first electrode and/or outside (e.g., on) the second electrode.

For example, in one or more embodiments, the light-emitting device may further include at least one selected from a first capping layer arranged outside (e.g., on) the first electrode and a second capping layer arranged outside (e.g., on) the second electrode, and the organic compound represented by Formula 1 may be included in at least one of the first capping layer or the second capping layer. Details of the first capping layer and/or the second capping layer may be as described herein.

In one or more embodiments, the light-emitting device may include:

a first capping layer arranged outside (e.g., on) the first electrode and including the organic compound represented by Formula 1;

a second capping layer arranged outside (e.g., on) the second electrode and including the organic compound represented by Formula 1; or the first capping layer and the second capping layer.

The expression "(an interlayer and/or a capping layer) include(s) an organic compound" as utilized herein may include an embodiment in which "(an interlayer and/or a capping layer) include(s) identical organic compounds represented by Formula 1" and an embodiment in which "(an interlayer and/or a capping layer) include(s) two or more different organic compounds represented by Formula 1."

For example, in some embodiments, the interlayer and/or the capping layer may include Compound 1 only as the organic compound. In this regard, Compound 1 may be present in the emission layer of the light-emitting device. In some embodiments, the interlayer may include, as the organic compound, Compound 1 and Compound 2. In this regard, Compound 1 and Compound 2 may be present in substantially the same layer (for example, both (e.g., simultaneously) Compound 1 and Compound 2 may be present in the emission layer), or may be present in different layers (for example, Compound 1 may be present in the emission layer, and Compound 2 may be present in the electron transport region).

The term "interlayer" as utilized herein refers to a single layer and/or multiple layers between the first electrode and the second electrode of the light-emitting device.

According to one or more embodiments of the present disclosure, an electronic apparatus may include the light-emitting device. The electronic apparatus may further include a thin-film transistor. For example, in some embodiments, the electronic apparatus may further include a thin-film transistor including a source electrode and a drain electrode, wherein the first electrode of the light-emitting device may be electrically connected to the source electrode or the drain electrode of the thin-film transistor. In one or more embodiments, the electronic apparatus may further include a color filter, a color conversion layer, a touch screen layer, a polarizing layer, or any combination thereof. Details of the electronic apparatus may be as described herein.

According to one or more embodiments of the present disclosure, electronic equipment may include the light-emitting device, wherein the electronic equipment may be at least one of a flat panel display, a curved display, a computer monitor, a medical monitor, a television, a billboard, a light for indoor or outdoor lighting and/or signaling, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro display, a 3D display, a virtual or augmented reality display, a vehicle, a video wall including multiple displays tiled together, a theater or stadium screen, a phototherapy device, or a signboard.

According to one or more embodiments of the present disclosure, an organic compound represented by Formula 1 is provided.

In one or more embodiments, in Formula 1, $L_1$ to $L_3$ may each independently be a benzene group unsubstituted or substituted with at least one $R_{10a}$. In one or more embodiments, $L_3$ may be represented by one selected from Formulae 3-1 to 3-3:

3-1

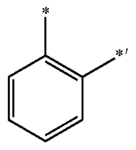

3-2

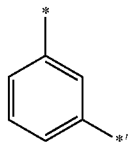

3-3

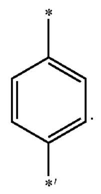

In Formulae 3-1 to 3-3,

* and *' each indicate a binding site to a neighboring atom.

In one or more embodiments, in Formula 1, each of a1 and a2 may be 0.

In one or more embodiments, in Formula 1, a3 may be 1.

In one or more embodiments, in Formula 1, $R_1$ and $R_2$ may each independently be a benzene group unsubstituted or substituted with at least one $R_{10a}$ or a carbazole group unsubstituted or substituted with at least one $R_{10a}$. In some embodiments, in Formula 1, at least one of $R_1$ or $R_2$ may be a carbazole group unsubstituted or substituted with at least one $R_{10a}$. In one or more embodiments, $R_1$ and $R_2$ may each independently be represented by one selected from Formulae 4-1 and 4-2:

4-1

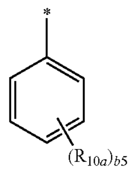

4-2

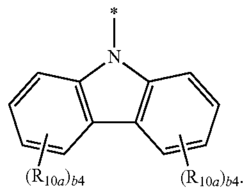

In Formulae 4-1 and 4-2, $R_{10a}$ may be as defined herein, b4 may be an integer from 0 to 4, b5 may be an integer from 0 to 5, and

* indicates a binding site to a neighboring atom.

In one or more embodiments, in Formulae 4-1 and 4-2, $R_{10a}$ may be deuterium. For example, in some embodiments, in Formulae 4-1 and 4-2, $R_{10a}$ may be deuterium, b4 may be an integer from 1 to 4, and b5 may be an integer from 1 to 5.

In one or more embodiments, in Formula 1, at least one of $R_1$ or $R_2$ may be a carbazole group unsubstituted or substituted with at least one $R_{10a}$. For example, in one or more embodiments, at least one of $R_1$ or $R_2$ may be represented by Formula 4-2.

In one or more embodiments, in Formula 1, at least one of $R_1$ or $R_2$ may not be a benzene group or a naphthylene group. For example, when $R_1$ is a benzene group unsubstituted or substituted with at least one $R_{10a}$, $R_2$ may not be a benzene group unsubstituted or substituted with at least one $R_{10a}$.

In one or more embodiments, in Formula 2, at least one selected from among $X_{31}$ to $X_{38}$ may be N. For example, in some embodiments, one (e.g., just one) selected from among $X_{31}$ to $X_{38}$ may be N; in some embodiments, two selected from among $X_{31}$ to $X_{38}$ may each be N; in some embodiments, three selected from among $X_{31}$ to $X_{38}$ may each be N; in some embodiments, four selected from among $X_{31}$ to $X_{38}$ may each be N; in some embodiments, five selected from among $X_{31}$ to $X_{38}$ may each be N; in some embodiments, six selected from among $X_{31}$ to $X_{38}$ may each be N; in some embodiments, seven selected from among $X_{31}$ to $X_{38}$ may each be N; or in some embodiments, each of $X_{31}$ to $X_{38}$ may be N.

In one or more embodiments, in Formula 2, at least two selected from among $X_{31}$ to $X_{38}$ may each be N.

In one or more embodiments, in Formula 2, at least one selected from among $X_{31}$ to $X_{34}$ may be N, and at least one selected from among $X_{35}$ to $X_{38}$ may be N.

In one or more embodiments, in Formula 2, i) each of $X_{31}$ and $X_{35}$ may be N, ii) each of $X_{32}$ and $X_{36}$ may be N, iii) each of $X_{33}$ and $X_{37}$ may be N, or iv) each of $X_{34}$ and $X_{38}$ may be N.

In one or more embodiments, in Formula 1, $R_3$ may be represented by one selected from among Formulae 2-1 to 2-4:

Formula 2-1

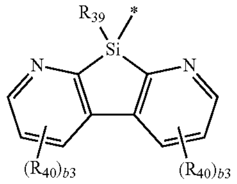

Formula 2-2

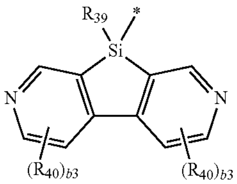

Formula 2-3

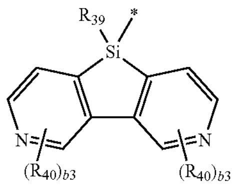

-continued

Formula 2-4

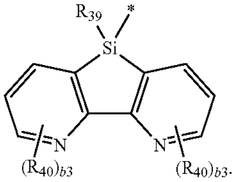

In Formulae 2-1 to 2-4, $R_{40}$ may be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a $C_3$-$C_{60}$ carbocyclic group, a $C_1$-$C_{60}$ heterocyclic group, or any combination thereof, b3 may be an integer from 0 to 3, and

* indicates a binding site to a neighboring atom.

In one or more embodiments, in Formulae 2-1 to 2-4, b3 may be 1, and $R_{40}$ may be a phenyl group.

In one or more embodiments, $R_{31}$ to $R_{39}$ may each independently be: hydrogen; deuterium; or a phenyl group unsubstituted or substituted with deuterium. For example, in some embodiments, $R_{31}$ to $R_{39}$ may each independently be hydrogen, deuterium, or a phenyl group. In some embodiments, at least one selected from among $R_{31}$ to $R_{39}$ may be a phenyl group unsubstituted or substituted with deuterium.

In one or more embodiments, in Formula 2, $R_{39}$ may be a phenyl group.

In one or more embodiments, the organic compound may be one selected from among Compounds 1 to 48:

1

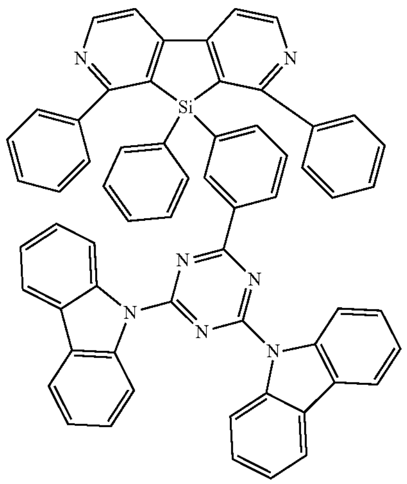

-continued
2
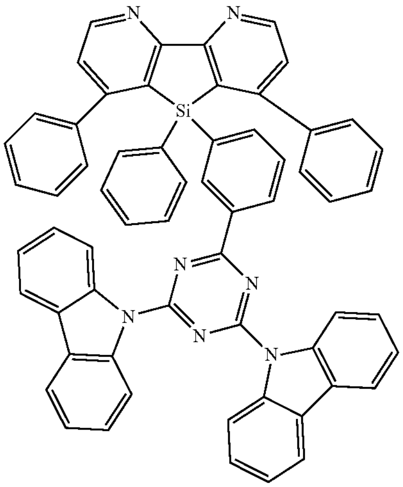
3
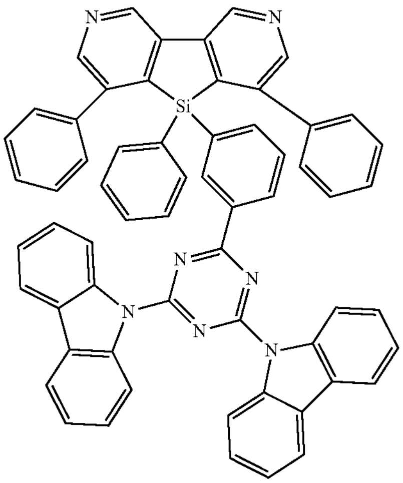
4
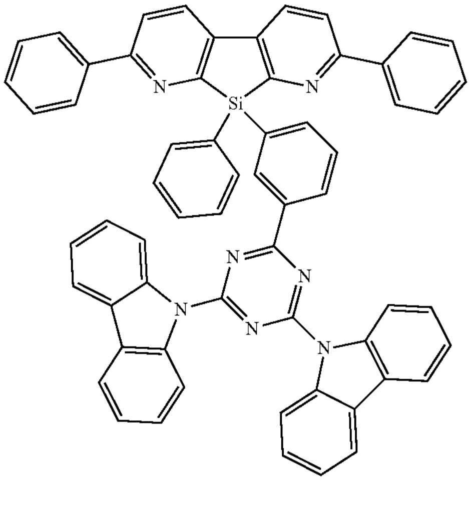
-continued
5
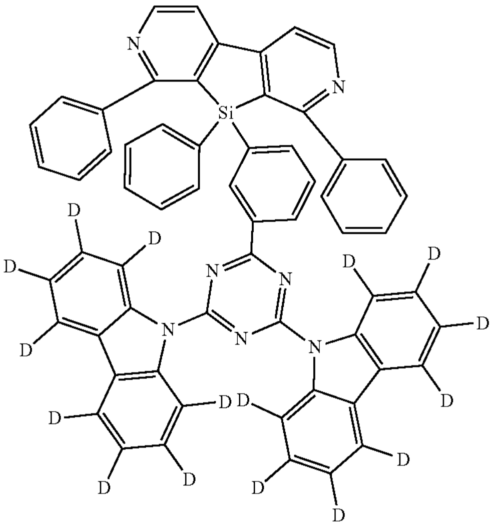
6
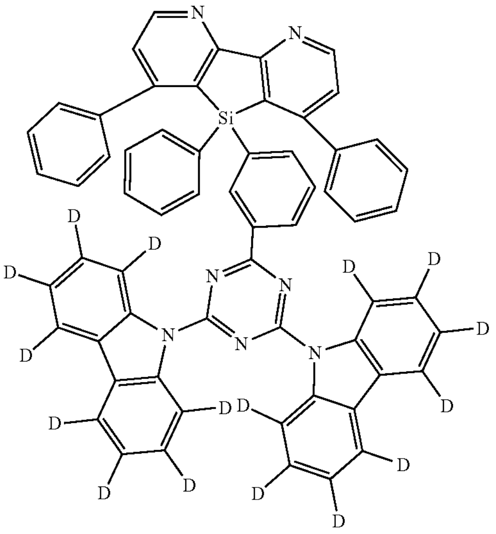
7
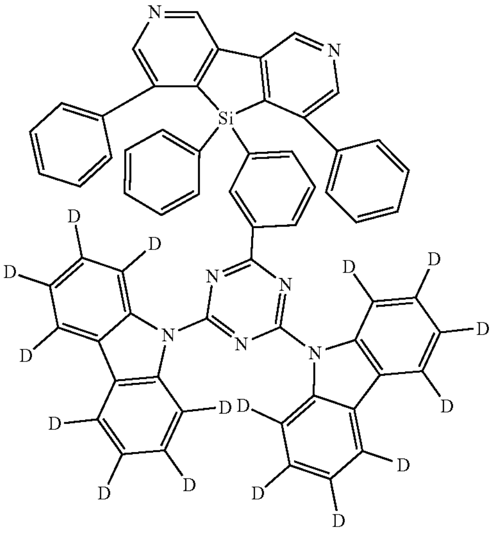

-continued
8
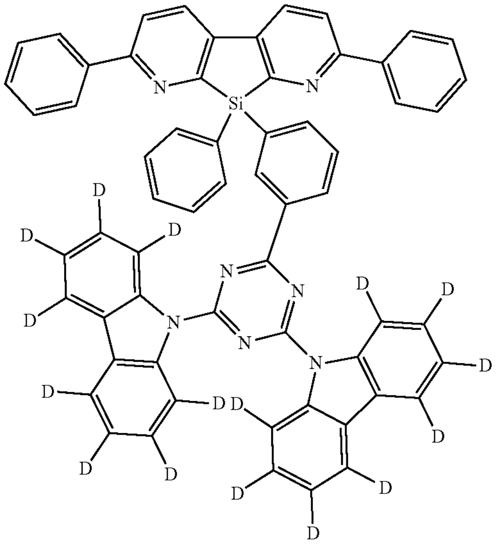
9
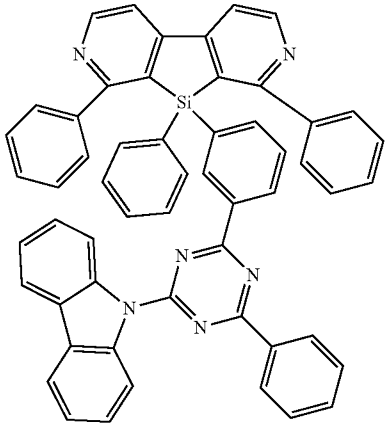
10
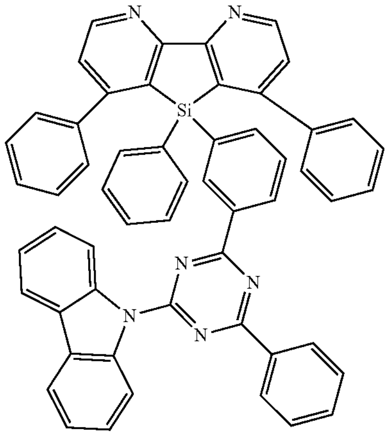
-continued
11
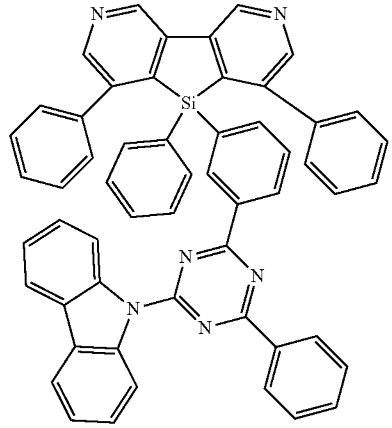
12
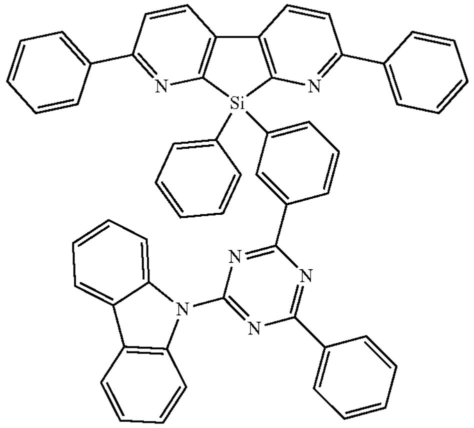
13
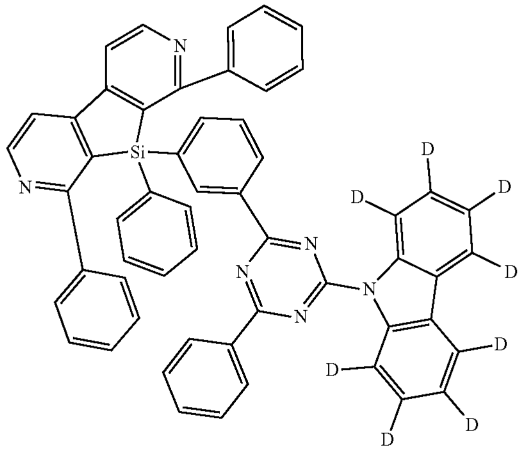

-continued
14
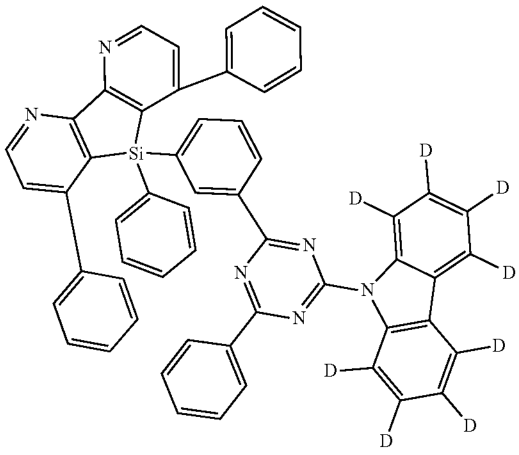
15
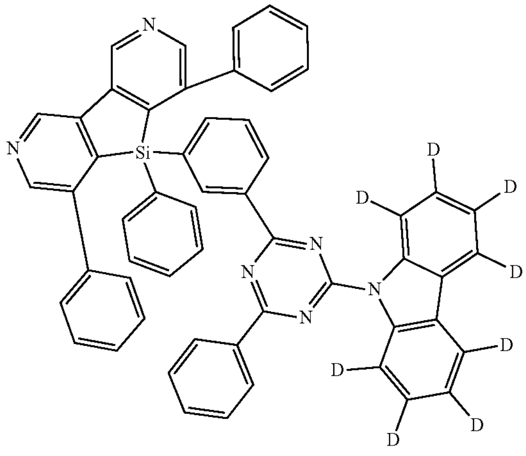
16
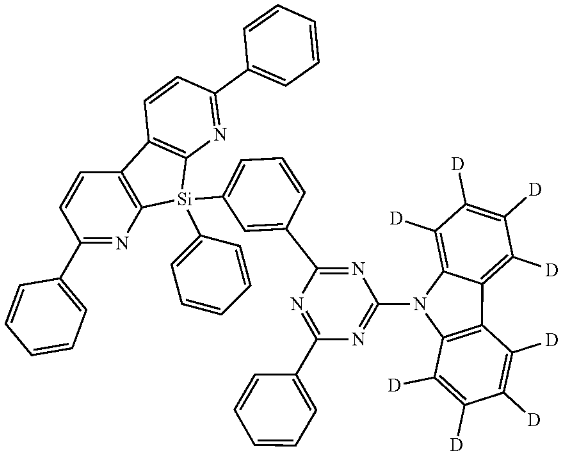
-continued
17
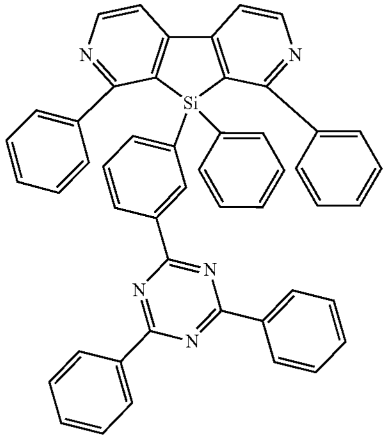
18
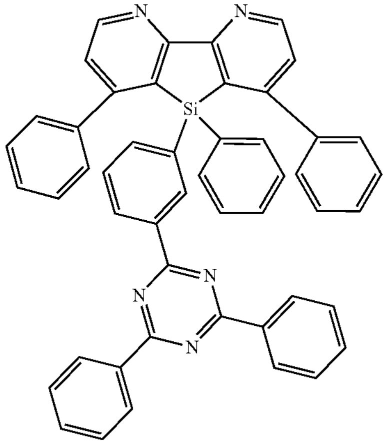
19
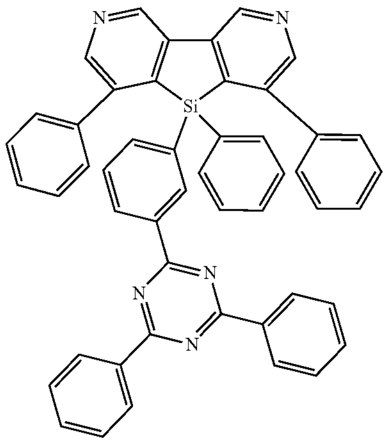

-continued
20
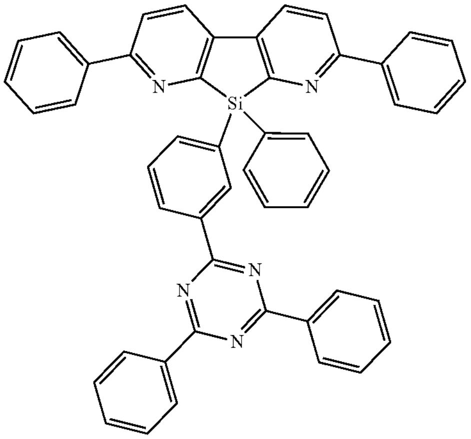
21
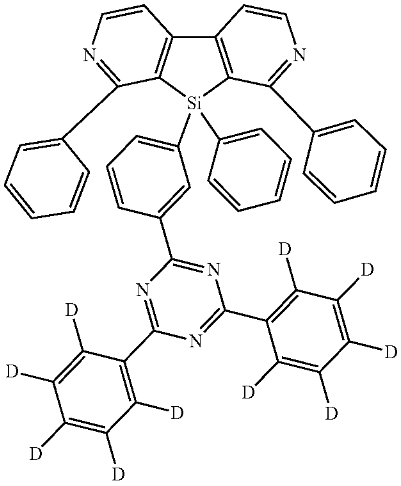
22
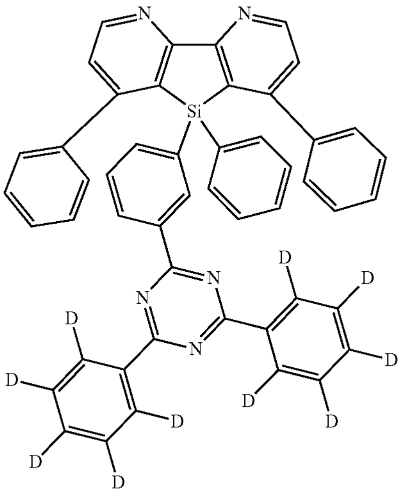
-continued
23
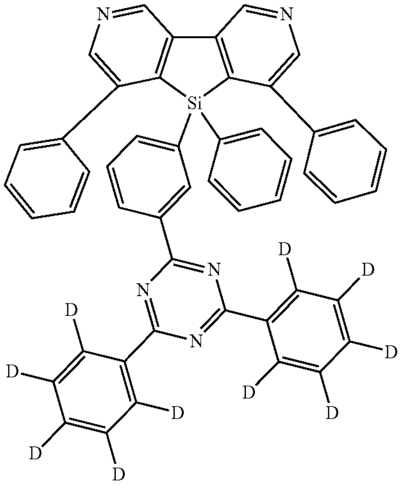
24
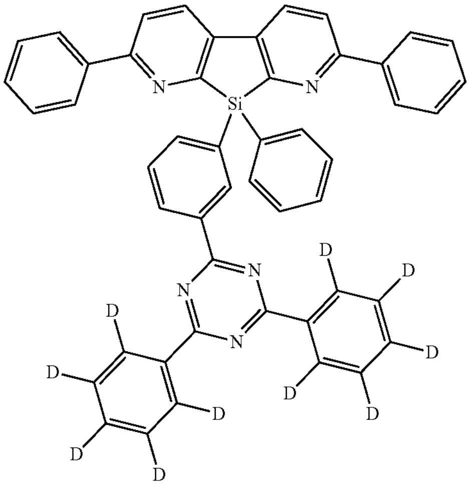
25
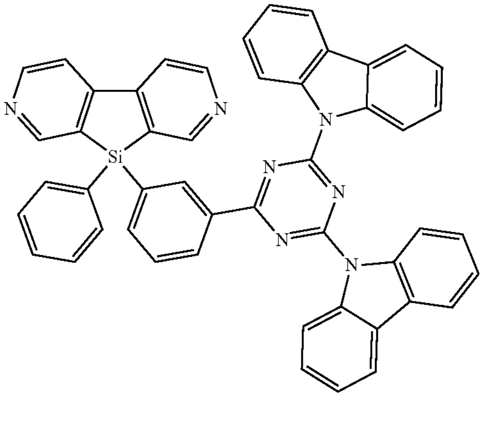

-continued
26
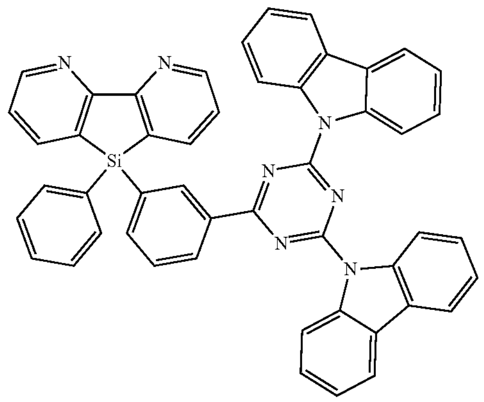
27
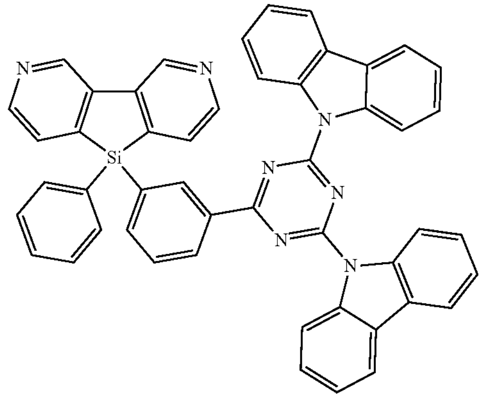
28
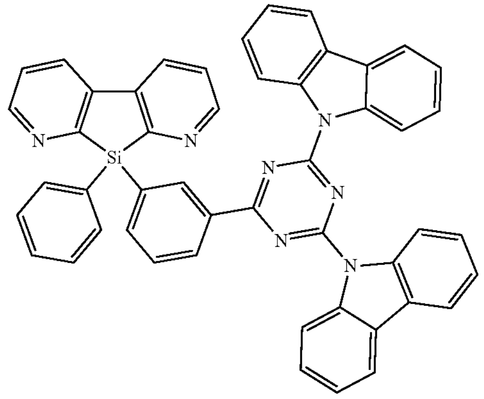
-continued
29
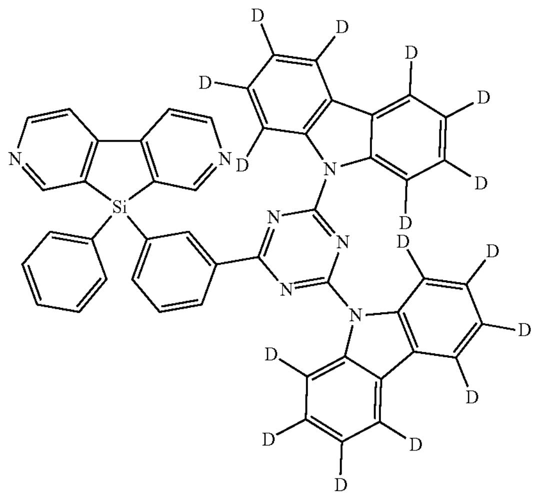
30
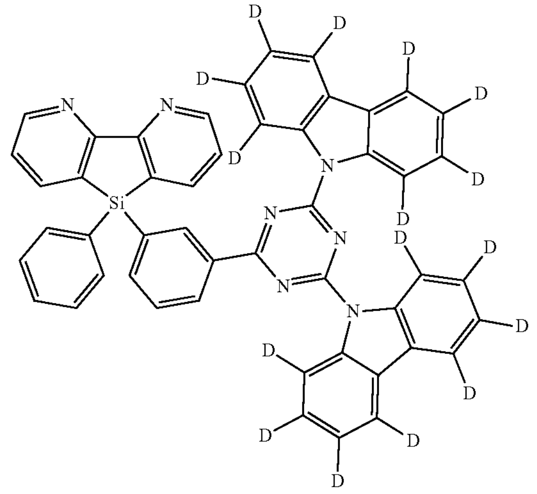
31
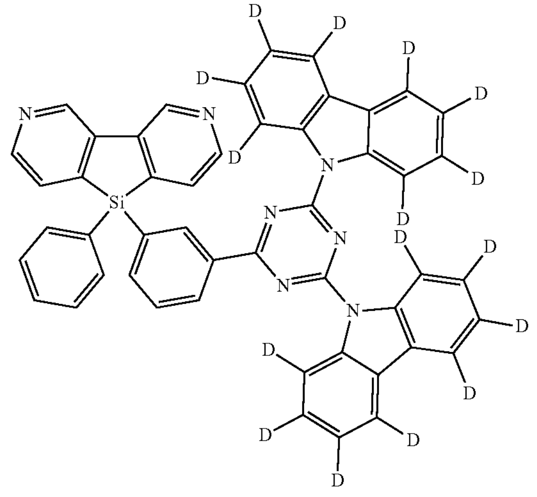

-continued
32
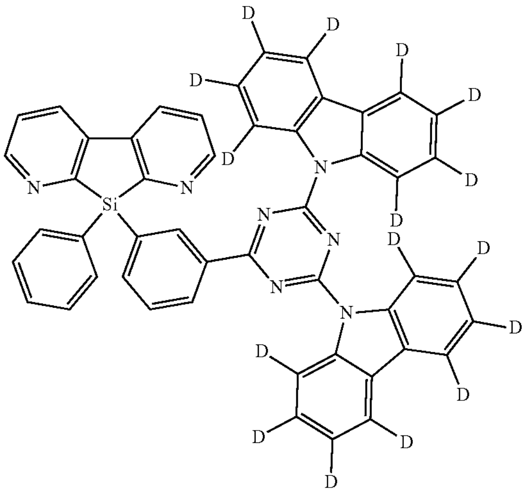
33
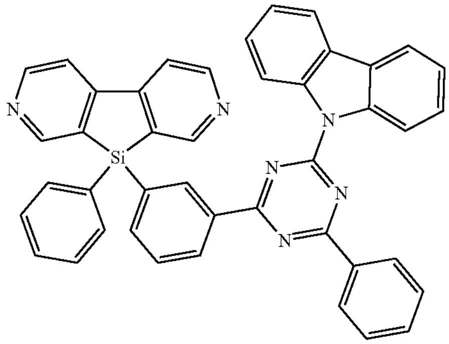
34
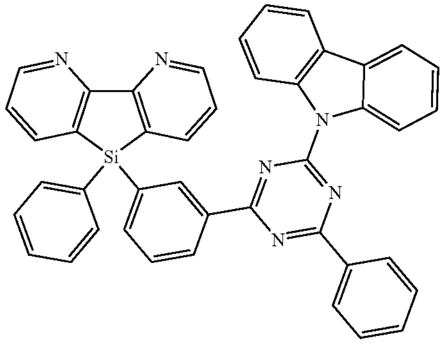
35
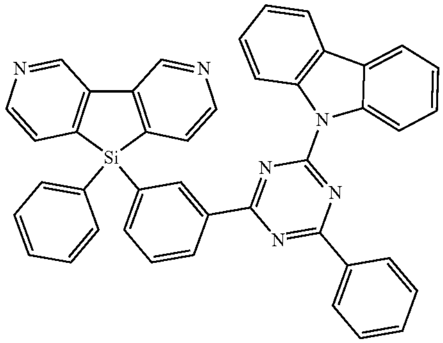
-continued
36
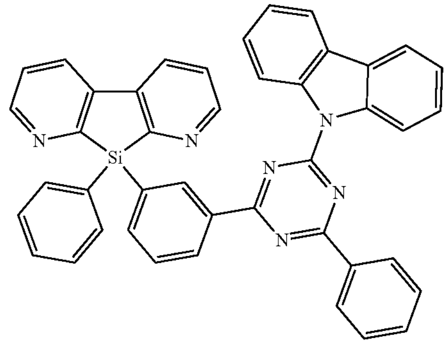
37
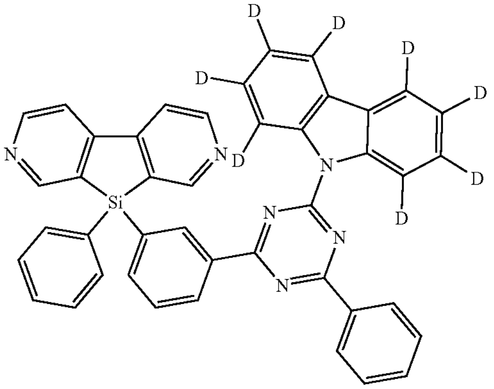
38
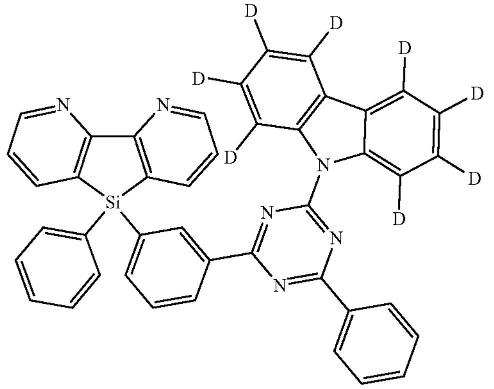
39
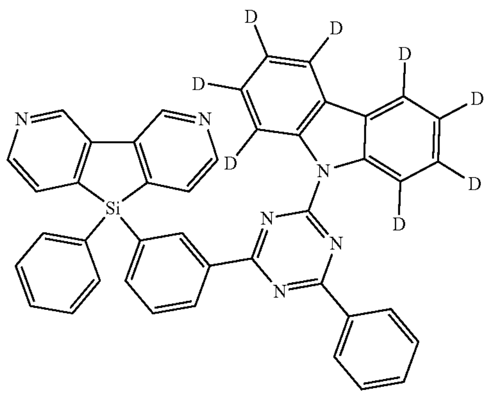

-continued
40
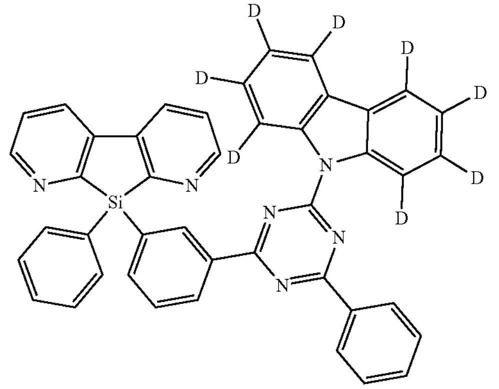
41
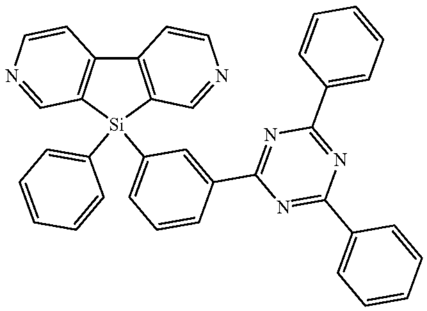
42
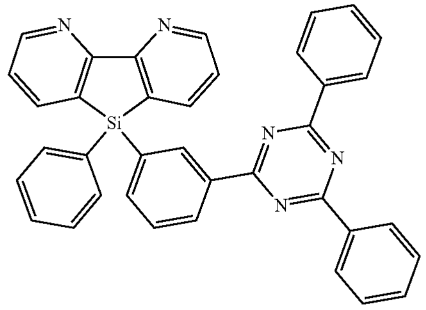
43
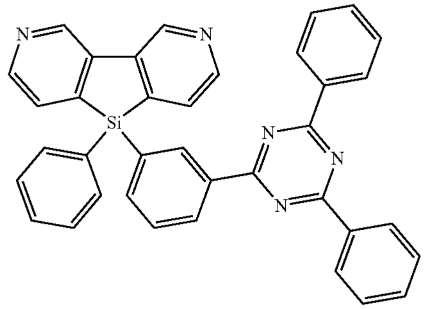
44
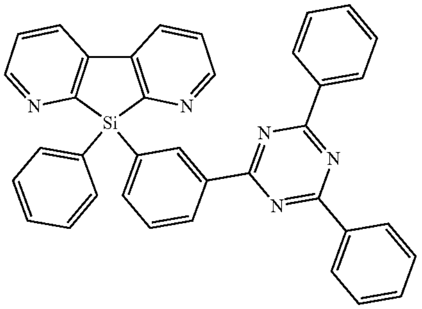
-continued
45
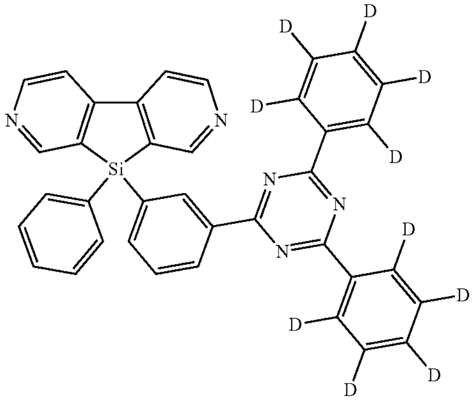
46
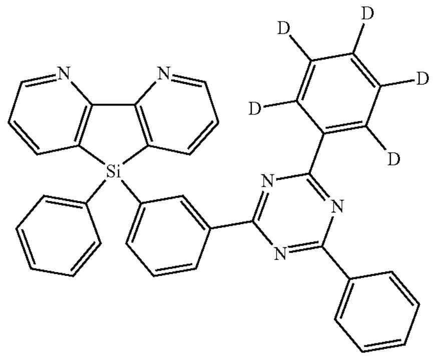
47
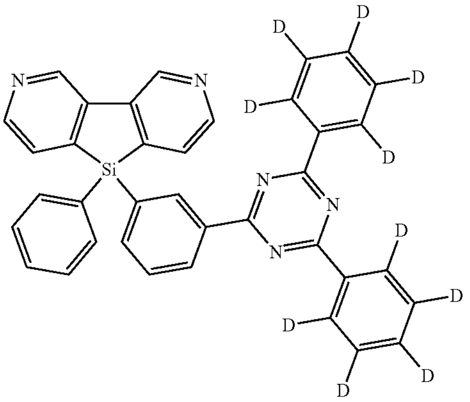
48
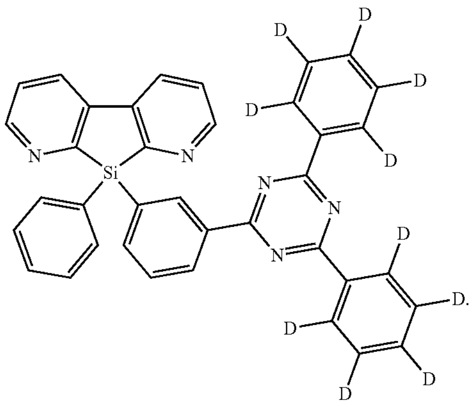
Because $R_3$ in Formula 1 is represented by Formula 2 and at least one selected from among $X_{31}$ to $X_{38}$ in Formula 2 is N, the organic compound represented by Formula 1 may have excellent or suitable electron transfer characteristics. Accordingly, the light-emitting device utilizing the organic compound may have excellent or suitable luminescence efficiency.

Because at least one selected from among $R_{31}$ to $R_{39}$ in the group represented by Formula 2 is a phenyl group unsubstituted or substituted with deuterium, the organic compound may have increased steric hindrance characteristics. Accordingly, the light-emitting device utilizing the organic compound may have increased color purity.

In some embodiments, in Formula 1, $R_3$ has a binding site at * of Formula 2, each of a1 and a2 is 0, and a3 is 1. Thus, the organic compound represented by Formula 1 may have an appropriate or suitable conjugation length. Accordingly, the light-emitting device utilizing the organic compound may have excellent or suitable maximum quantum efficiency and excellent or suitable triplet energy ($T_1$).

Description of FIG. 1

FIG. 1 is a schematic cross-sectional view of a light-emitting device 10 according to one or more embodiments of the present disclosure. The light-emitting device 10 may include a first electrode 110, an interlayer, and a second electrode 150. The interlayer may include a hole transport region 120, an emission layer 130, and an electron transport region 140.

Hereinafter, the structure of the light-emitting device 10 according to one or more embodiments and a method of manufacturing the light-emitting device 10 will be described in more detail with reference to FIG. 1.

First Electrode 110

In FIG. 1, in one or more embodiments, a substrate may be additionally provided and arranged under the first electrode 110 and/or on the second electrode 150. As the substrate, a glass substrate or a plastic substrate may be utilized. The substrate may be a flexible substrate. For example, the substrate may include plastic having excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by depositing or sputtering a material for forming the first electrode 110 on the substrate. When the first electrode 110 is an anode, the material for forming the first electrode 110 may be a high-work function material that facilitates injection of holes.

The first electrode 110 may be a reflective electrode, a semi-transmissive electrode, or a transmissive electrode. In one or more embodiments, when the first electrode 110 is a transmissive electrode, the material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, the material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a single-layer structure including (e.g., consisting of) a single layer or a multi-layer structure including multiple layers. For example, in some embodiments, the first electrode 110 may have a three-layer structure of ITO/Ag/ITO.

Interlayer

The interlayer may be arranged on the first electrode 110. The interlayer may include a hole transport region 120, an emission layer 130, and an electron transport region 140.

The hole transport region 120 may be arranged between the first electrode 110 and the emission layer 130, and the electron transport region 140 may be arranged between the emission layer 130 and the second electrode 150.

In one or more embodiment, the interlayer may further include, in addition to one or more suitable organic materials, a metal-containing compound such as an organometallic compound, an inorganic material such as a quantum dot, and/or the like.

In one or more embodiments, the interlayer may include i) two or more emitting units sequentially stacked between the first electrode 110 and the second electrode 150, and ii) a charge generation layer between the two or more emitting units. When the interlayer includes the emitting units and the charge generation layer described above, the light-emitting device 10 may be a tandem light-emitting device.

Hole Transport Region 120 in Interlayer

The hole transport region 120 may have i) a single-layer structure including (e.g., consisting of) a single layer including (e.g., consisting of) a single material, ii) a single-layer structure including (e.g., consisting of) a single layer including multiple different materials, or iii) a multi-layer structure including multiple layers including multiple different materials.

The hole transport region 120 may include a hole injection layer, a hole transport layer, an emission auxiliary layer, an electron blocking layer, or any combination thereof.

For example, in one or more embodiments, the hole transport region 120 may have a multi-layer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein constituent layers of each structure are stacked sequentially from the first electrode 110 in each stated order.

In one or more embodiments, the hole transport region 120 may include a compound represented by Formula 201, a compound represented by Formula 202, or any combination thereof:

Formula 201

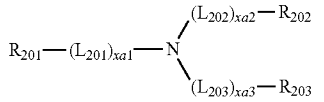

Formula 202

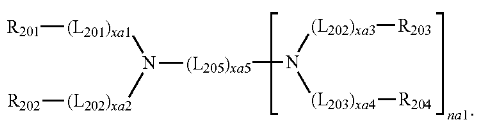

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

For example, in some embodiments, each of Formulae 201 and 202 may include at least one selected from groups represented by Formulae CY201 to CY217:

CY201

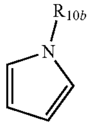

CY202

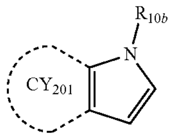

CY203

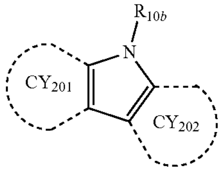

CY204

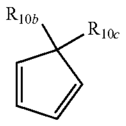

CY205

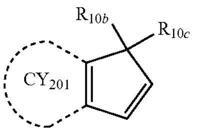

CY206

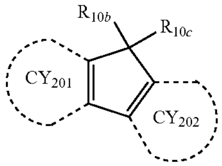

-continued

CY207

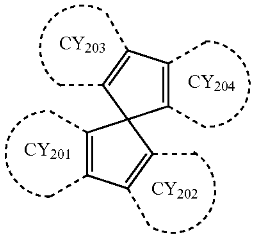

CY208

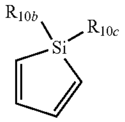

CY209

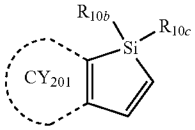

CY210

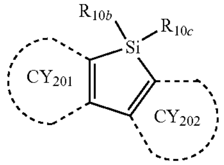

CY211

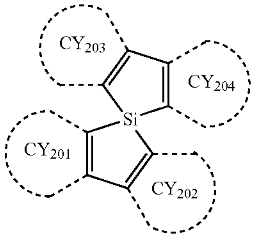

CY212

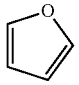

CY213

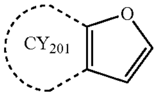

CY214

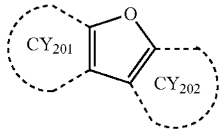

CY215

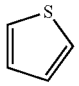

CY216

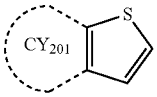

-continued

CY217

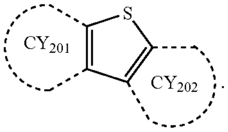

In Formulae CY201 to CY217, $R_{10b}$ and $R_{10c}$ may each be the same as defined with respect to $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In one or more embodiments, in Formulae CY201 to CY217, ring $CY_{201}$ to ring $CY_{204}$ may each independently be a benzene group, a naphthalene group, a phenanthrene group, or an anthracene group.

In one or more embodiments, each of Formulae 201 and 202 may include at least one selected from the groups represented by Formulae CY201 to CY203.

In one or more embodiments, Formula 201 may include at least one selected from the groups represented by Formulae CY201 to CY203 and at least one selected from the groups represented by Formulae CY204 to CY217.

In one or more embodiments, in Formula 201, xa1 may be 1, $R_{201}$ may be one selected from the groups represented by Formulae CY201 to CY203, xa2 may be 0, and $R_{202}$ may be one selected from the groups represented by Formulae CY204 to CY207.

In one or more embodiments, each of Formulae 201 and 202 may not include (e.g., may exclude) any of the groups represented by Formulae CY201 to CY203.

In one or more embodiments, each of Formulae 201 and 202 may not include (e.g., may exclude) any of the groups represented by Formulae CY201 to CY203, and may include at least one selected from the groups represented by Formulae CY204 to CY217.

In one or more embodiments, each of Formulae 201 and 202 may not include (e.g., may exclude) any of the groups represented by Formulae CY201 to CY217.

For example, in one or more embodiment, the hole transport region 120 may include at least one selected from Compounds HT1 to HT46, 4,4',4"-[tris(3-methylphenyl) phenylamino] triphenylamine (m-MTDATA), 4,4',4"-tris(N, N-diphenylamino)triphenylamine (TDATA), 4,4',4"-tris[N-(2-naphthyl)-N-phenylamino]-triphenylamine (2-TNATA), N,N'-di(naphthalen-1-yl)-N,N'-diphenyl-benzidine (NPB (NPD)), β-NPB, N,N'-bis(3-methylphenyl)-N,N'-diphenyl-[1,1'-biphenyl]-4,4'-diamine (TPD), Spiro-TPD, Spiro-NPB, methylated NPB, 4,4'-cyclohexylidene bis[N,N-bis(4-methylphenyl)benzenamine] (TAPC), 4,4'-bis[N,N'-(3-tolyl) amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), and/or any combination thereof:

HT1

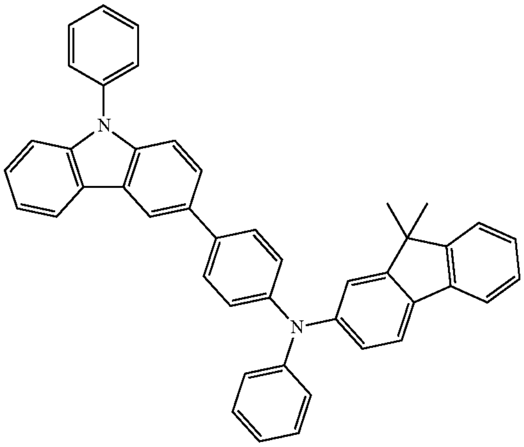

HT2

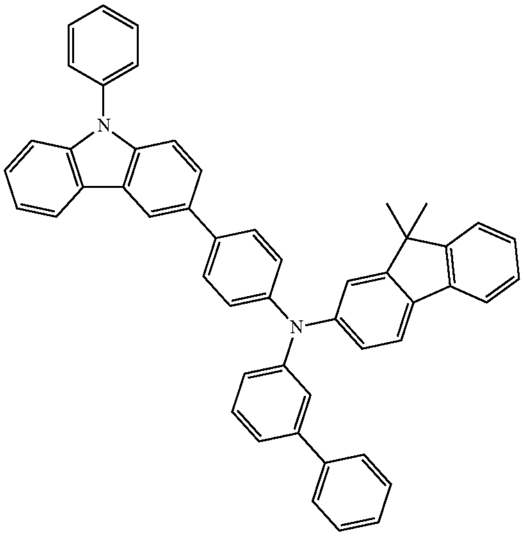

-continued
HT3
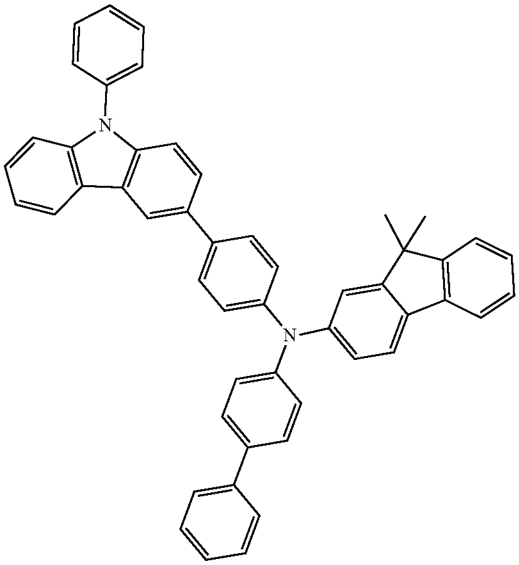
HT4
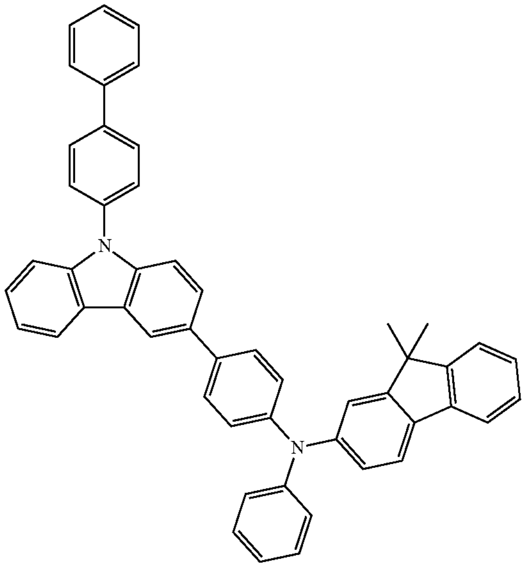
HT5
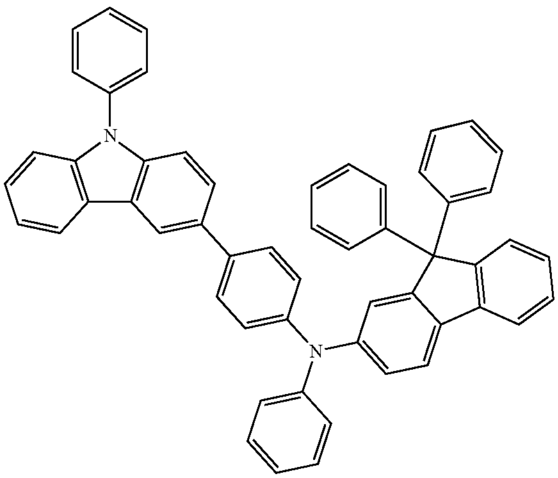
HT6
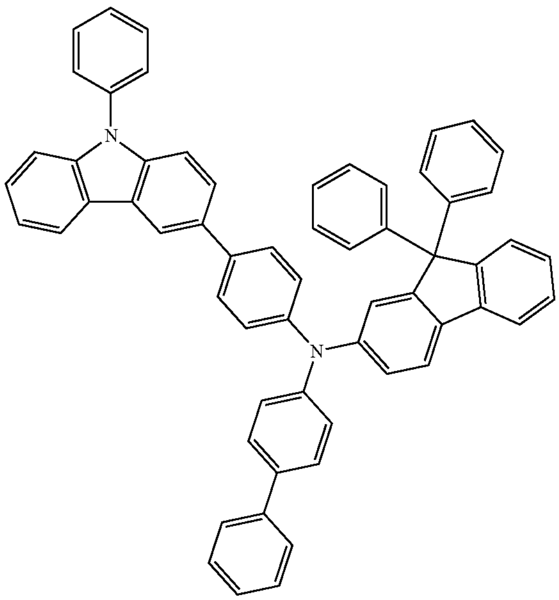

-continued
HT7
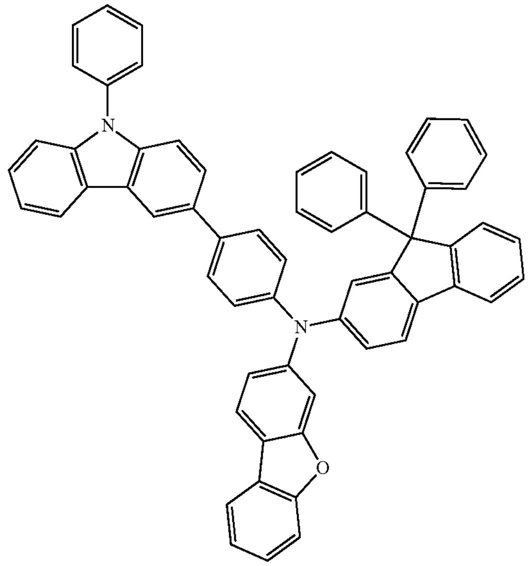
HT8
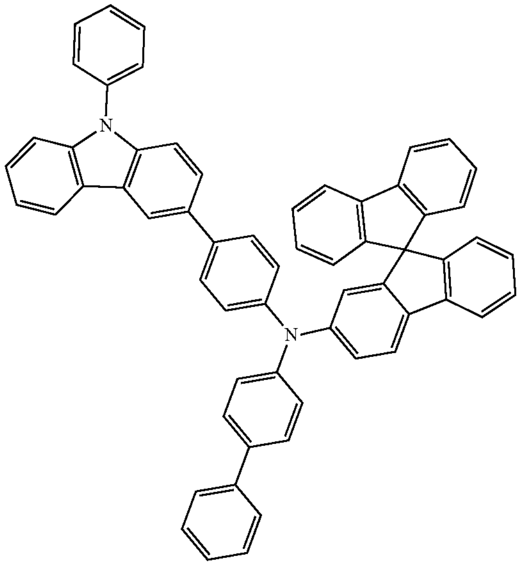
HT9
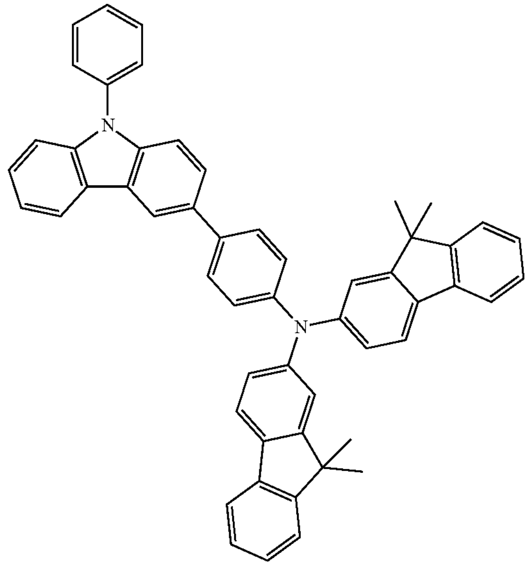
HT10
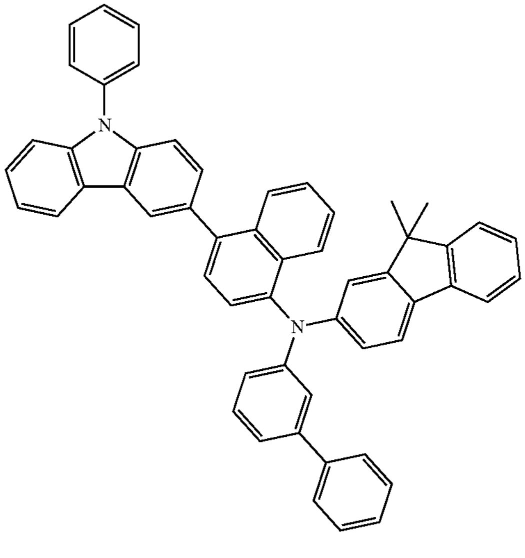
HT11
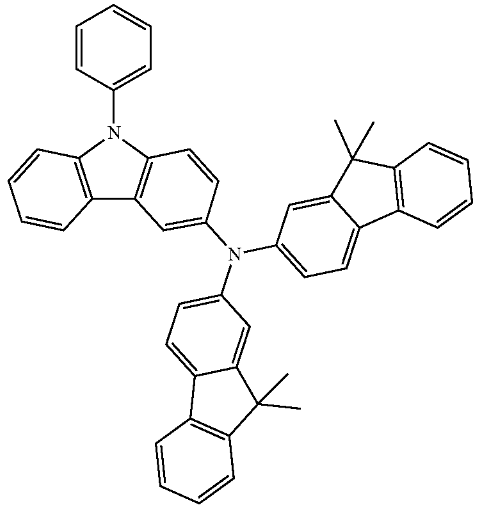
HT12
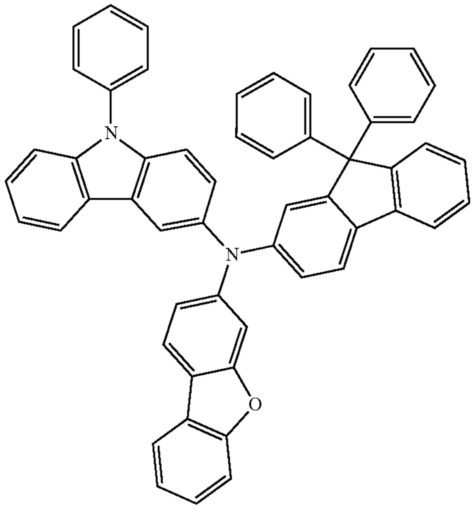

-continued
HT13
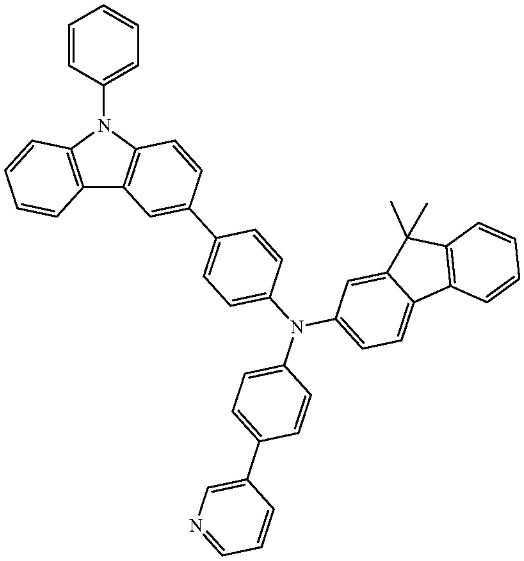
HT14
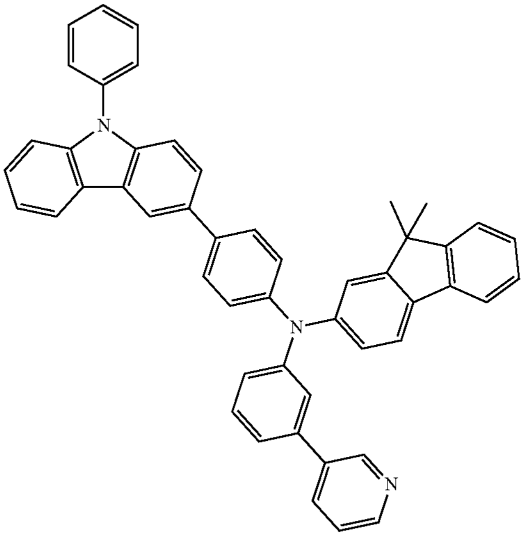
HT15
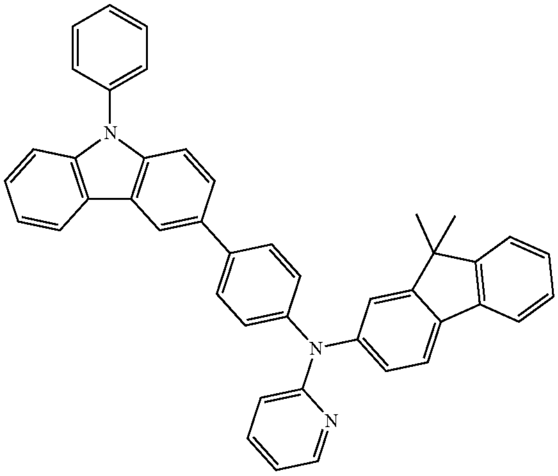
HT16
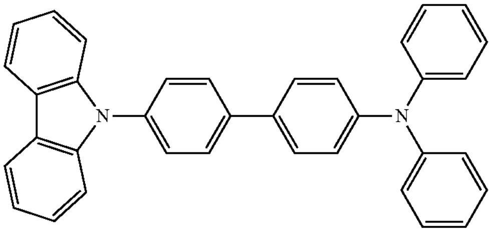
HT17
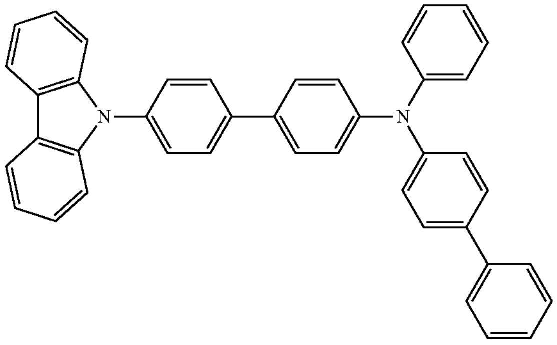
HT18
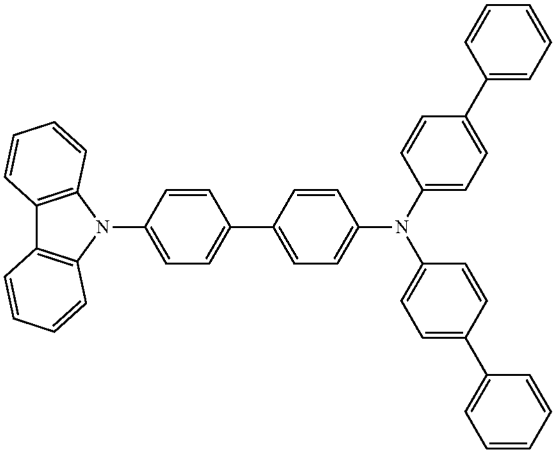

-continued
HT19
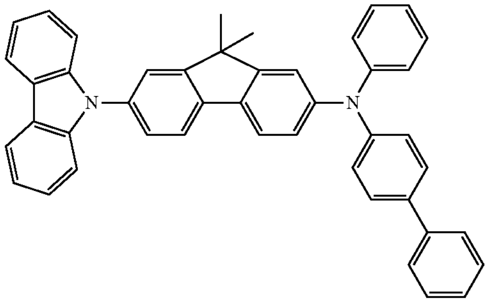
HT20
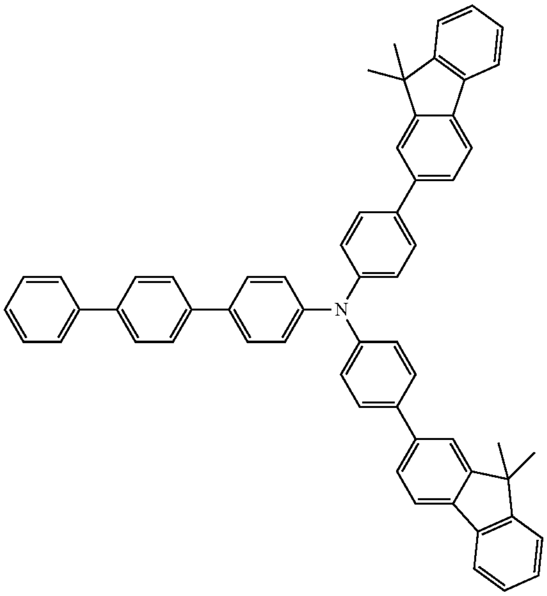
HT21
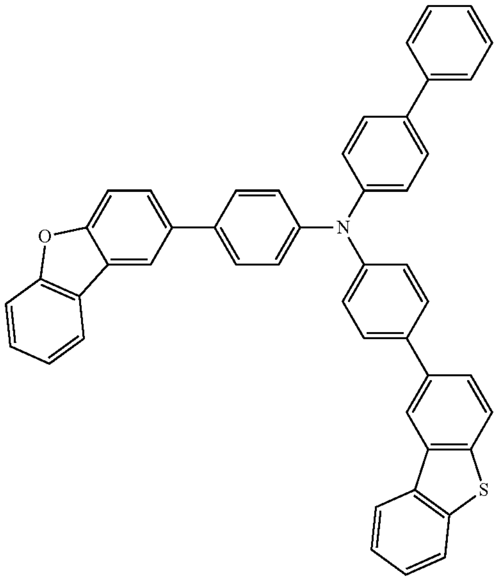
HT22
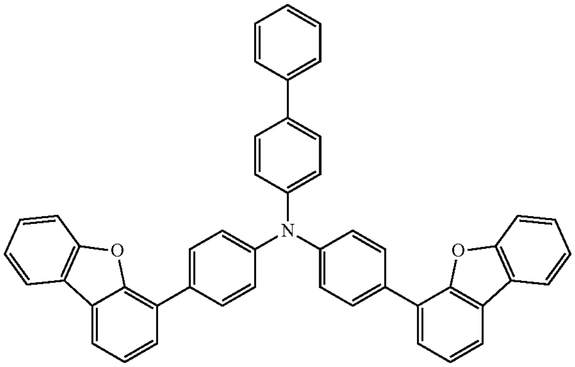

-continued
HT23
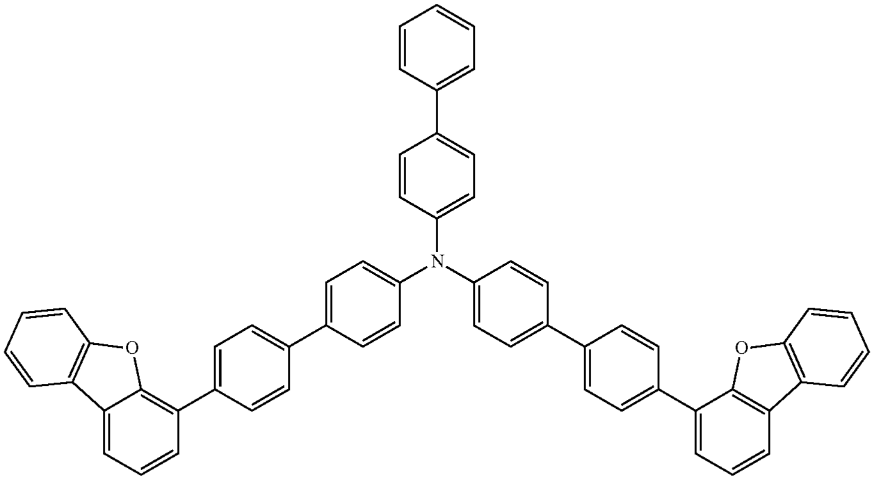
HT24
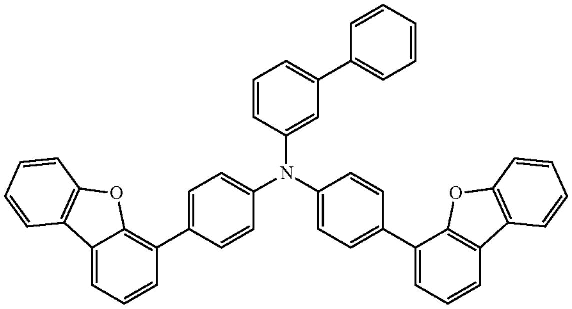
HT25
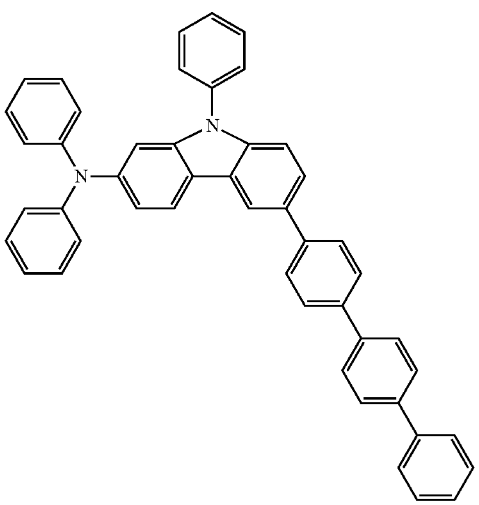
HT26
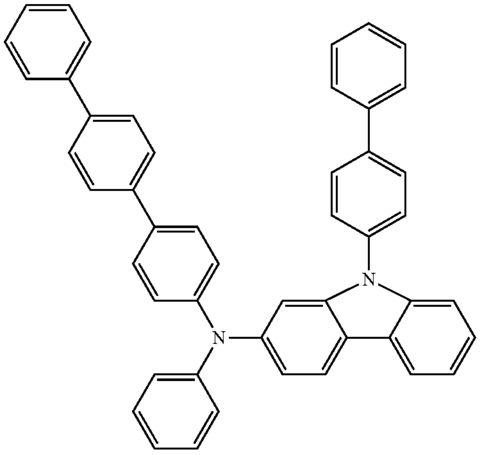
HT27
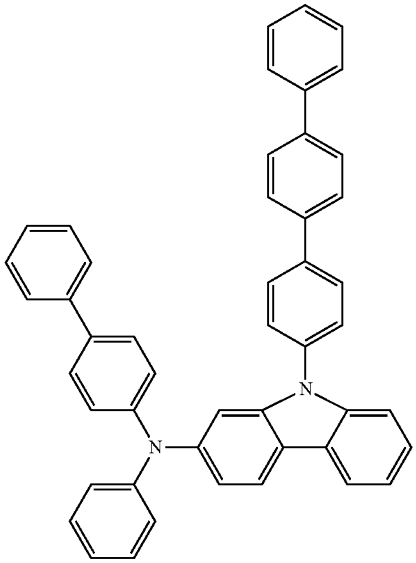

-continued
HT28
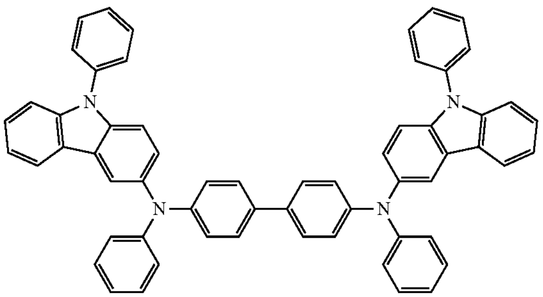
HT29
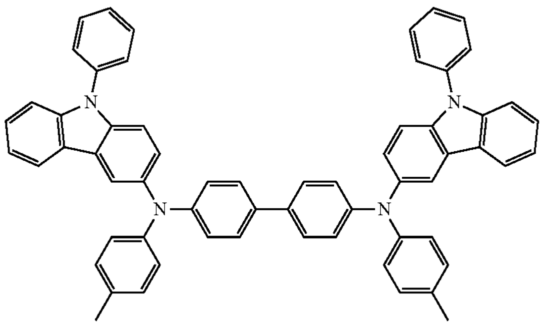
HT30
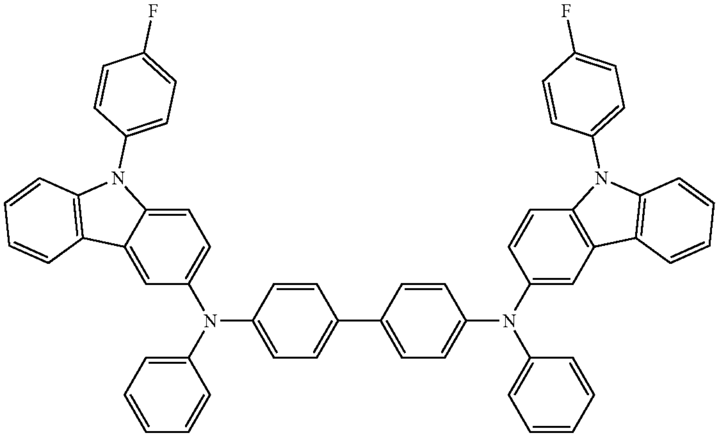
HT31
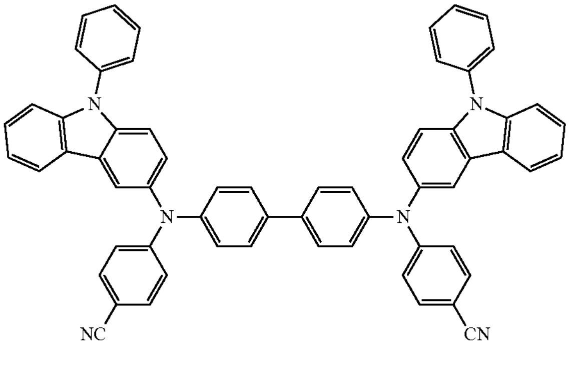
HT32
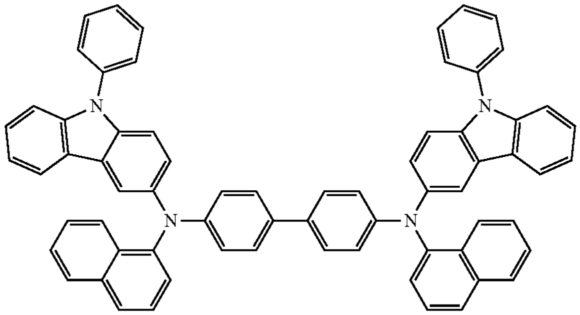
HT33
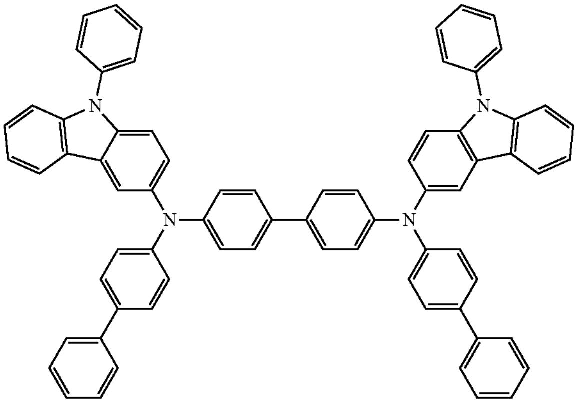
HT34
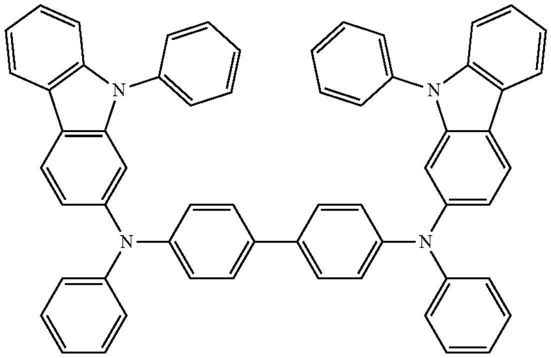

-continued
HT35
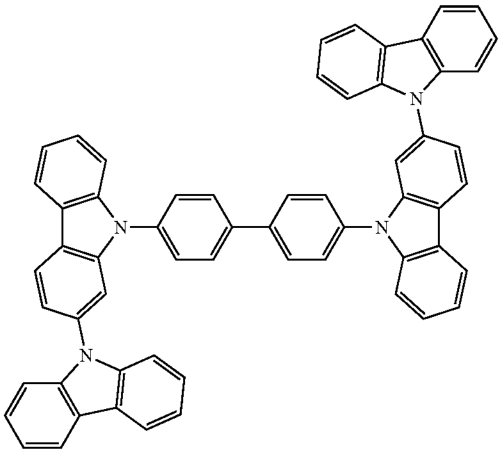
HT36
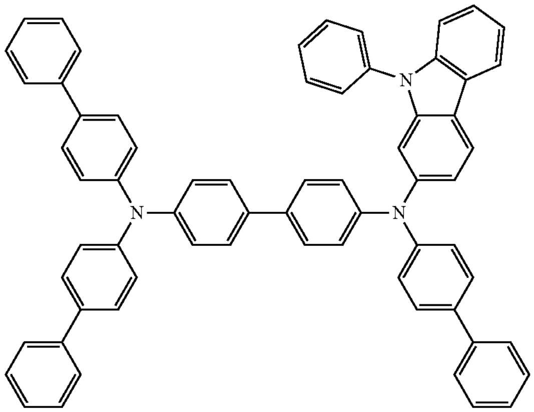
HT37
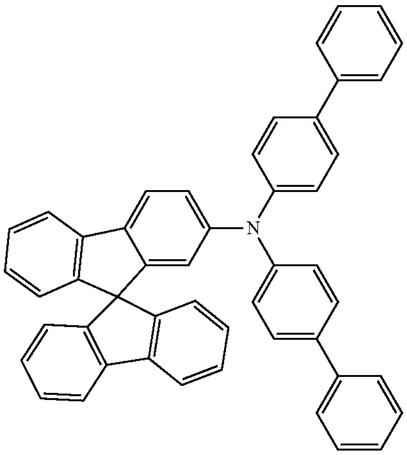
HT38
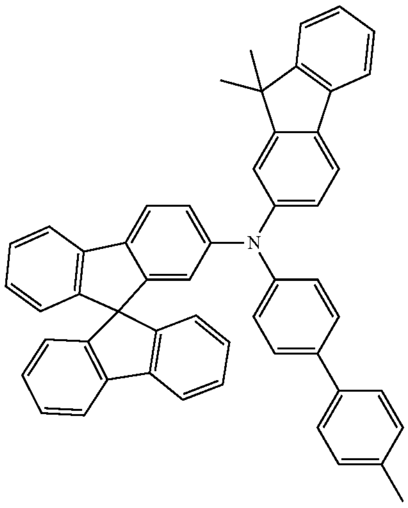
HT39
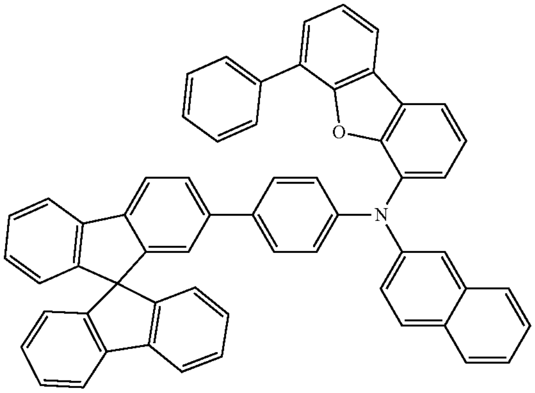
HT40
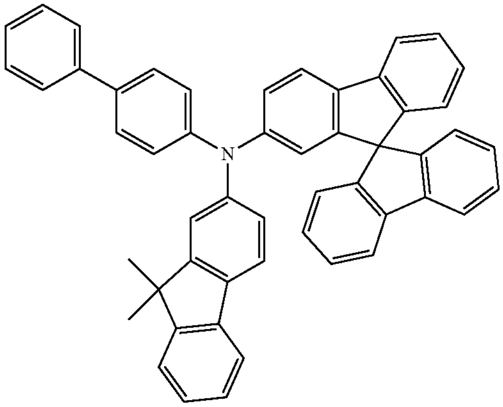

-continued
HT41
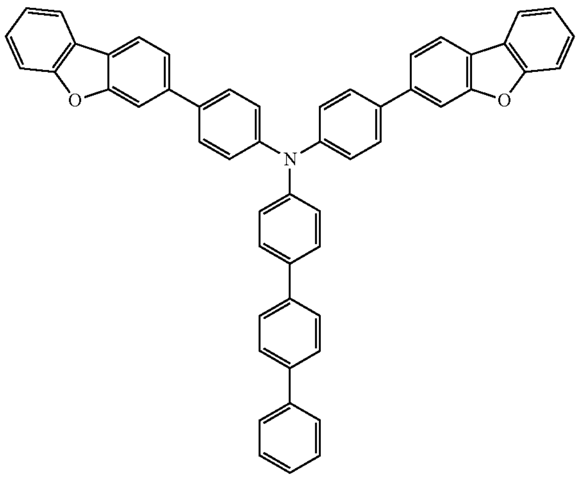
HT42
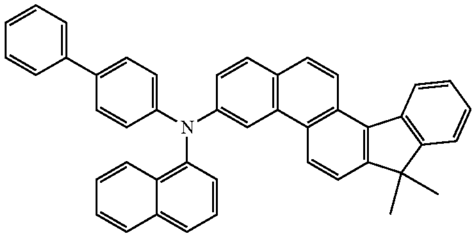
HT43
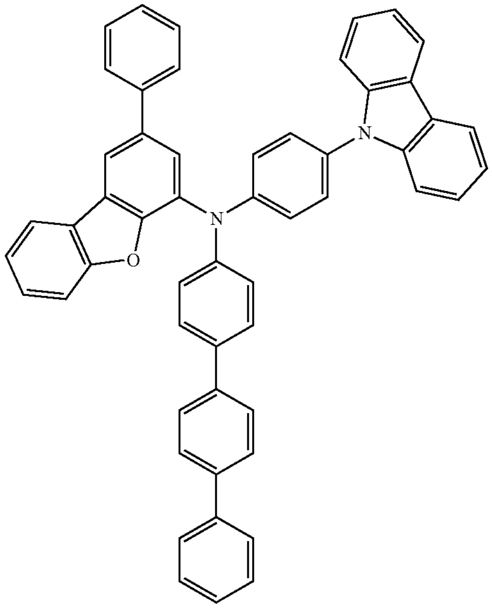
HT44
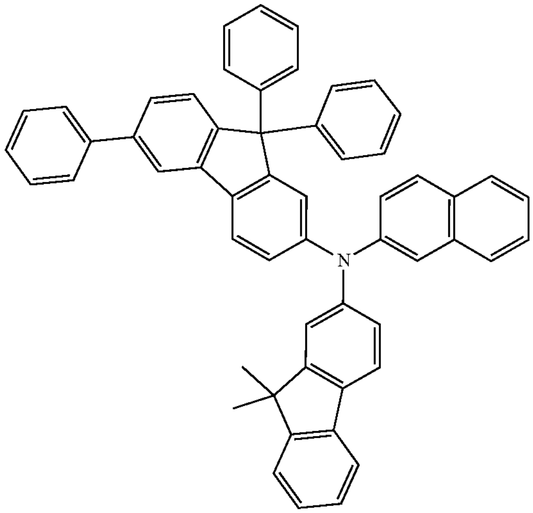
HT45
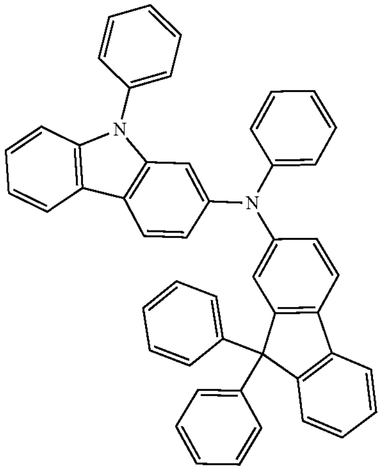
HT46
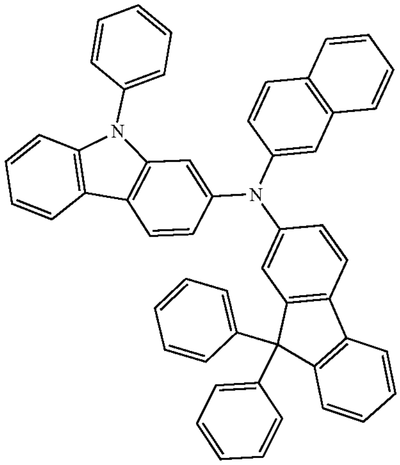

-continued
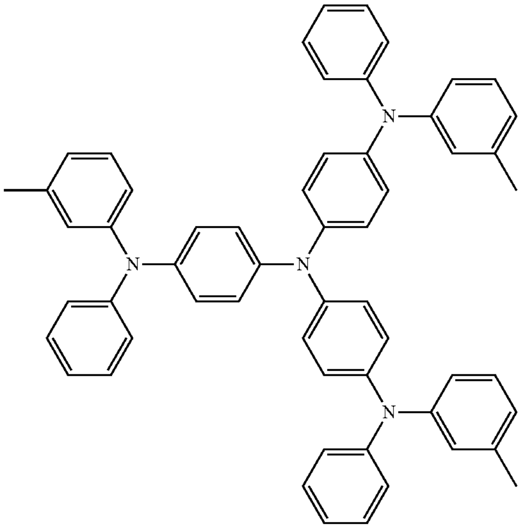
m-MTDATA
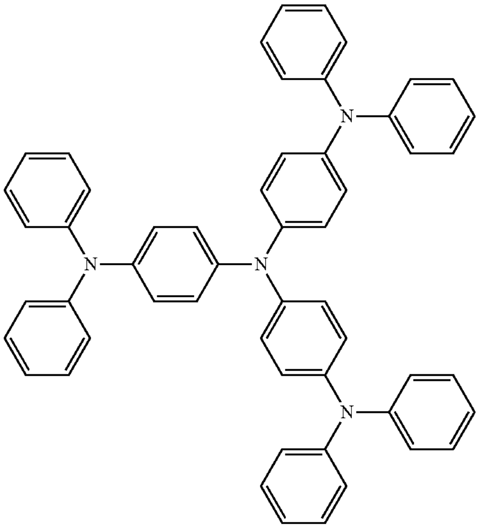
TDATA
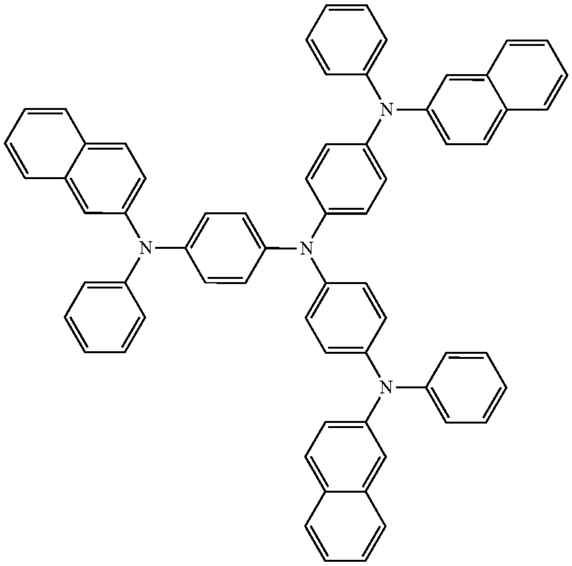
2-TNATA
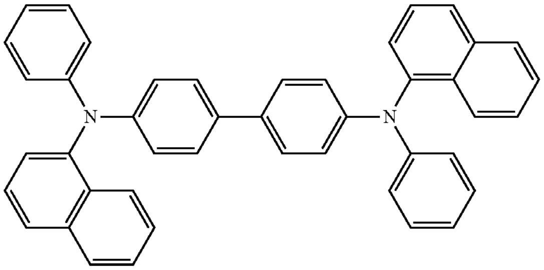
NPB
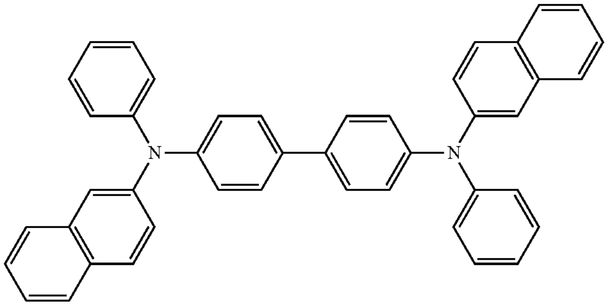
β-NPB
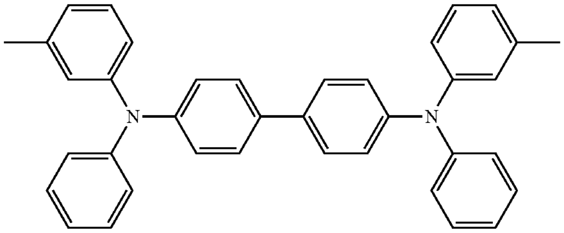
TPD -continued

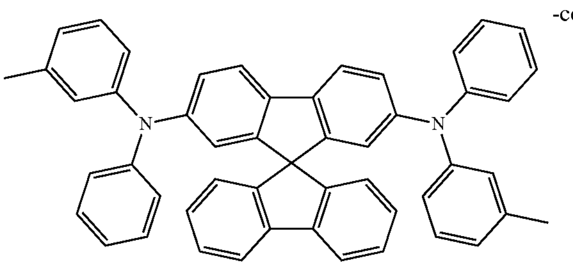

Spiro-TPB

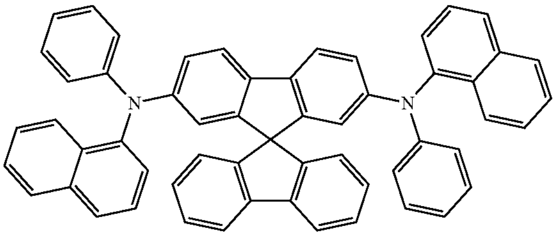

Spiro-TPB

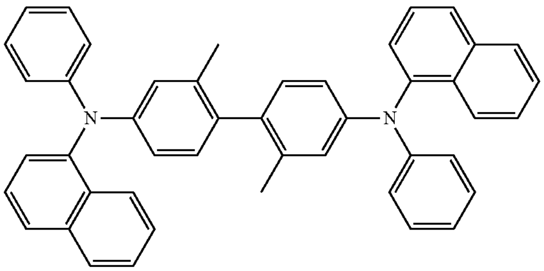

methylated-NPB

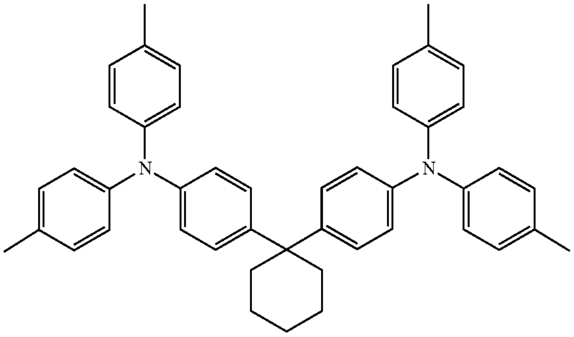

TAPC

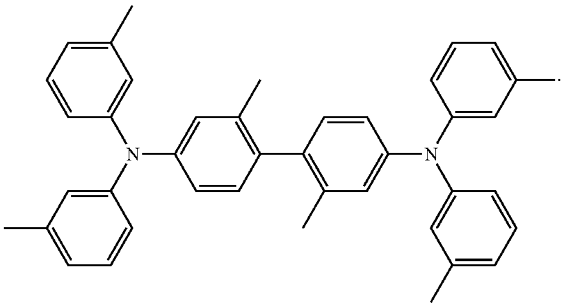

HMTPD

A thickness of the hole transport region 120 may be in a range of about 50 Å to about 10,000 Å, for example, about 100 Å to about 4,000 Å. When the hole transport region 120 includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region 120, the hole injection layer, and the hole transport layer are within the ranges described above, satisfactory hole transporting characteristics may be obtained without a substantial increase in driving voltage.

The emission auxiliary layer may be a layer that increases light-emission efficiency by compensating for an optical resonance distance according to the wavelength of light emitted by the emission layer 130. The electron blocking layer may be a layer that prevents or reduces leakage of electrons from the emission layer 130 to the hole transport region 120. Materials that may be included in the hole transport region 120 may be included in the emission auxiliary layer and the electron blocking layer.

p-Dopant

In one or more embodiments, the hole transport region 120 may further include, in addition to the materials described above, a charge-generation material for the improvement of conductive properties. The charge-generation material may be substantially uniformly or non-uniformly dispersed in the hole transport region 120 (for example, in the form of a single layer including (e.g., consisting of) a charge-generation material).

The charge-generation material may be, for example, a p-dopant.

For example, in some embodiments, the p-dopant may have a lowest unoccupied molecular orbital (LUMO) energy level of less than or equal to about −3.5 eV.

In one or more embodiments, the p-dopant may include a quinone derivative, a cyano group-containing compound, a compound including element EL1 and element EL2, or any combination thereof.

Non-limiting examples of the quinone derivative may be tetracyanoquinodimethane (TCNQ), 2,3,5,6-tetrafluoro-7,7,8,8-tetracyanoquinodimethane (F4-TCNQ), and/or the like.

Non-limiting examples of the cyano group-containing compound may be dipyrazino[2,3-f: 2',3'-h] quinoxaline-2,3,6,7,10,11-hexacarbonitrile (HAT-CN), a compound represented by Formula 221, and/or the like:

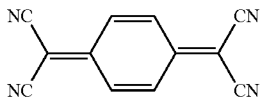

TCNQ

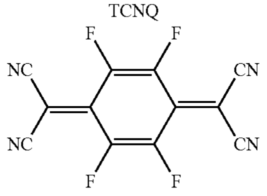

F4-TCNQ

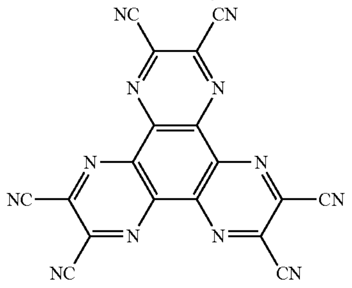

HAT-CN

Formula 221

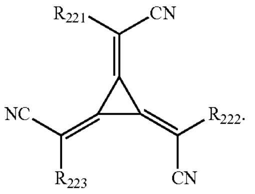

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one selected from among $R_{221}$ to $R_{223}$ may each independently be a $C_3$-$C_{60}$ carbocyclic group or a $C_1$-$C_{60}$ heterocyclic group, each substituted with: a cyano group; —F; —$C_1$; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be metal, metalloid, or any combination thereof, and element EL2 may be non-metal, metalloid, or any combination thereof.

Non-limiting examples of the metal may be: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and/or the like.

Non-limiting examples of the metalloid may be silicon (Si), antimony (Sb), tellurium (Te), and/or the like.

Non-limiting examples of the non-metal may be oxygen (O), a halogen (for example, F, Cl, Br, I, etc.), and/or the like.

Non-limiting examples of the compound including element EL1 and element EL2 may be metal oxides, metal halides (for example, metal fluorides, metal chlorides, metal bromides, metal iodides, etc.), metalloid halides (for example, metalloid fluorides, metalloid chlorides, metalloid bromides, metalloid iodides, etc.), metal tellurides, or any combination thereof.

Non-limiting examples of the metal oxide may be tungsten oxides (for example, WO, $W_2O_3$, $WO_2$, $WO_3$, $W_2O_5$, etc.), vanadium oxides (for example, VO, $V_2O_3$, $VO_2$, $V_2O_5$, etc.), molybdenum oxides (for example, MoO, $Mo_2O_3$, $MoO_2$, $MoO_3$, $Mo_2O_5$, etc.), rhenium oxides (for example, $ReO_3$, etc.), and/or the like.

Non-limiting examples of the metal halide may be alkali metal halides, alkaline earth metal halides, transition metal halides, post-transition metal halides, lanthanide metal halides, and/or the like.

Non-limiting examples of the alkali metal halide may be LiF, NaF, KF, RbF, CsF, LiCl, NaCl, KCl, RbCl, CsCl, LiBr, NaBr, KBr, RbBr, CsBr, LiI, NaI, KI, RbI, CsI, and/or the like.

Non-limiting examples of the alkaline earth metal halide may be $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and/or the like.

Non-limiting examples of the transition metal halide may be titanium halides (for example, $TiF_4$, $TiCl_4$, $TiBr_4$, $TiI_4$, etc.), zirconium halides (for example, $ZrF_4$, $ZrCl_4$, $ZrBr_4$, $ZrI_4$, etc.), hafnium halides (for example, $HfF_4$, $HfCl_4$, $HfBr_4$, $HfI_4$, etc.), vanadium halides (for example, $VF_3$, $VCl_3$, $VBr_3$, $VI_3$, etc.), niobium halides (for example, $NbF_3$, $NbCl_3$, $NbBr_3$, $NbI_3$, etc.), tantalum halides (for example, $TaF_3$, $TaCl_3$, $TaBr_3$, $TaI_3$, etc.), chromium halides (for example, $CrF_3$, $CrO_3$, $CrBr_3$, $CrI_3$, etc.), molybdenum halides (for example, $MoF_3$, $MoCl_3$, $MoBr_3$, $MoI_3$, etc.), tungsten halides (for example, $WF_3$, $WCl_3$, $WBr_3$, $WI_3$, etc.), manganese halides (for example, $MnF_2$, $MnCl_2$, $MnBr_2$, $MnI_2$, etc.), technetium halides (for example, $TcF_2$, $TcCl_2$, $TcBr_2$, $TcI_2$, etc.), rhenium halides (for example, $ReF_2$, $ReCl_2$, $ReBr_2$, $ReI_2$, etc.), iron halides (for example, $FeF_2$, $FeCl_2$, $FeBr_2$, $FeI_2$, etc.), ruthenium halides (for example, $RuF_2$, $RuCl_2$, $RuBr_2$, $RuI_2$, etc.), osmium halides (for example, $OsF_2$, $OsCl_2$, $OsBr_2$, $OsI_2$, etc.), cobalt halides (for example, $CoF_2$, $COCl_2$, $CoBr_2$, $CoI_2$, etc.), rhodium halides (for example, $RhF_2$, $RhCl_2$, $RhBr_2$, $RhI_2$, etc.), iridium halides (for example, $IrF_2$, $IrCl_2$, $IrBr_2$, $IrI_2$, etc.), nickel halides (for example, $NiF_2$, $NiCl_2$, $NiBr_2$, $NiI_2$, etc.), palladium halides (for example, $PdF_2$, $PdCl_2$, $PdBr_2$, $PdI_2$, etc.), platinum halides (for example, $PtF_2$, $PtCl_2$, $PtBr_2$, $PtI_2$, etc.), copper halides (for example, CuF, CuCl, CuBr, CuI, etc.), silver halides (for example, AgF, AgCl, AgBr, AgI, etc.), gold halides (for example, AuF, AuCl, AuBr, AuI, etc.), and/or the like.

Non-limiting examples of the post-transition metal halide may be zinc halides (for example, $ZnF_2$, $ZnCl_2$, $ZnBr_2$, $ZnI_2$, etc.), indium halides (for example, $InI_3$, etc.), tin halides (for example, SnI2, etc.), and/or the like.

Non-limiting examples of the lanthanide metal halide may be YbF, $YbF_2$, $YbF_3$, $SmF_3$, $YbCl_2$, $YbCl_2$, $YbCl_3$, $SmCl_3$, YbBr, $YbBr_2$, $YbBr_3$, $SmBr_3$, YbI, $YbI_2$, $YbI_3$, $SmI_3$, and/or the like.

Non-limiting examples of the metalloid halide may be antimony halides (for example, $SbCl_5$, etc.) and/or the like.

Non-limiting examples of the metal telluride may be alkali metal tellurides (for example, $Li_2Te$, $Na_2Te$, $K_2Te$, $Rb_2Te$, $Cs_2Te$, etc.), alkaline earth metal tellurides (for example, BeTe, MgTe, CaTe, SrTe, BaTe, etc.), transition metal tellurides (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal tellurides (for example, ZnTe, etc.), lanthanide metal tellurides (for example, LaTe, CeTe, PrTe, NdTe, PmTe, EuTe, GdTe, TbTe, DyTe, HoTe, ErTe, TmTe, YbTe, LuTe, etc.), and/or the like.

Emission Layer 130 in Interlayer

When the light-emitting device 10 is a full-color light-emitting device, the emission layer 130 may be patterned into a red emission layer, a green emission layer, and/or a blue emission layer, according to a subpixel. In one or more embodiments, the emission layer 130 may have a stacked structure of two or more layers selected from a red emission layer, a green emission layer, and a blue emission layer, in which the two or more layers contact each other or are separated from each other, to emit white light (e.g., combined white light). In one or more embodiments, the emission layer 130 may include two or more materials selected from a red light-emitting material, a green light-emitting material, and a blue light-emitting material, in which the two or more materials are mixed with each other in a single layer, to emit white light (e.g., combined white light).

In one or more embodiments, the emission layer 130 may include a host and a dopant. The dopant may include a phosphorescent dopant, a fluorescent dopant, or any combination thereof.

An amount of the dopant in the emission layer 130 may be in a range of about 0.01 parts by weight to about 15 parts by weight based on 100 parts by weight of the host.

In one or more embodiments, the emission layer 130 may include a quantum dot.

In one or more embodiments, the emission layer 130 may include a delayed fluorescence material. The delayed fluorescence material may act as a host or a dopant in the emission layer 130.

A thickness of the emission layer 130 may be in a range of about 100 Å to about 1,000 Å, for example, about 200 Å to about 600 Å. When the thickness of the emission layer 130 is within the ranges described above, excellent or suitable luminescence characteristics may be obtained without a substantial increase in driving voltage.

Host

In one or more embodiments, the host may include a compound represented by Formula 301:

$$[Ar_{301}]_{xb11}-[(L_{301})_{xb1}-R_{301}]_{xb21}. \qquad \text{Formula 301}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each be the same as defined with respect to $Q_1$.

In one or more embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

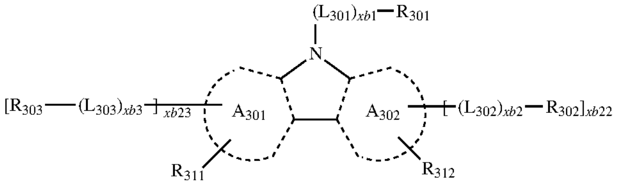

Formula 301-2

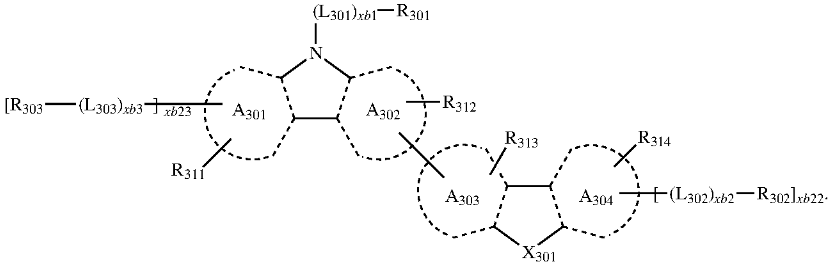

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be as defined herein, $L_{302}$ to $L_{304}$ may each independently be the same as defined with respect to $L_{301}$, xb2 to xb4 may each independently be the same as defined with respect to xb1, and $R_{302}$ to $R_{305}$ and $R_{311}$ to $R_{314}$ may each independently be the same defined with respect to $R_{301}$.

In one or more embodiments, the host may include an alkaline earth metal complex, a post-transition metal complex, or any combination thereof. For example, the host may include a Be complex (for example, Compound H55), a Mg complex, a Zn complex, or any combination thereof.

In one or more embodiments, the host may include: at least one selected from Compounds H1 to H128; 9,10-di(2-naphthyl)anthracene (ADN); 2-methyl-9,10-bis(naphthalen-2-yl)anthracene (MADN); 9,10-di-(2-naphthyl)-2-t-butyl-anthracene (TBADN); 4,4'-bis(N-carbazolyl)-1,1'-biphenyl (CBP); 1,3-di(carbazol-9-yl)benzene (mCP); 1,3,5-tri(carbazol-9-yl)benzene (TCP); and/or any combination thereof:

H1

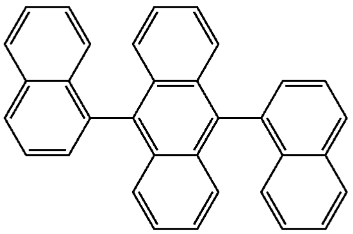

H2

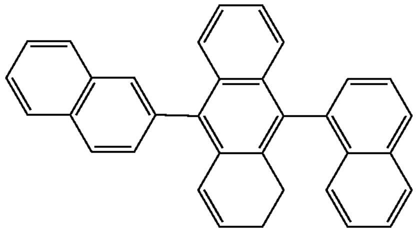

H3

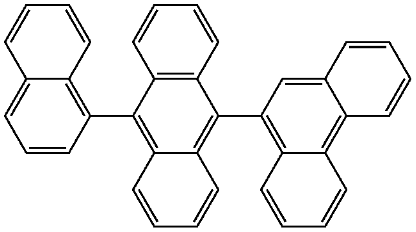

H4

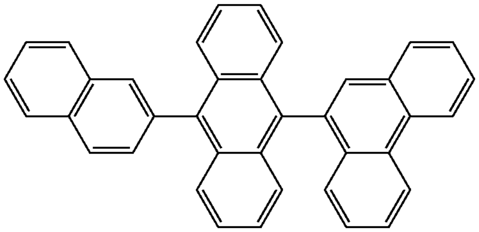

-continued

H5

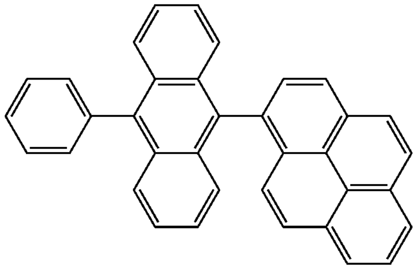

H6

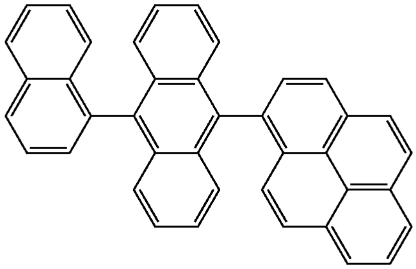

H7

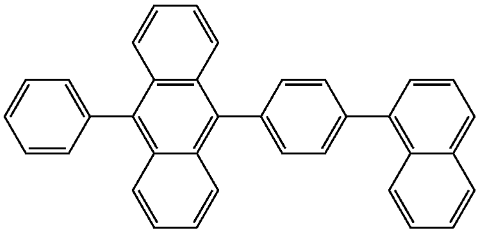

H8

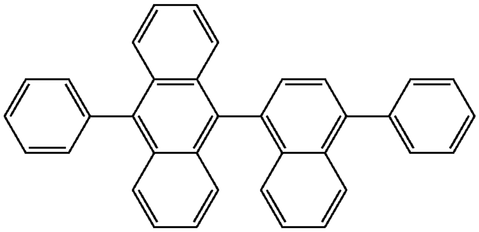

H9

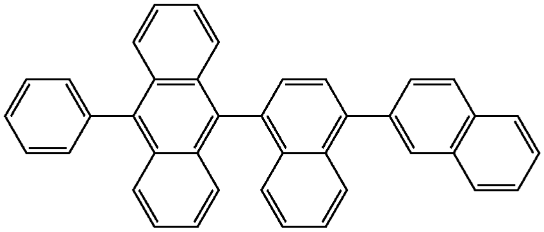

H10

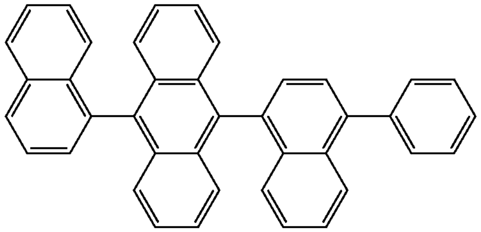

-continued
H11
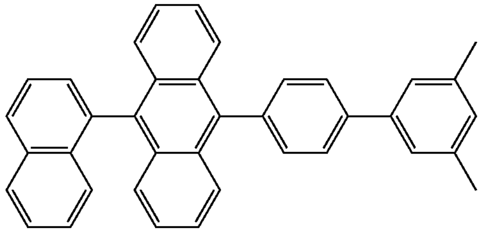
H12
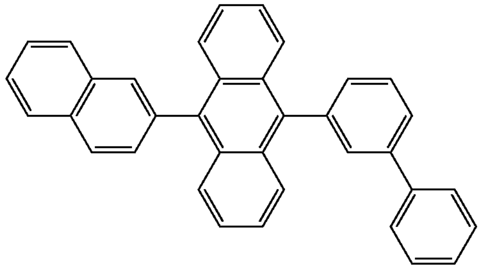
H13
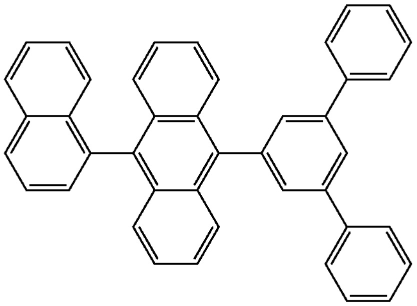
H14
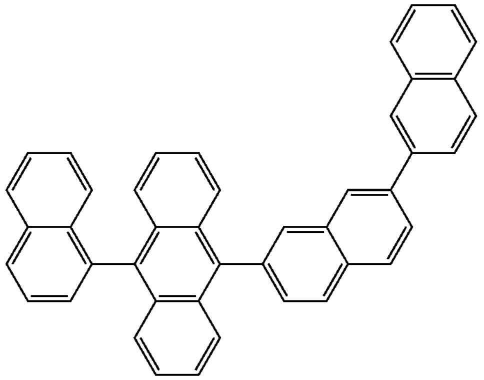
H15
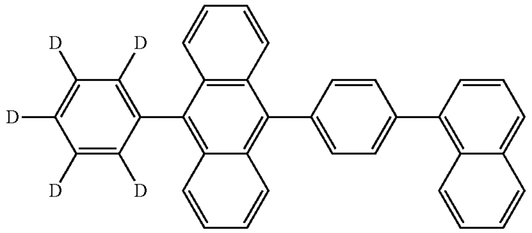
-continued
H16
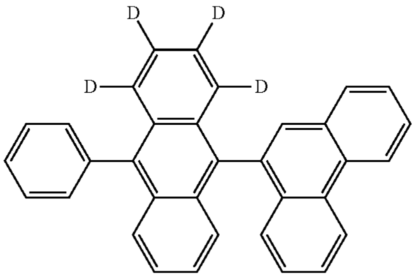
H17
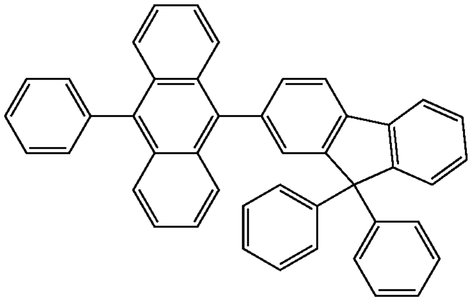
H18
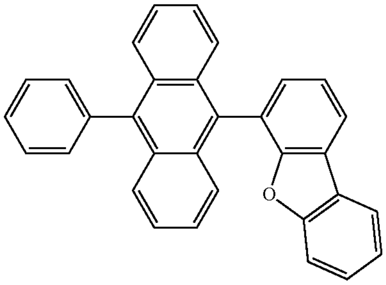
H19
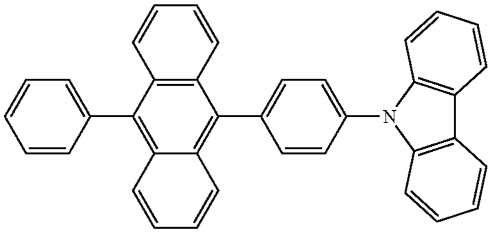
H20
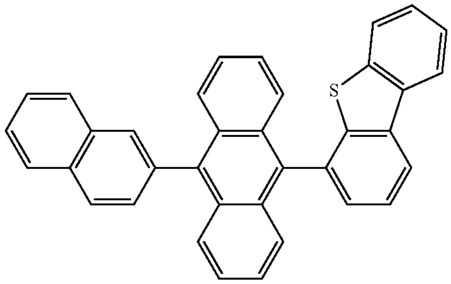

-continued
H21
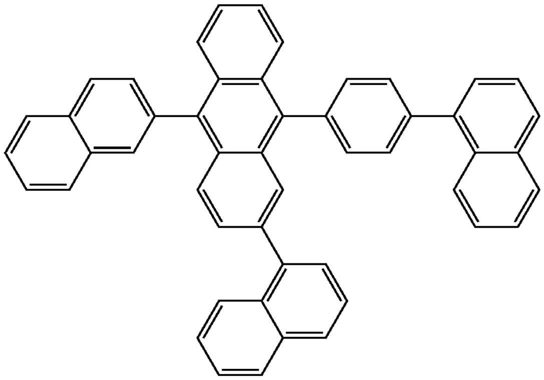
H22
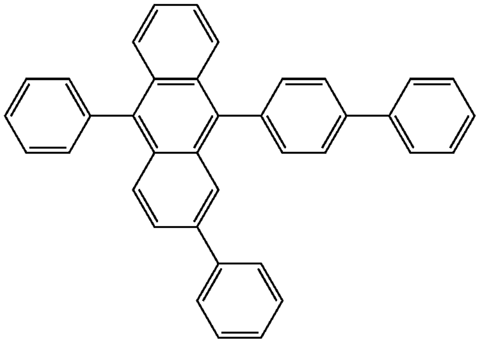
H23
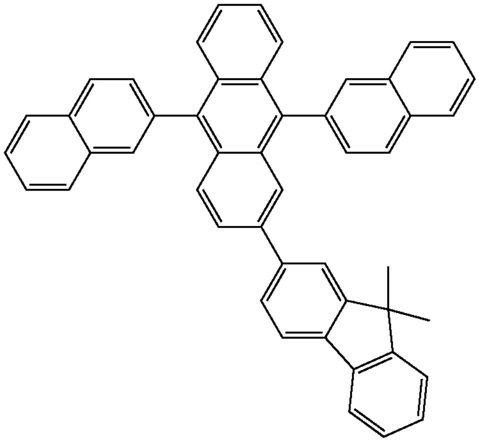
H24
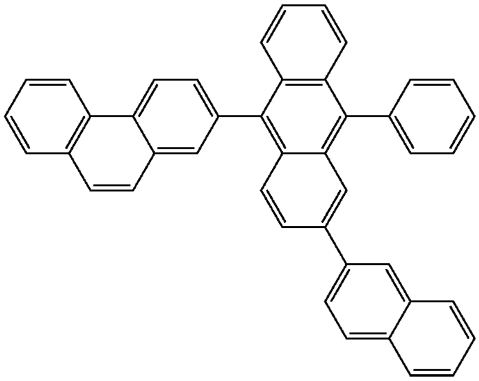
-continued
H25
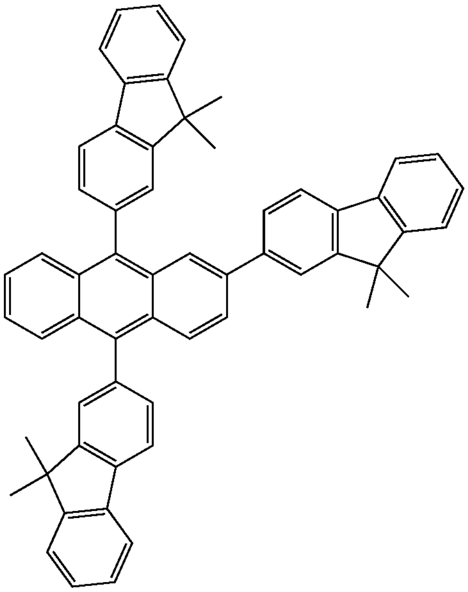
H26
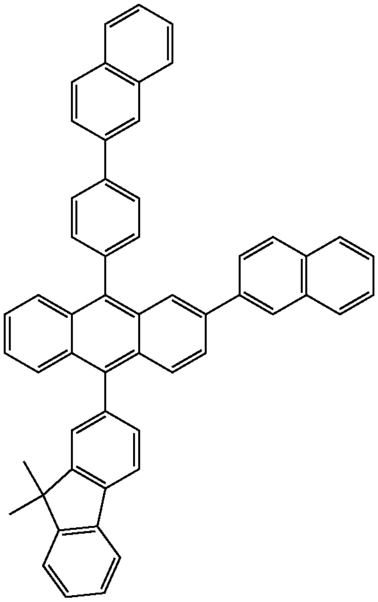

-continued
H27
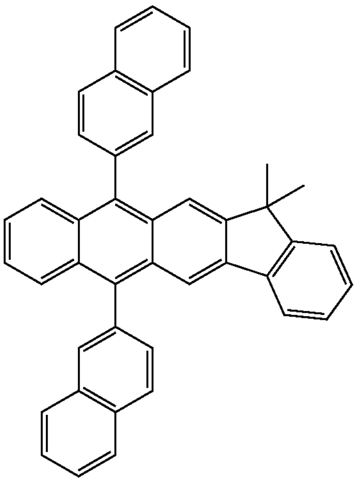
H28
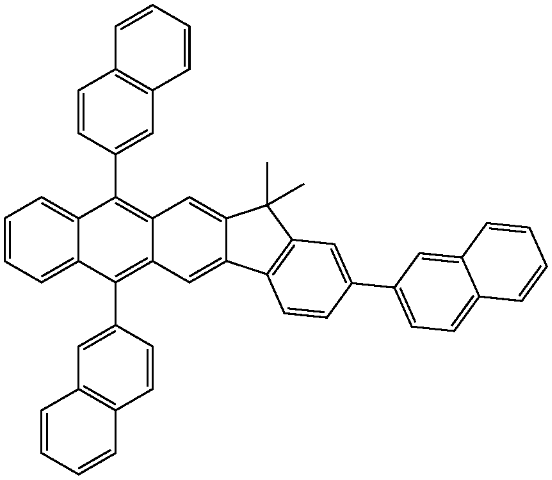
H29
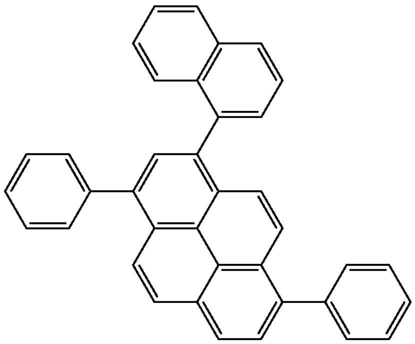
-continued
H30
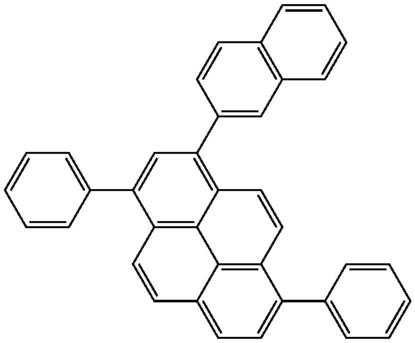
H31
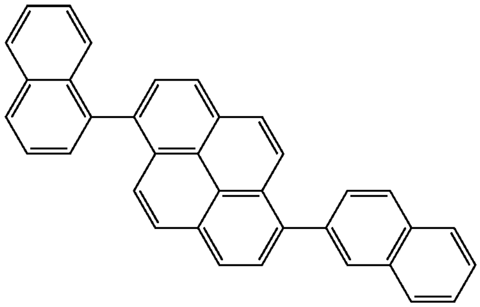
H32
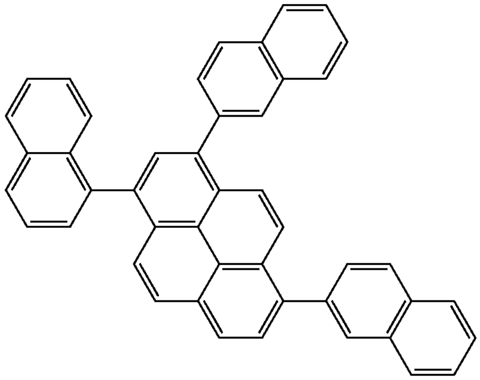
H33
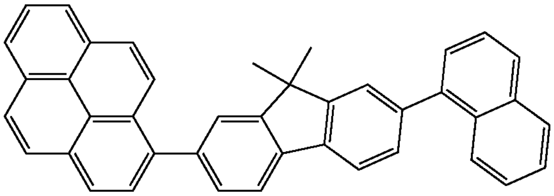
H34
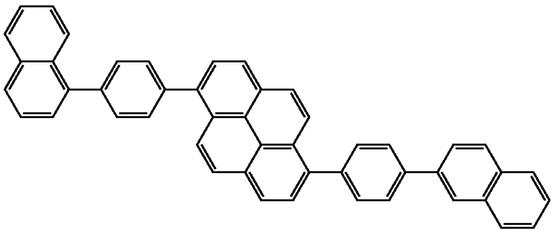

-continued
H35
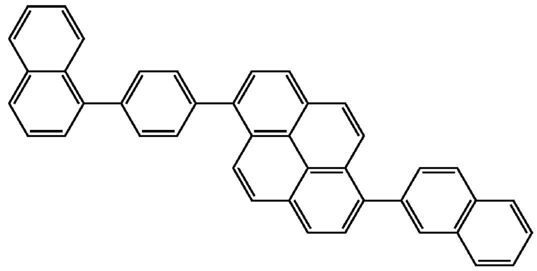
H36
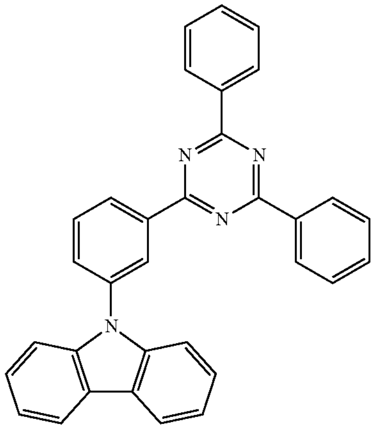
H37
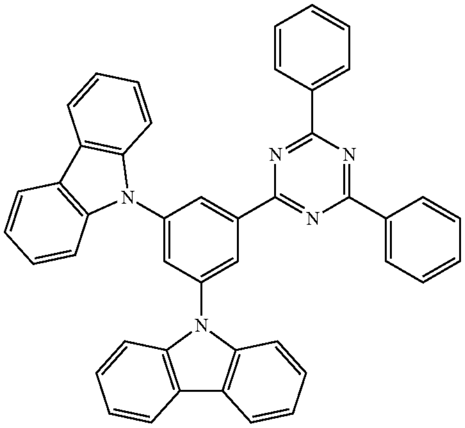
H38
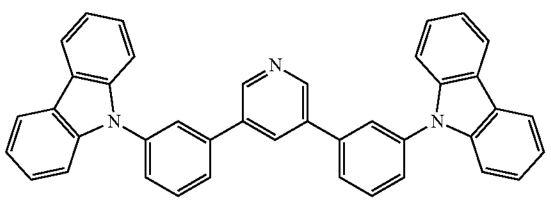
-continued
H39
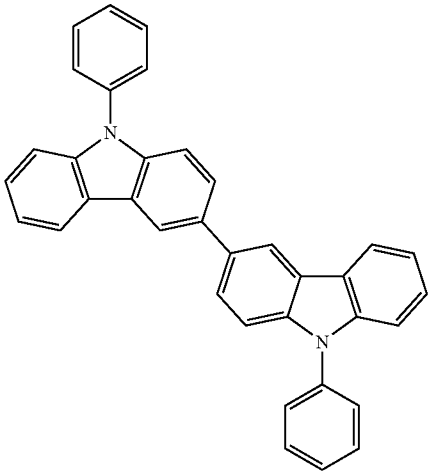
H40
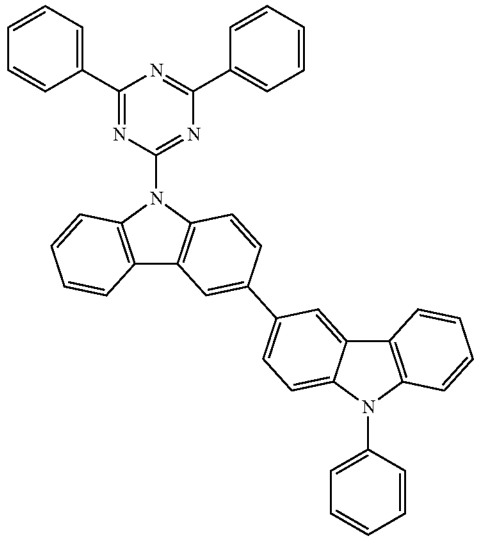
H41
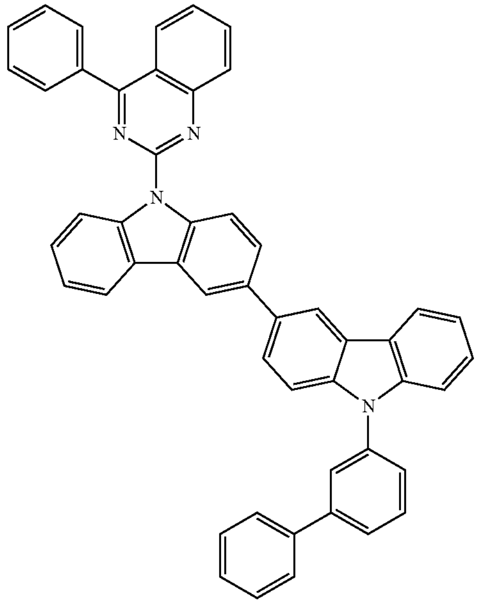

-continued
H42
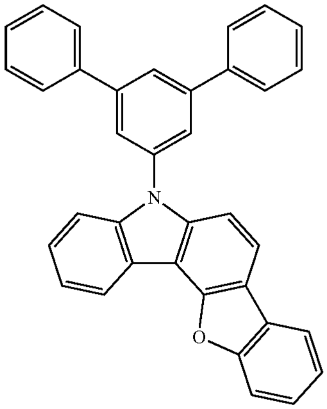
H43
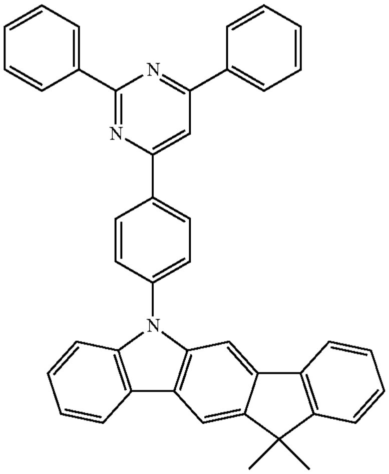
H44
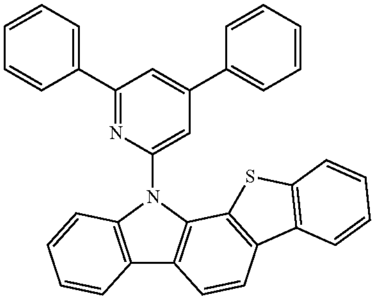
H45
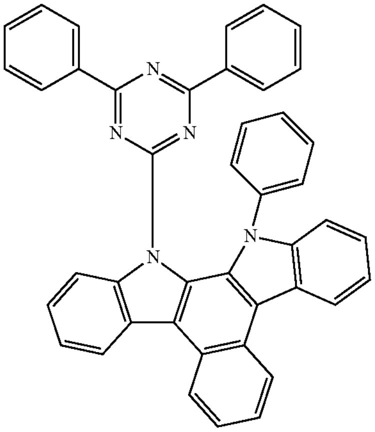
-continued
H46
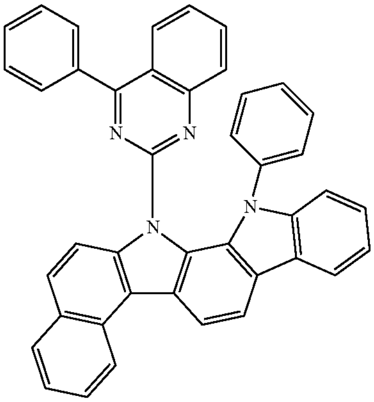
H47
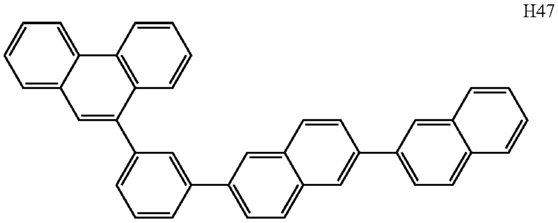
H48
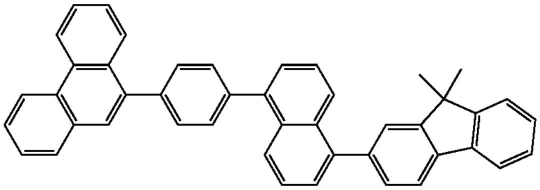
H49
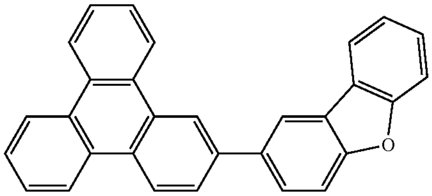
H50
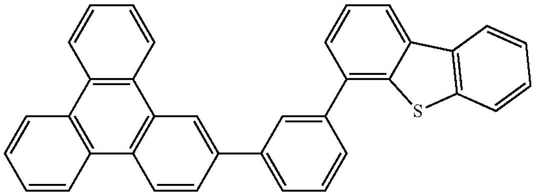
H51
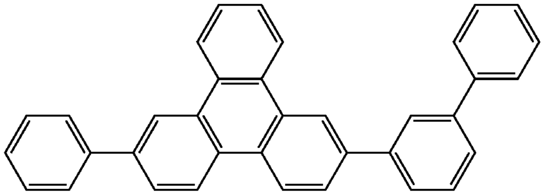

-continued
H52
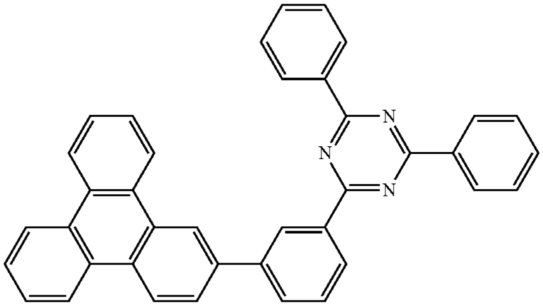
H53
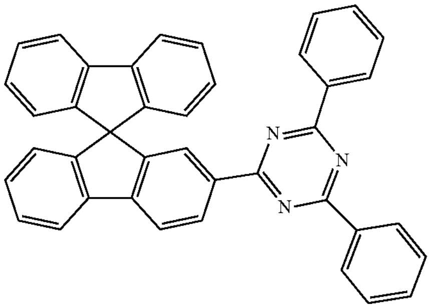
H54
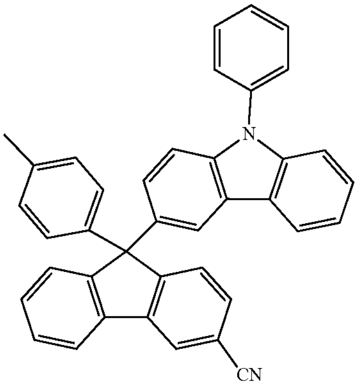
H55
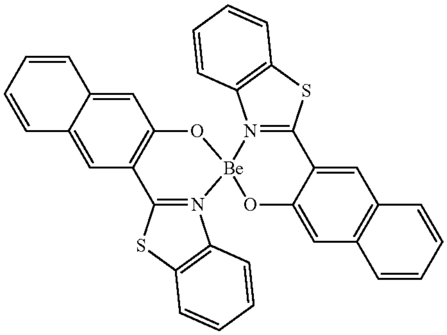
-continued
H56
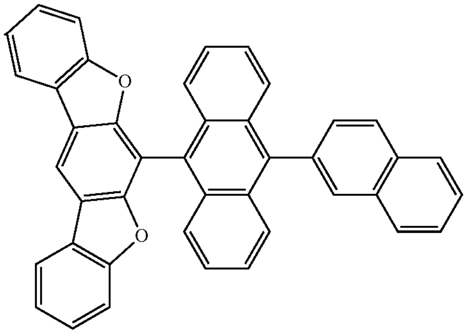
H57
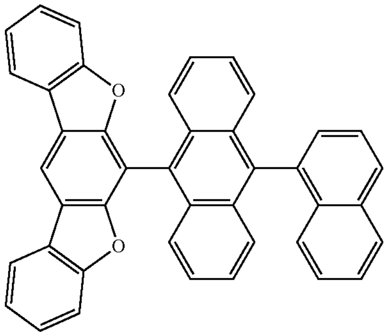
H58
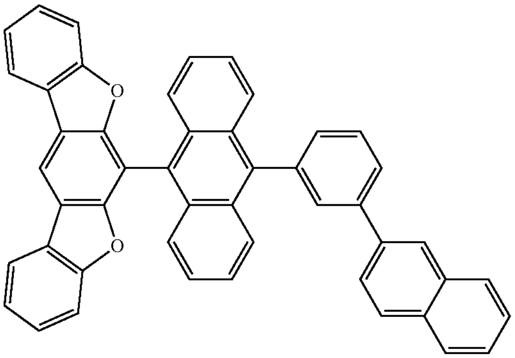
H59
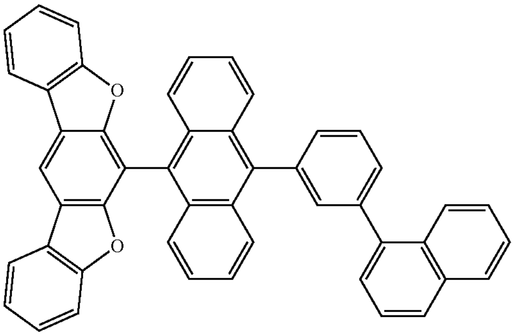

-continued
H60
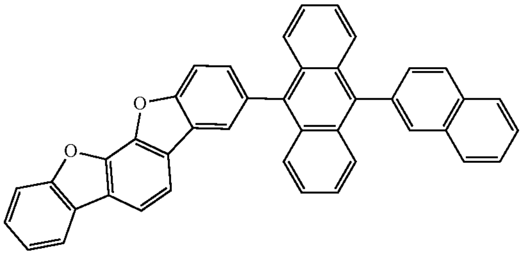
H61
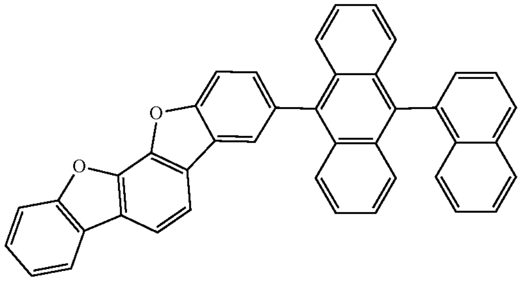
H62
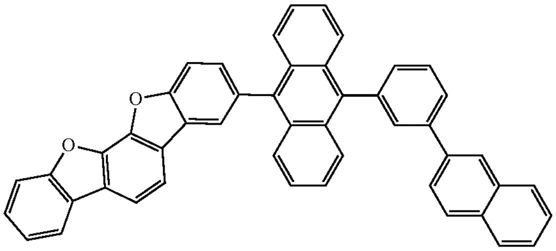
H63
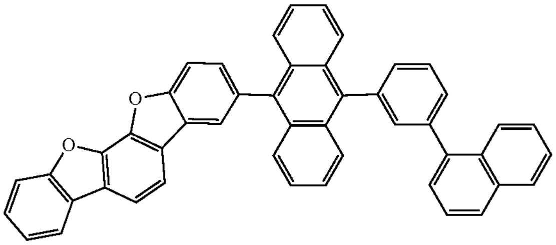
H64
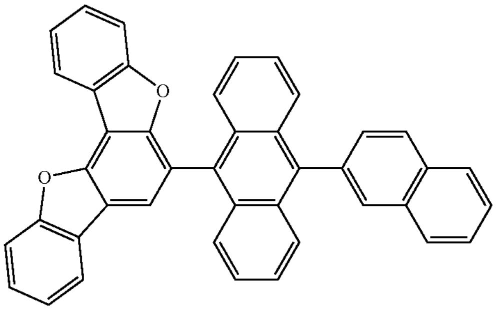
-continued
H65
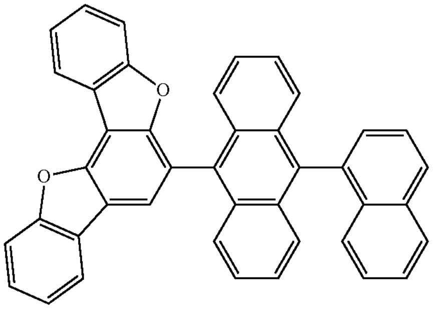
H66
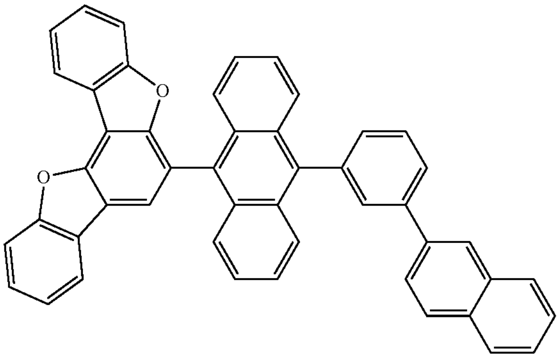
H67
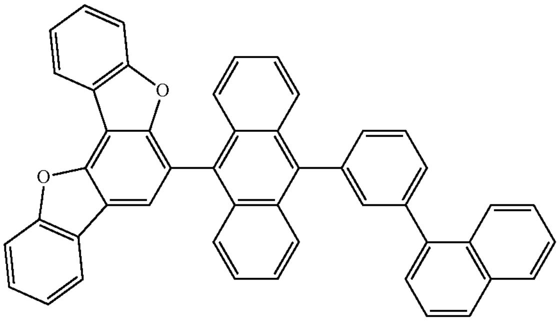
H68
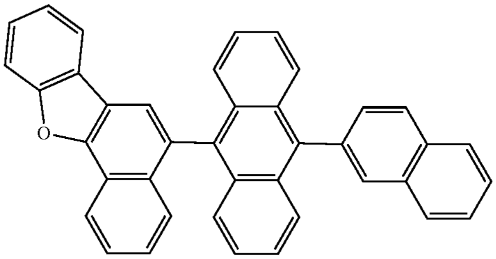
H69
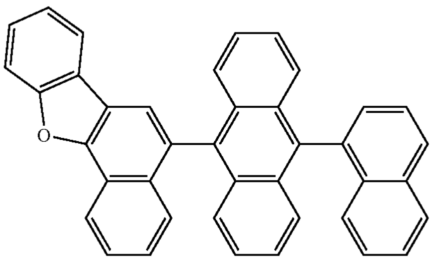

-continued
H70
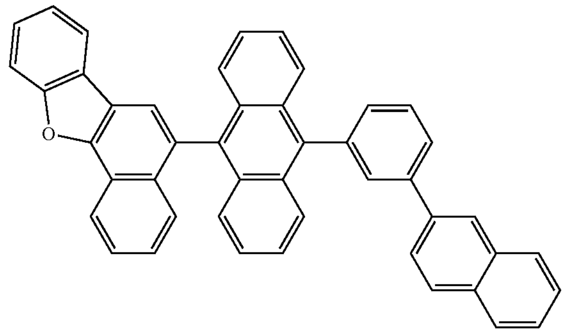
H71
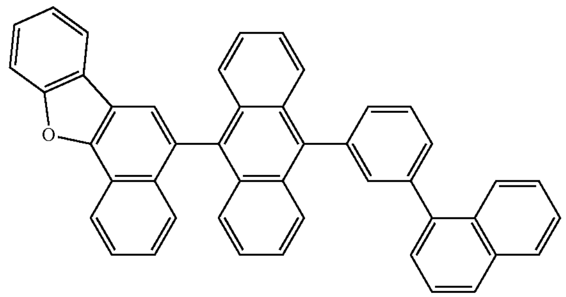
H72
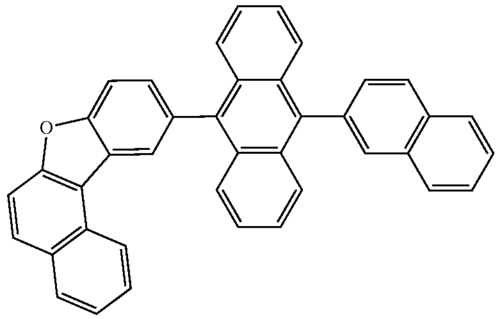
H73
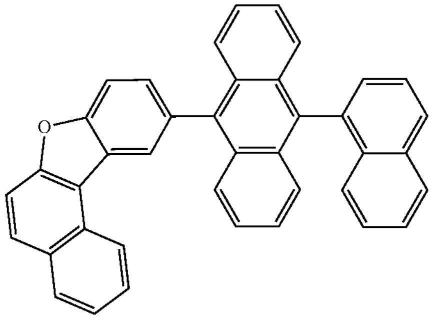
-continued
H74
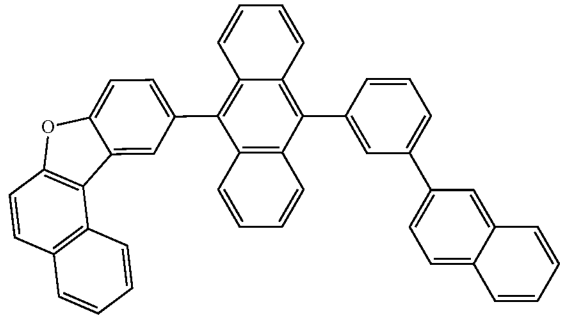
H75
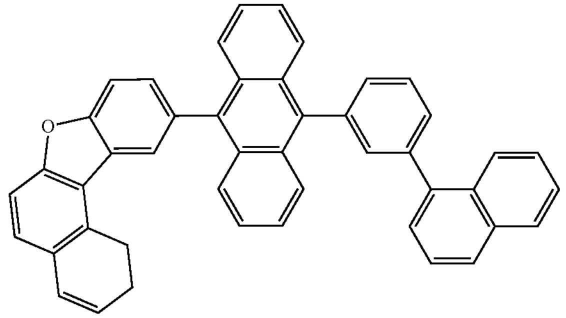
H76
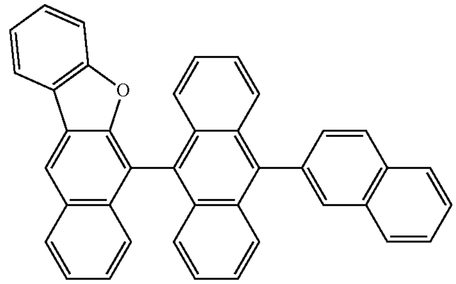
H77
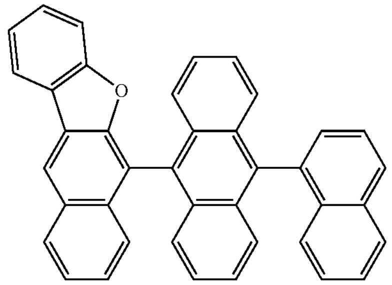
H78
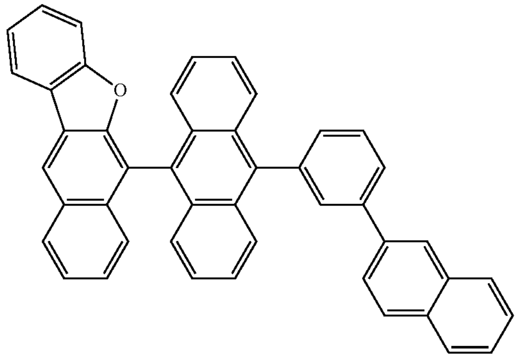

-continued
H79
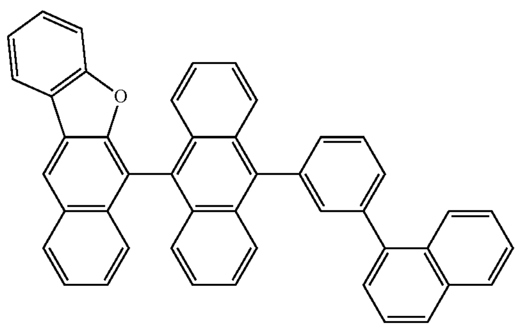
H80
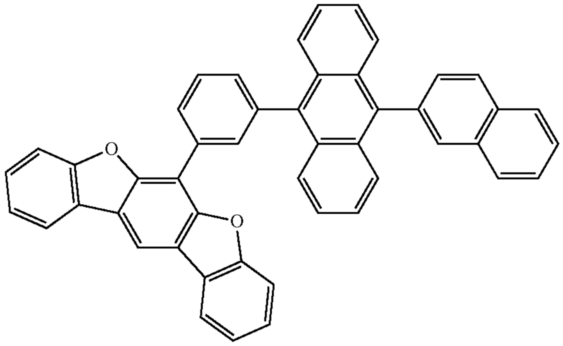
H81
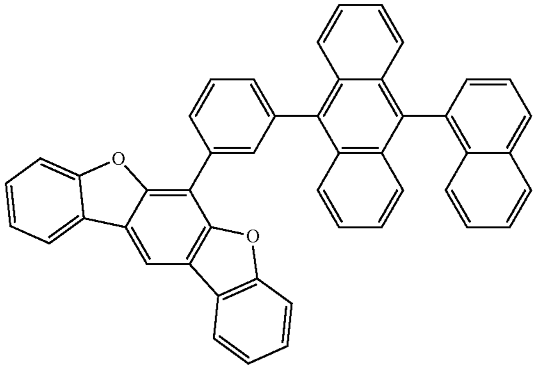
H82
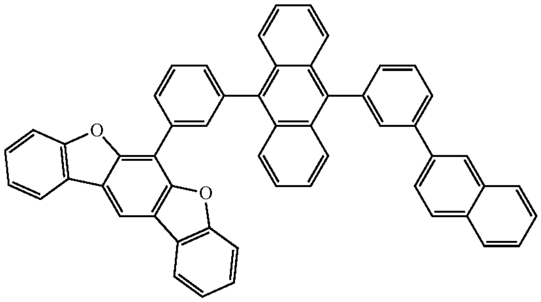
-continued
H83
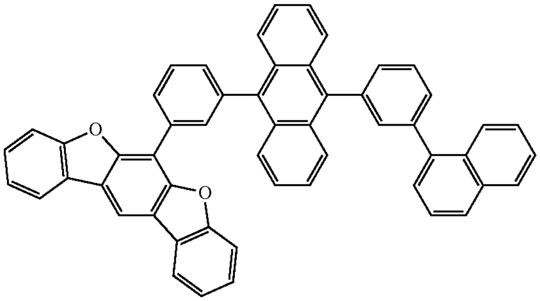
H84
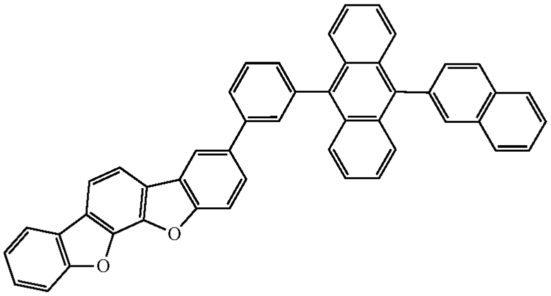
H85
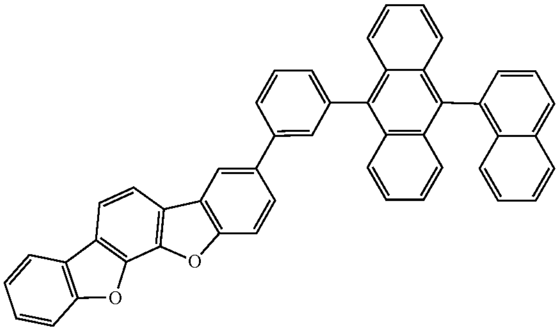
H86
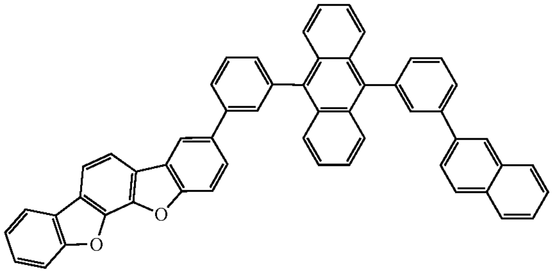
H87
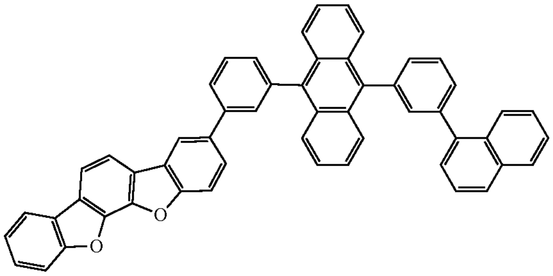

-continued
H88
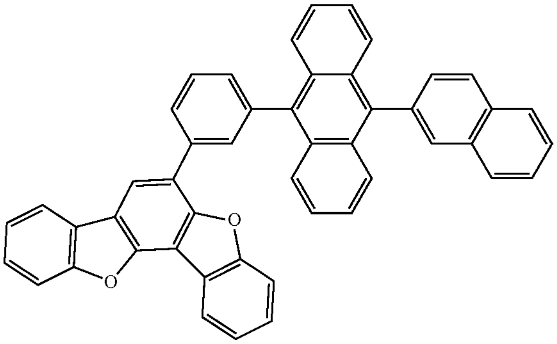
H89
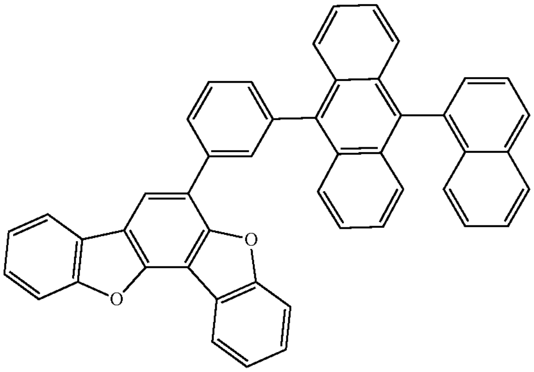
H90
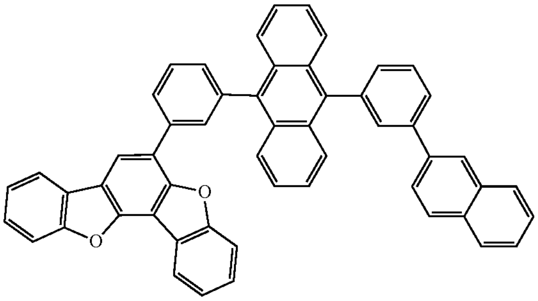
H91
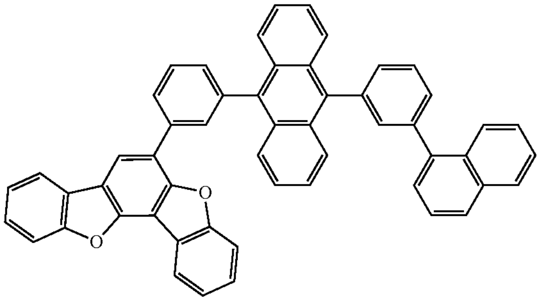
-continued
H92
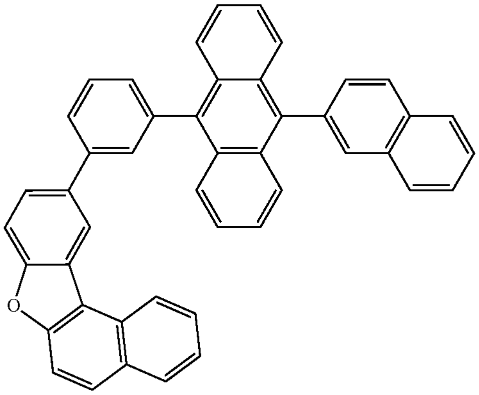
H93
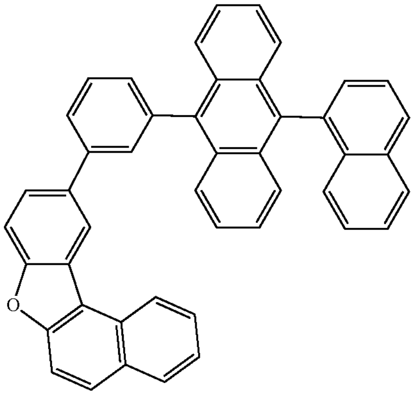
H94
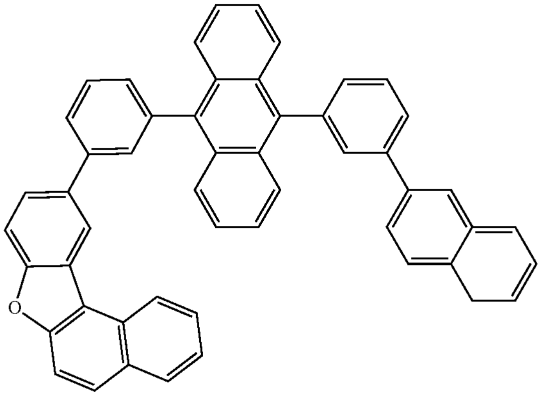
H95
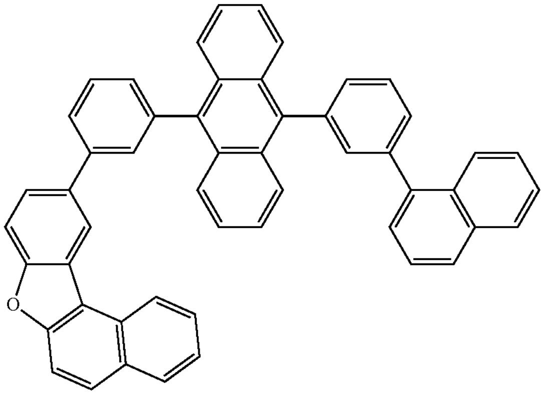

-continued
H96
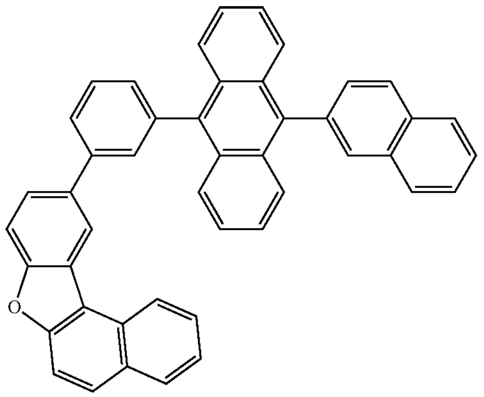
H97
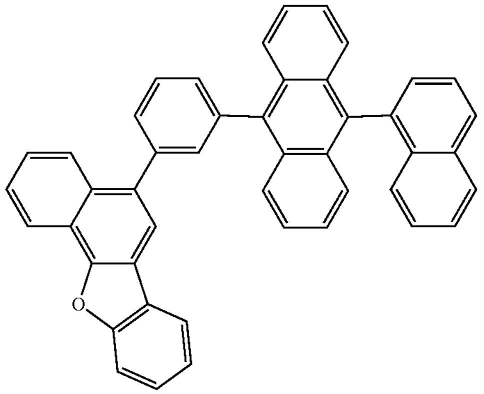
H98
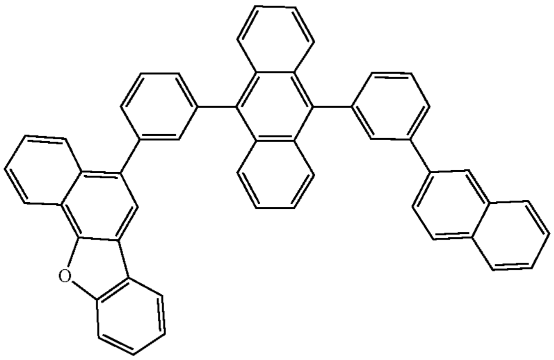
H99
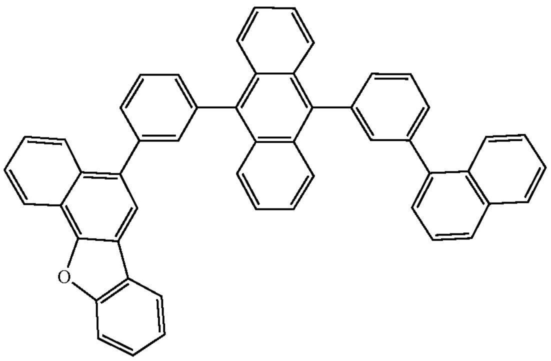
-continued
H100
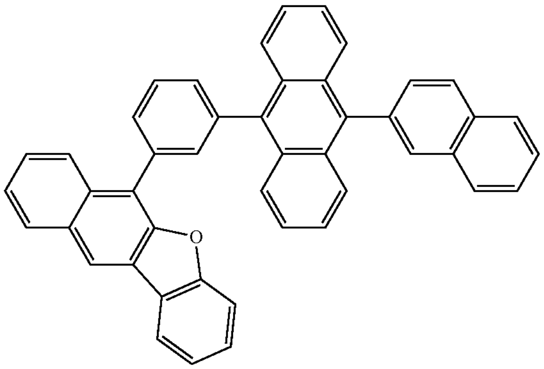
H101
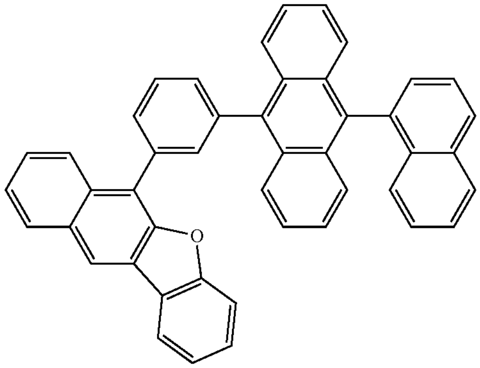
H102
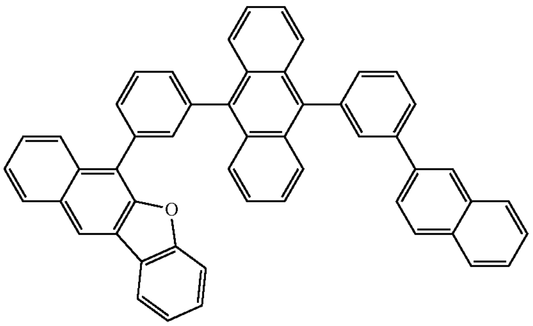
H103
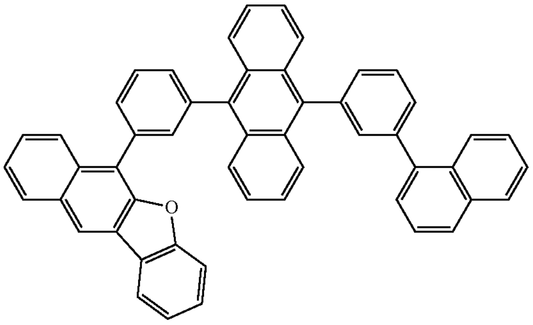

-continued
H104
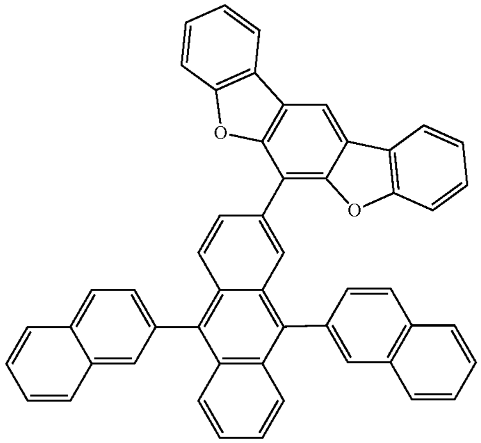
H105
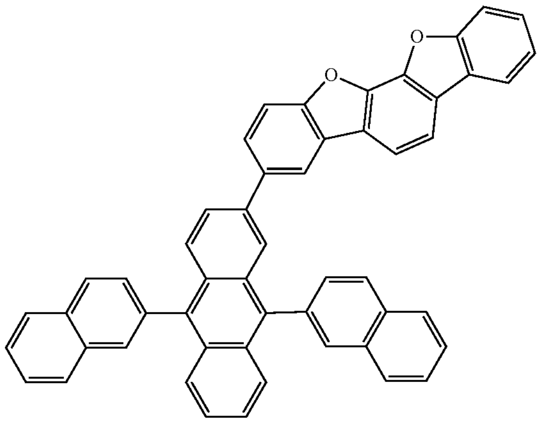
H106
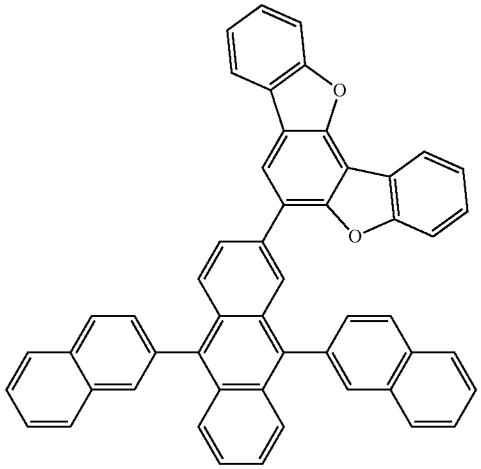
-continued
H107
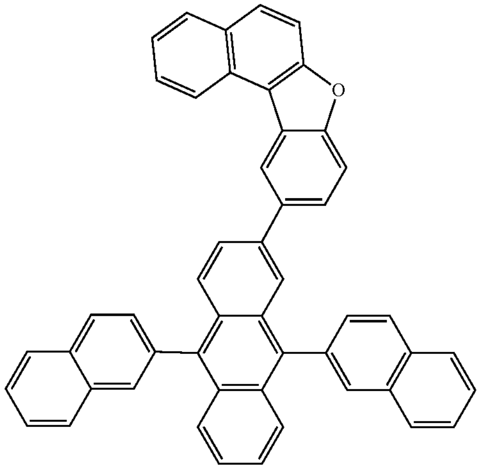
H108
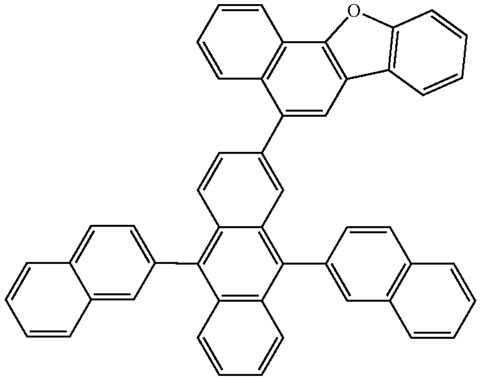
H109
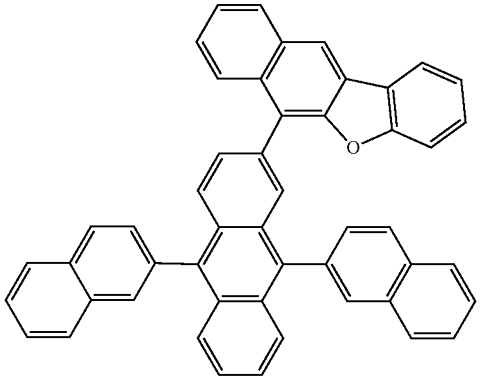
H110
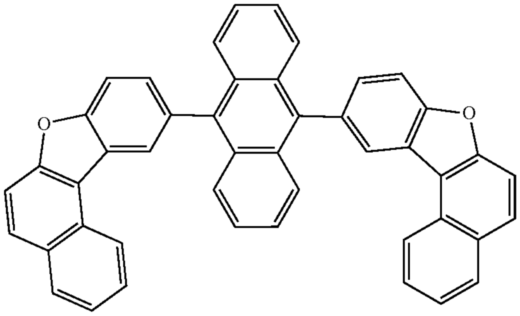

-continued
H111
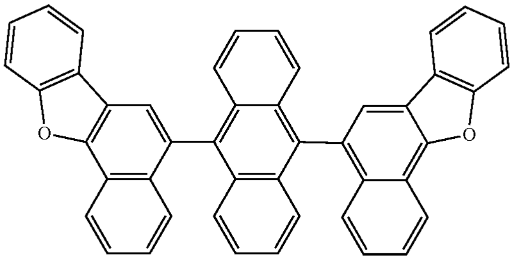
H112
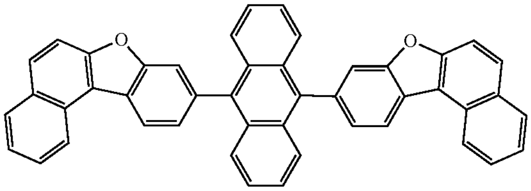
H113
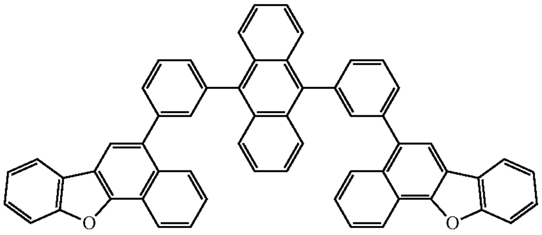
H114
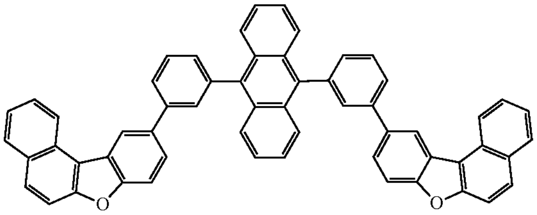
H115
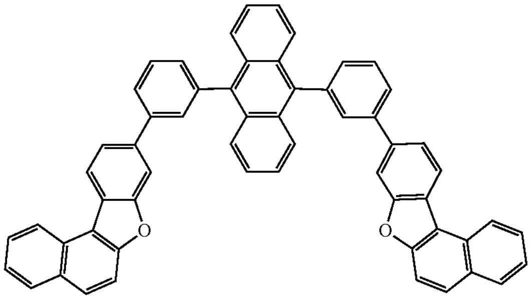
-continued
H116
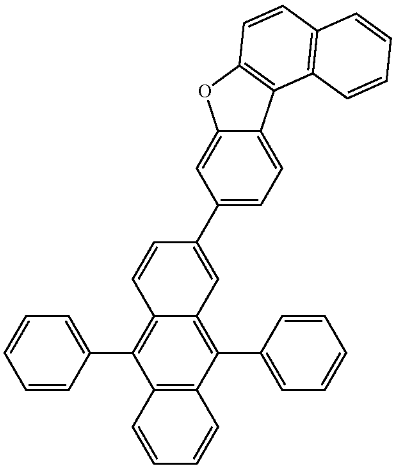
H117
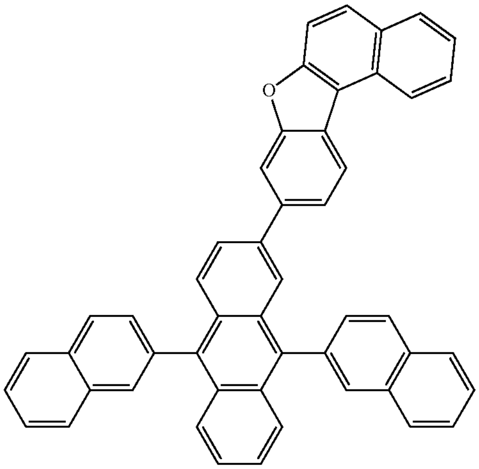
H118
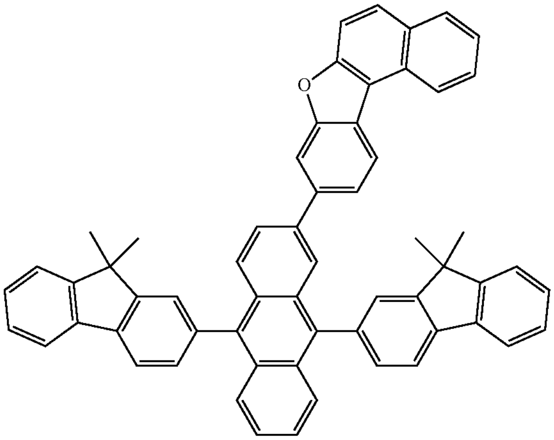

-continued
H119
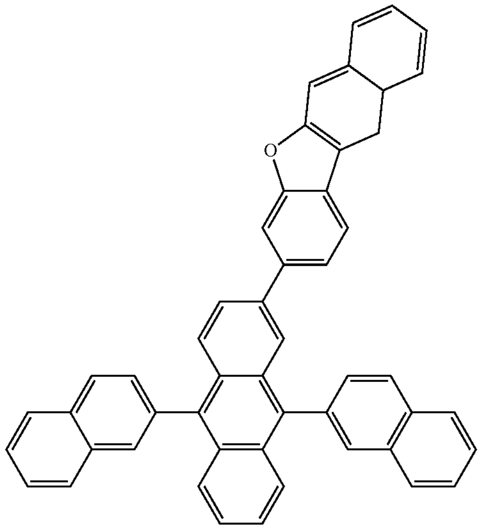
H120
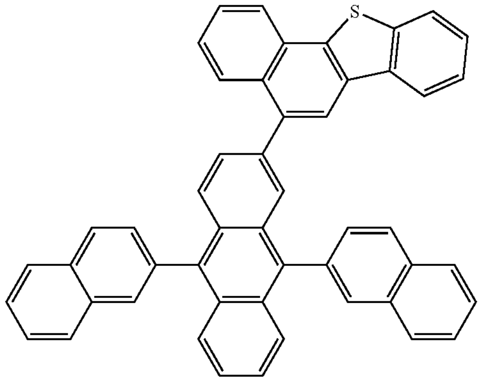
H121
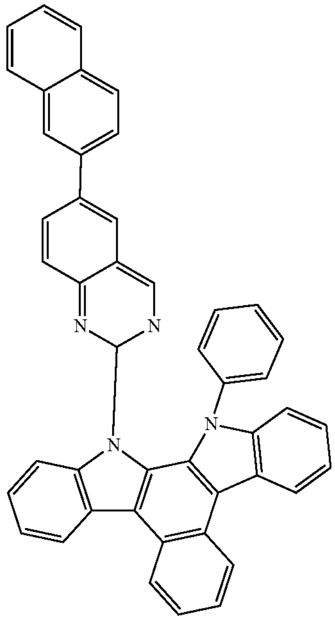
-continued
H122
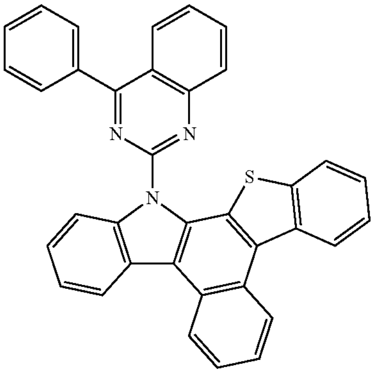
H123
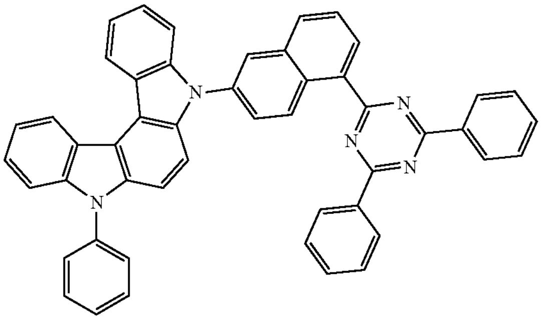
H124
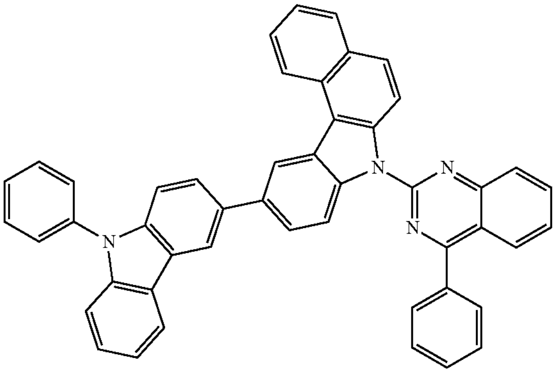
H125
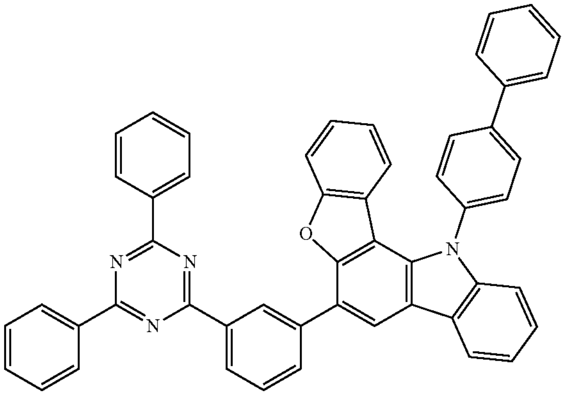

-continued

H126

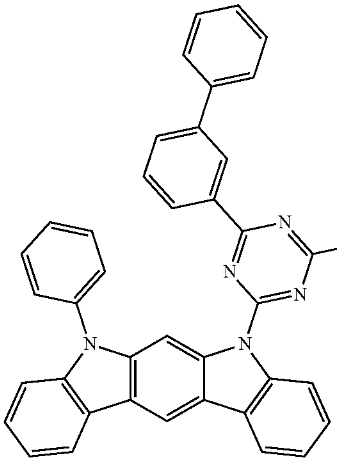

H127

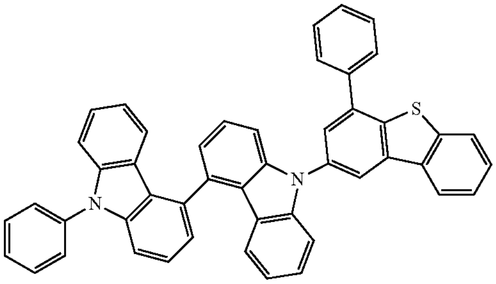

H128

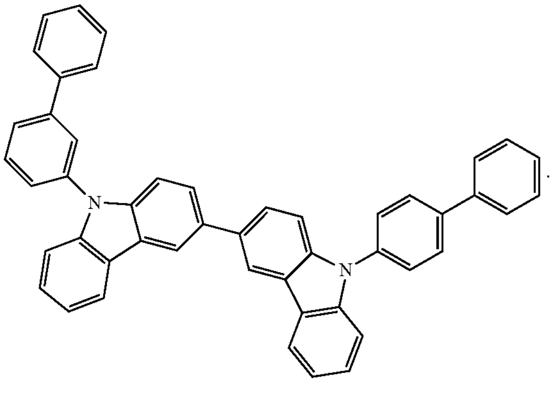

Phosphorescent Dopant

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

In one or more embodiments, the phosphorescent dopant may be electrically neutral.

For example, in one or more embodiments, the phosphorescent dopant may include an organometallic compound represented by Formula 401:

Formula 401

$$M(L_{401})_{xc1}(L_{402})_{xc2}$$

Formula 402

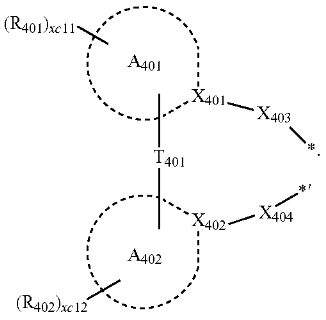

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 is 1, 2, or 3, wherein, when xc1 is 2 or more, two or more of $L_{401}$ (s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*, *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as defined with respect to $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as defined with respect to $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen and $X_{402}$ may be carbon, or ii) each of $X_{401}$ and $X_{402}$ may be nitrogen.

In one or more embodiments, when xc1 in Formula 401 is 2 or more, two ring $A_{401}$ (s) among two or more of $L_{401}$ (s) may optionally be linked to each other via $T_{402}$, which is a linking group, and two ring $A_{402}$(s) among two or more of $L_{401}$ (s) may optionally be linked to each other via $T_{403}$, which is a linking group (see Compounds PD1 to PD4 and PD7). $T_{402}$ and $T_{403}$ may each independently be the same as defined with respect to $T_{401}$.

In Formula 401, $L_{402}$ may be an organic ligand. For example, in some embodiments, $L_{402}$ may include a halogen, a diketone group (for example, an acetylacetonate group), a carboxylic acid group (for example, a picolinate group), —C(═O), an isonitrile group, a —CN group, a phosphorus group (for example, a phosphine group, a phosphite group, etc.), or any combination thereof.

In one or more embodiments, the phosphorescent dopant may include, for example, at least one selected from Compounds PD1 to PD39, and/or any combination thereof:

PD1

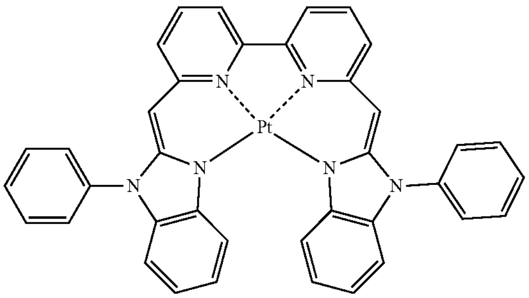

PD2

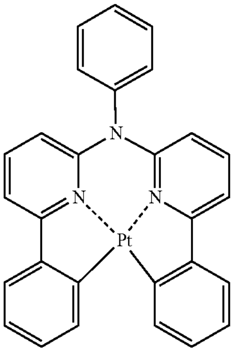

PD3

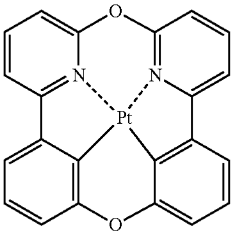

-continued

PD4

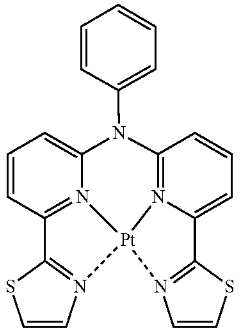

PD5

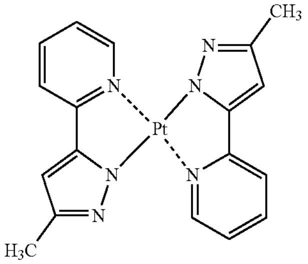

PD6

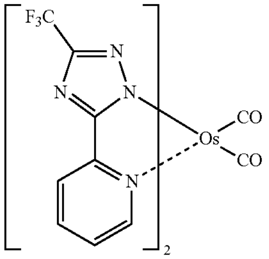

PD7

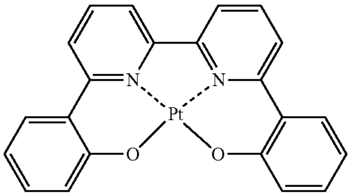

PD8

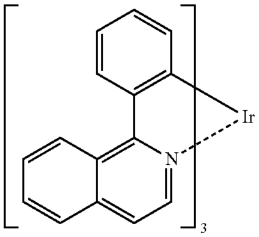

PD9

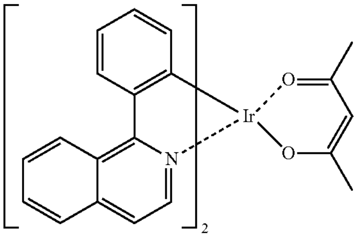

-continued
PD10
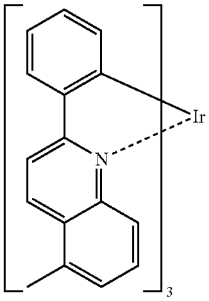
PD11
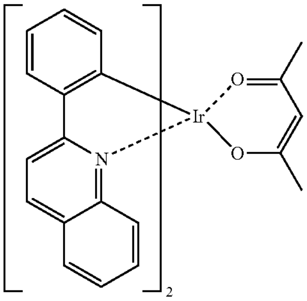
PD12
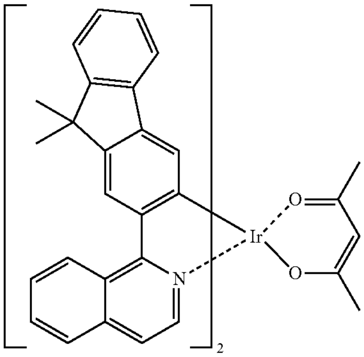
PD13
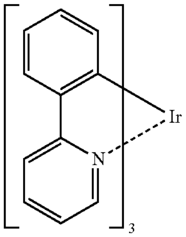
PD14
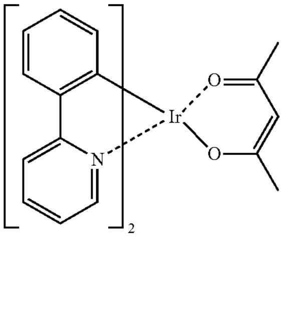
-continued
PD15
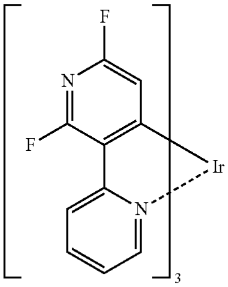
PD16
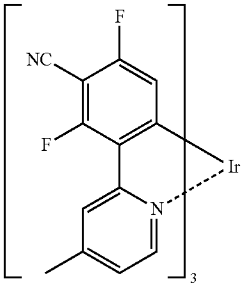
PD17
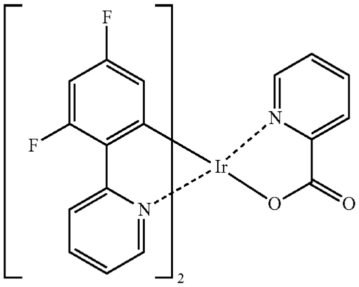
PD18
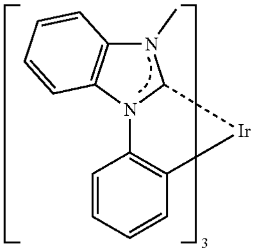
PD19
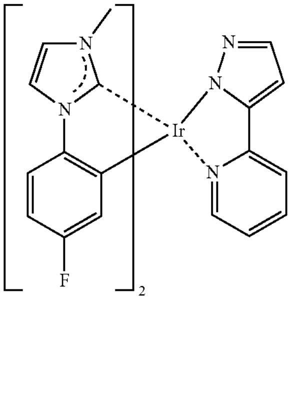

-continued
PD20
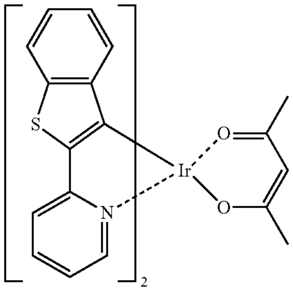
PD21
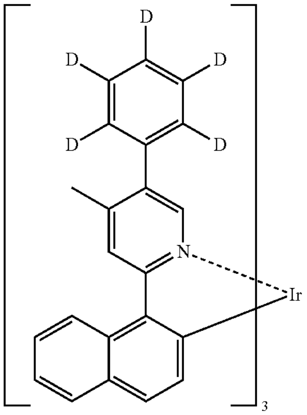
PD22
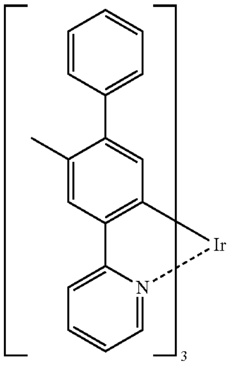
PD23
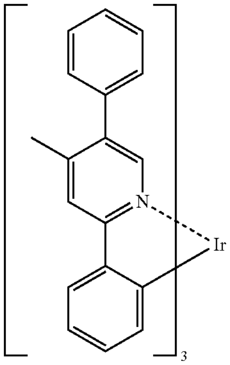
-continued
PD24
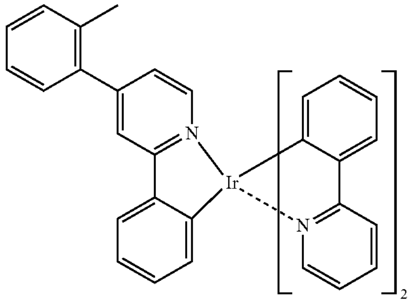
PD25
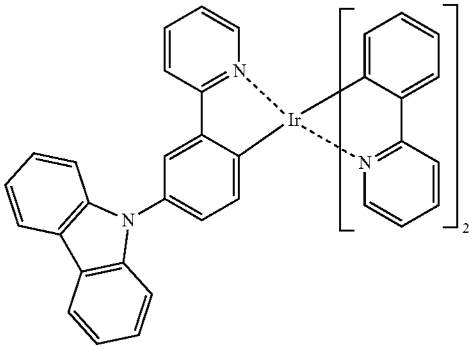
PD26
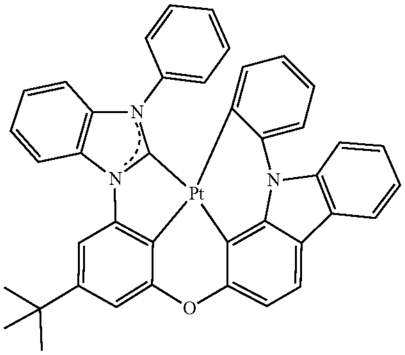
PD27
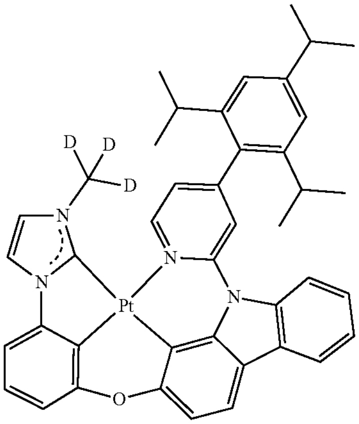

-continued
PD28
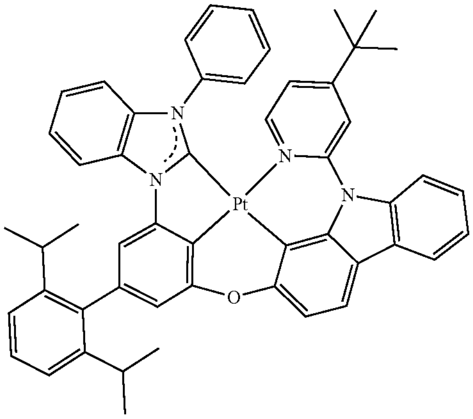
PD29
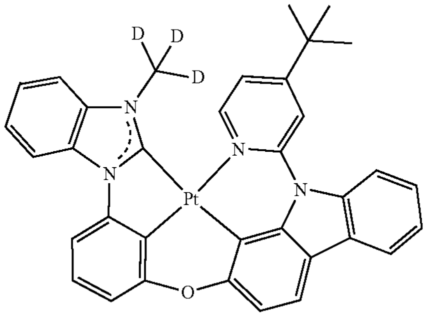
PD30
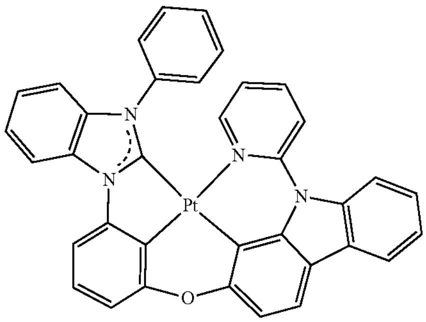
PD31
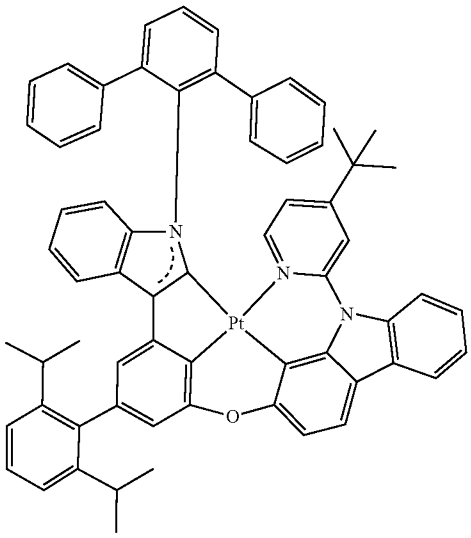
-continued
PD32
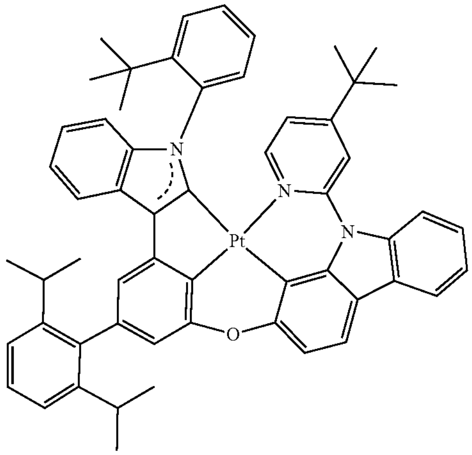
PD33
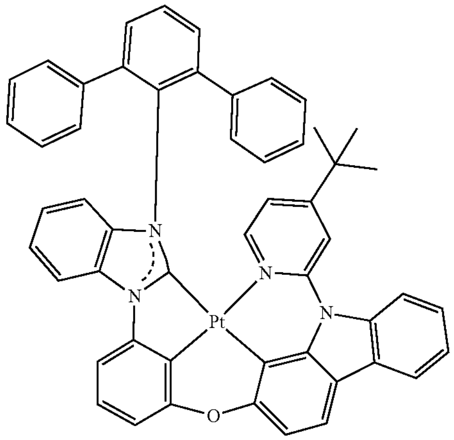
PD34
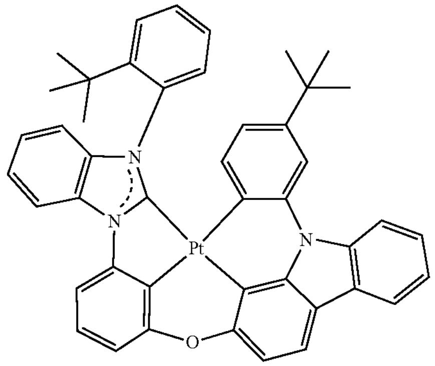

-continued

PD35

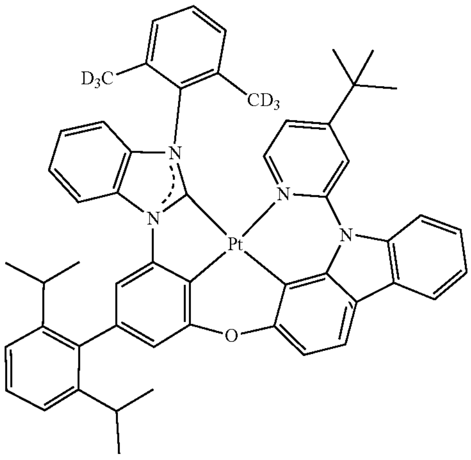

PD36

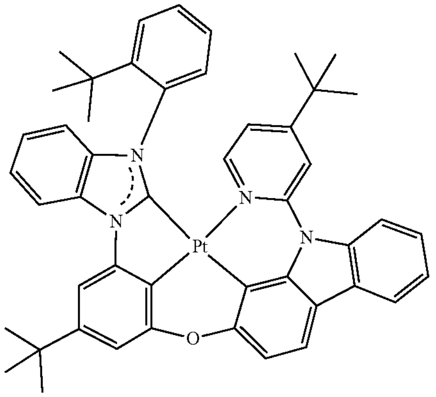

PD37

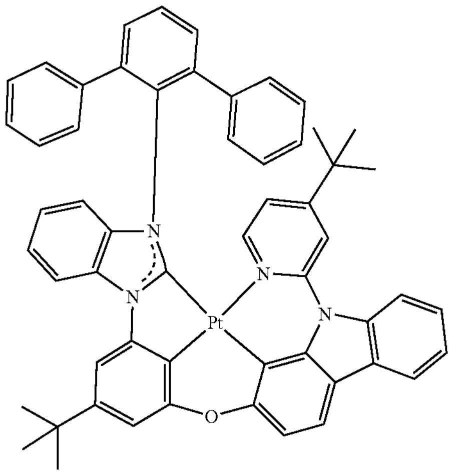

-continued

PD38

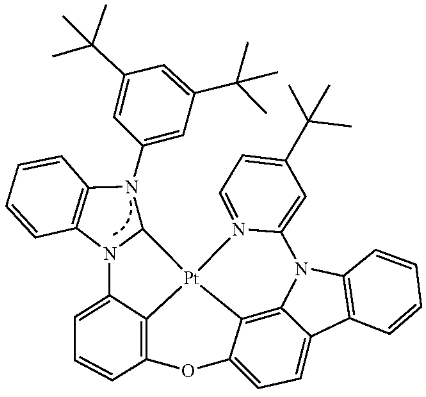

PD39

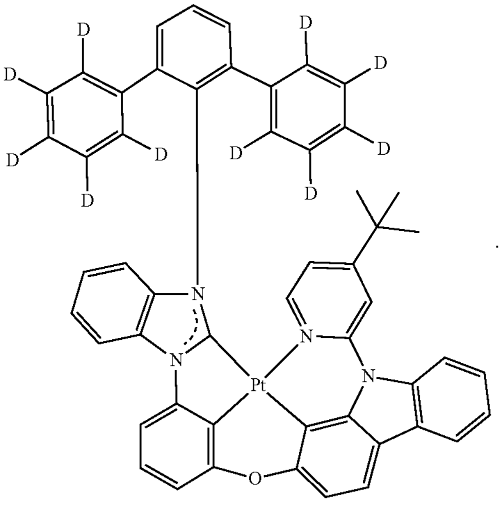

Fluorescent Dopant

The fluorescent dopant may include an amine group-containing compound, a styryl group-containing compound, or any combination thereof.

For example, in one or more embodiments, the fluorescent dopant may include a compound represented by Formula 501:

Formula 501

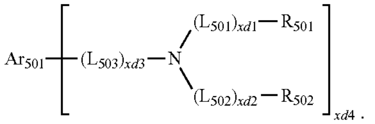

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, a pyrene group, etc.) in which three or more monocyclic groups are condensed together.

In one or more embodiments, xd4 in Formula 501 may be 2.
In one or more embodiments, the fluorescent dopant may include: at least one selected from Compounds FD1 to FD37; 4,4'-bis(2,2-diphenylvinyl)-1,1'-biphenyl (DPVBi); 4,4'-bis[4-(N,N-diphenylamino)styryl]biphenyl (DPAVBi); and/or any combination thereof:
FD1
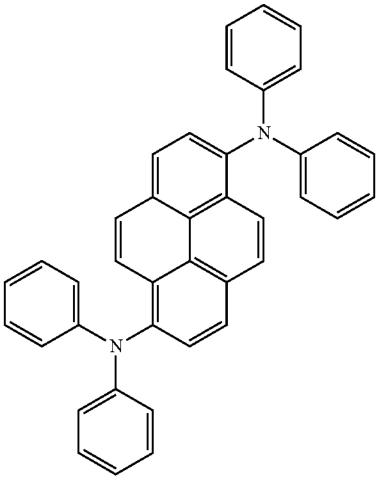
FD2
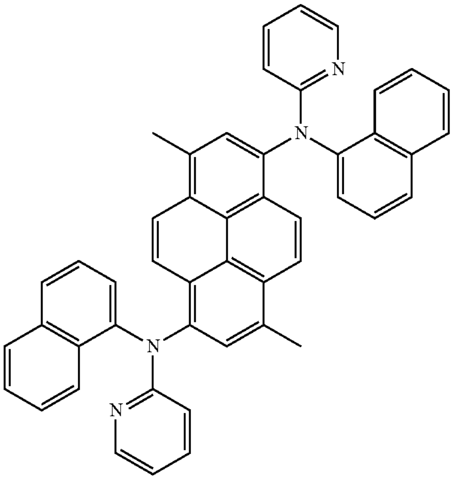
FD3
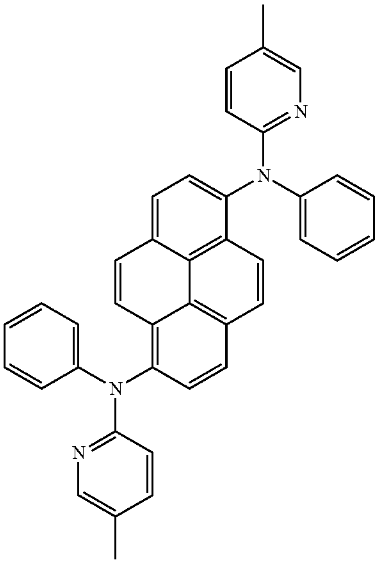
FD4
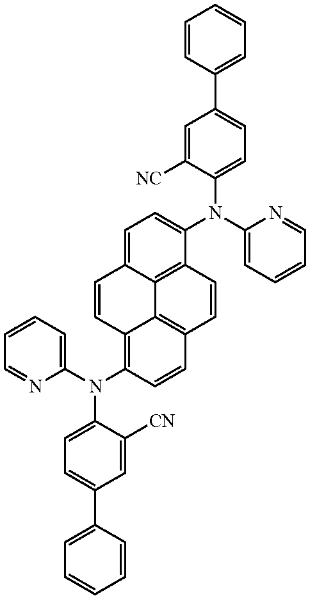

-continued
FD5
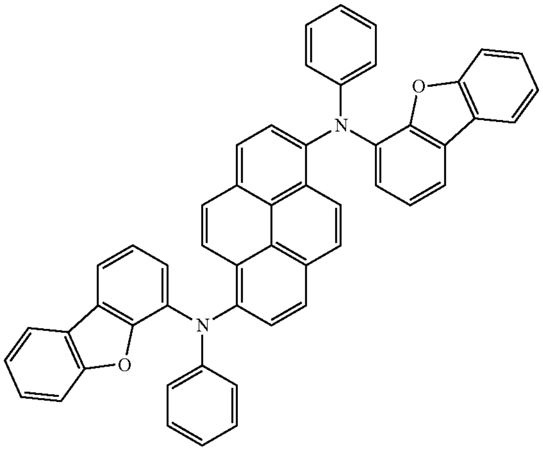
FD6
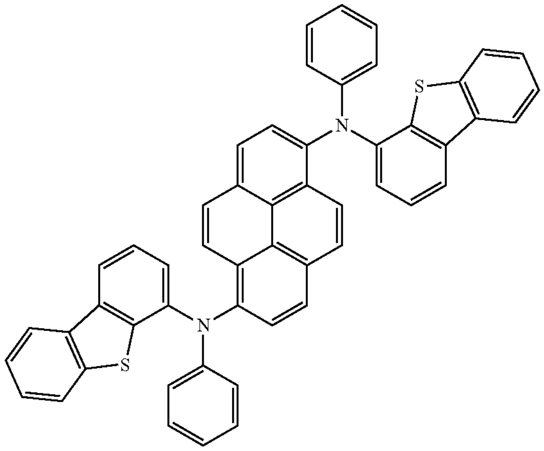
FD7
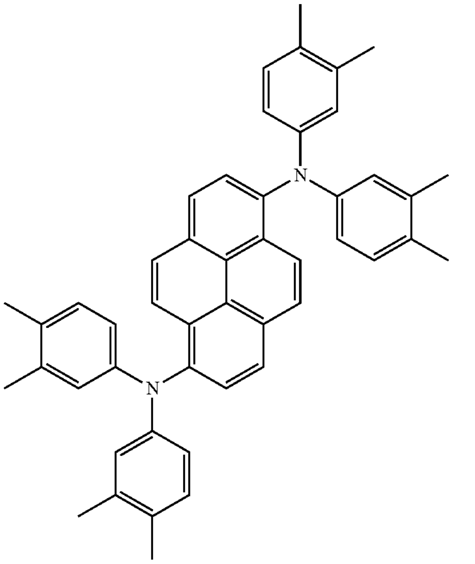
FD8
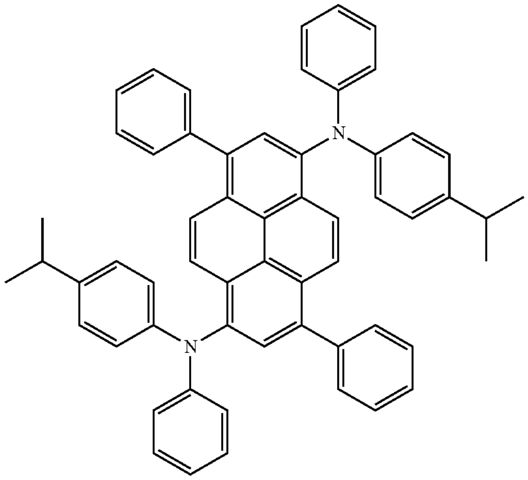
FD9
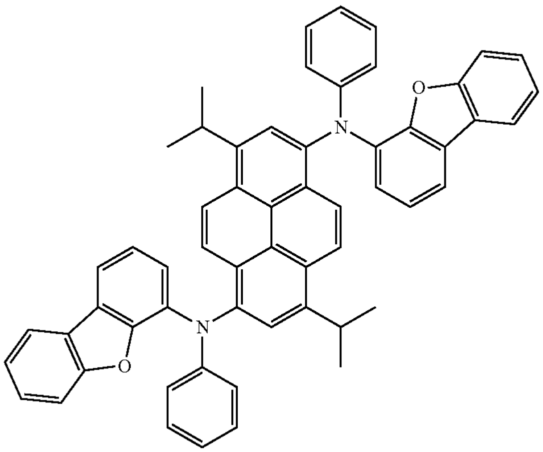
FD10
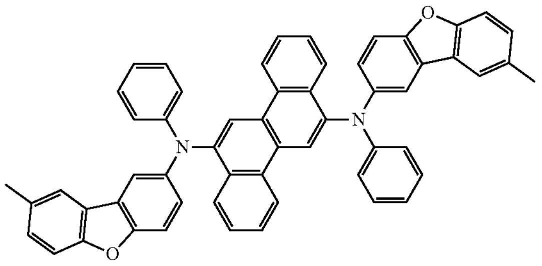

-continued
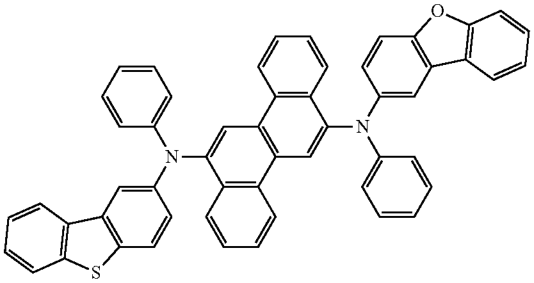
FD11
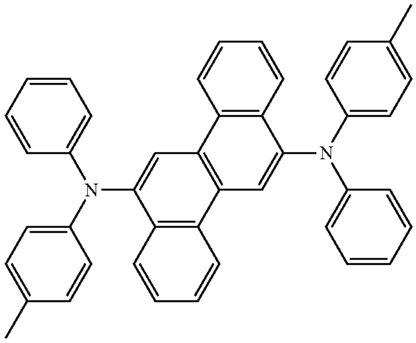
FD12
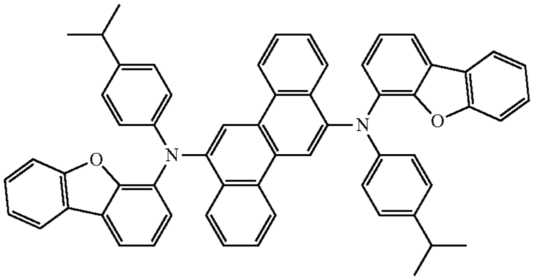
FD13
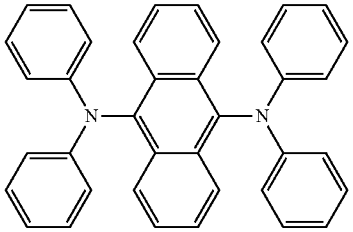
FD14
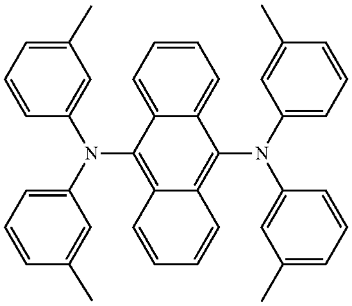
FD15
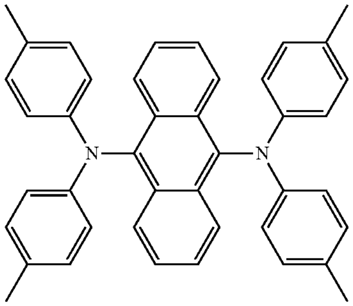
FD16
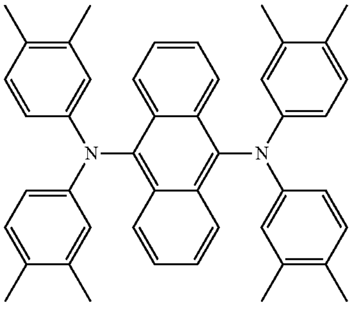
FD17
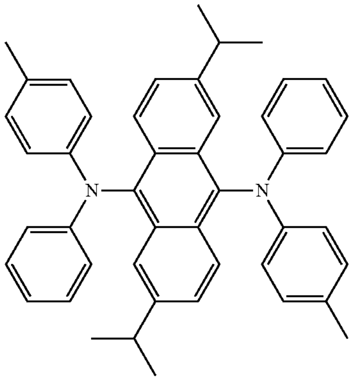
FD18

-continued
FD19
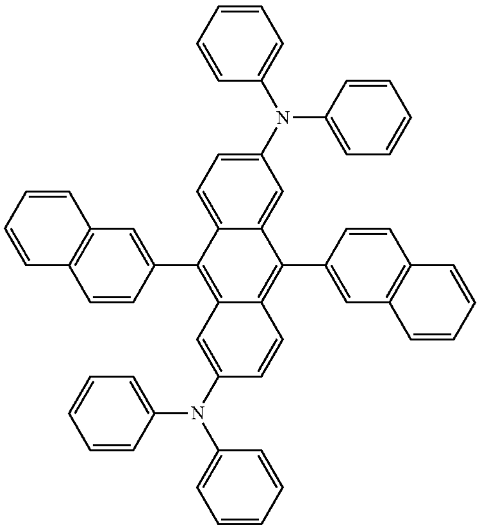
FD20
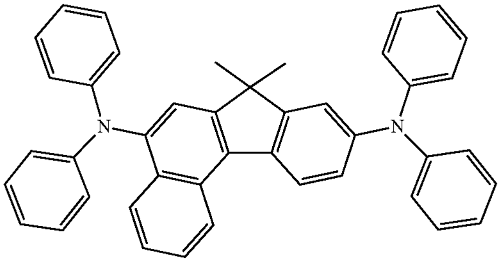
FD21
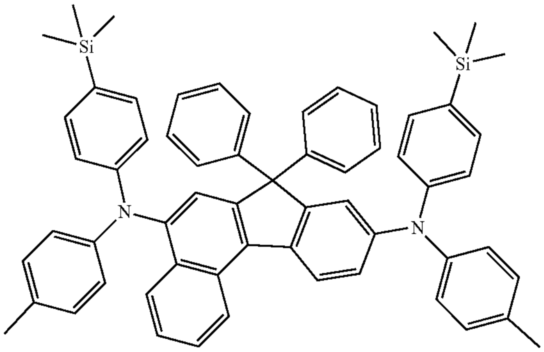
FD22
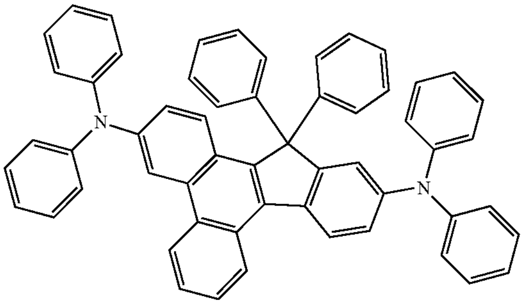
FD23
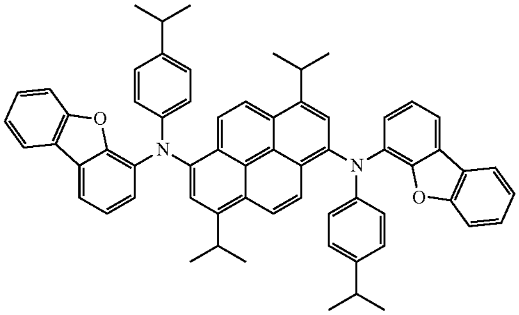
FD24
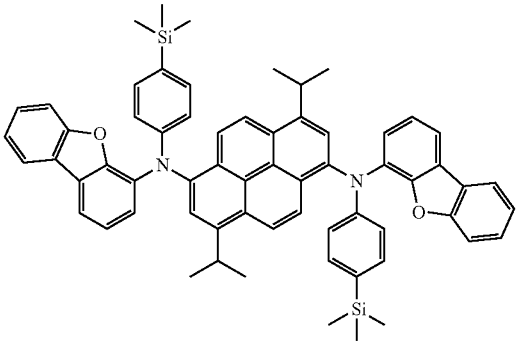
FD25
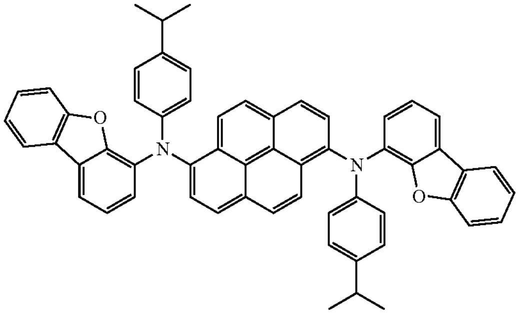
FD26
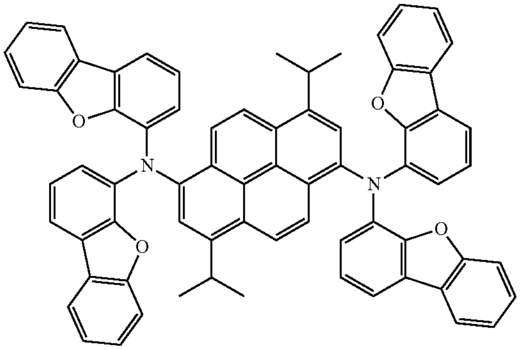

-continued
FD27
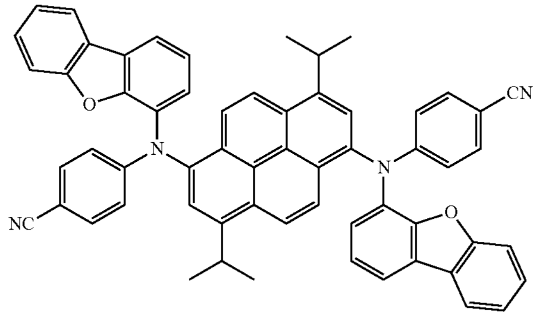
FD28
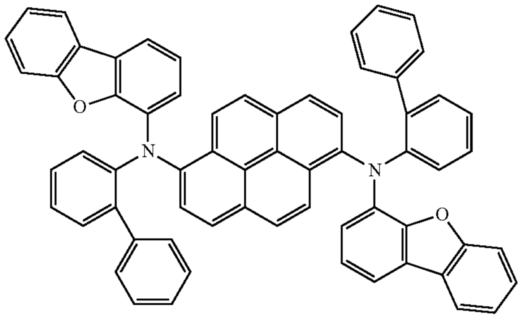
FD29
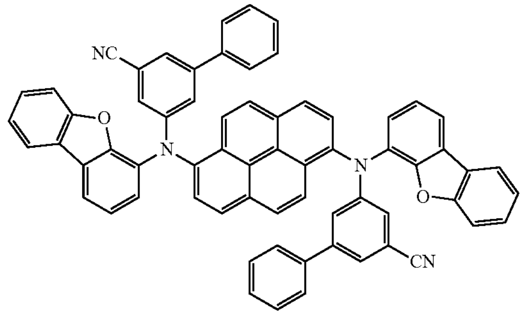
FD30
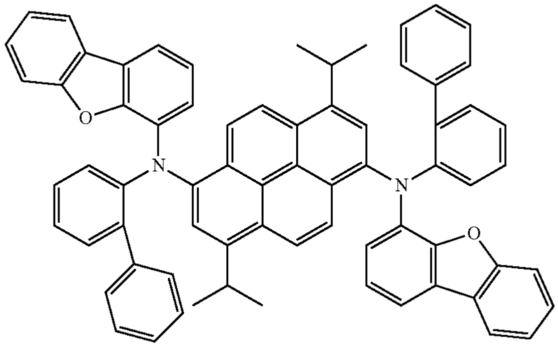
FD31
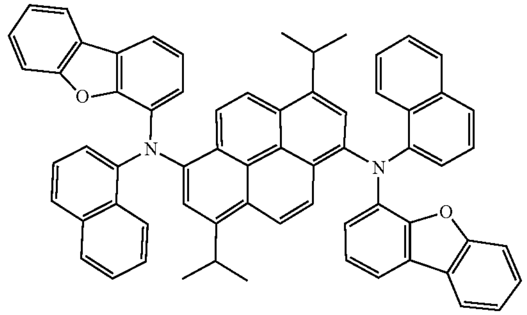
FD32
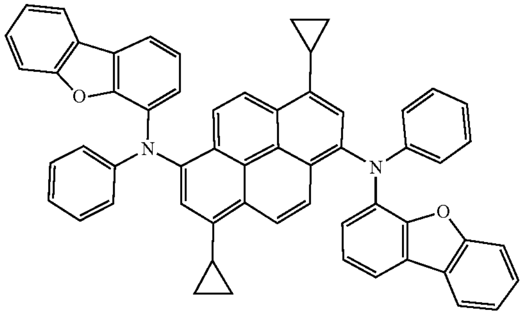
FD33
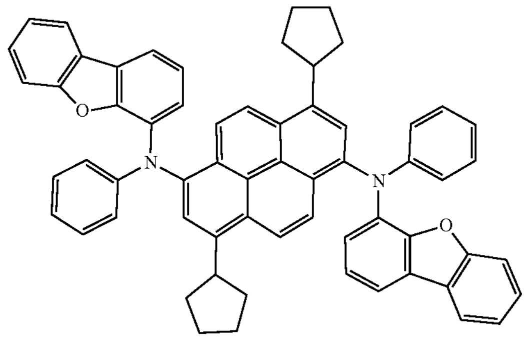
FD34
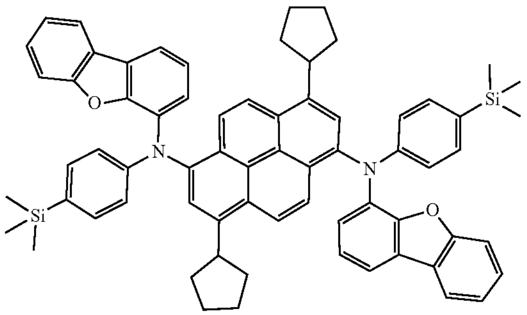

-continued

FD35

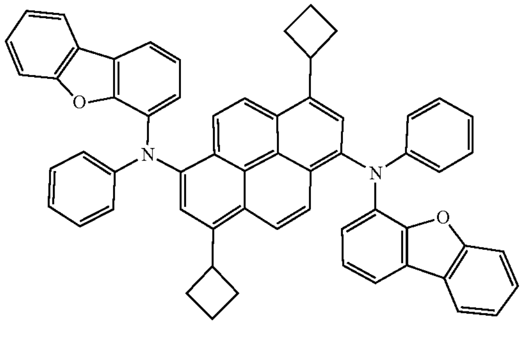

FD36

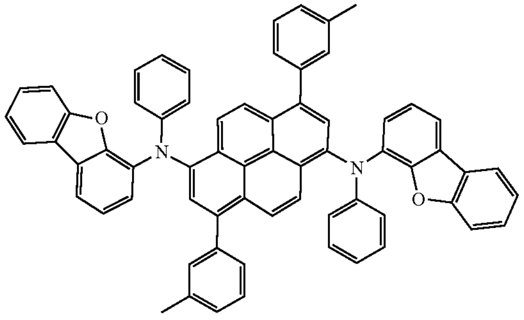

FD37

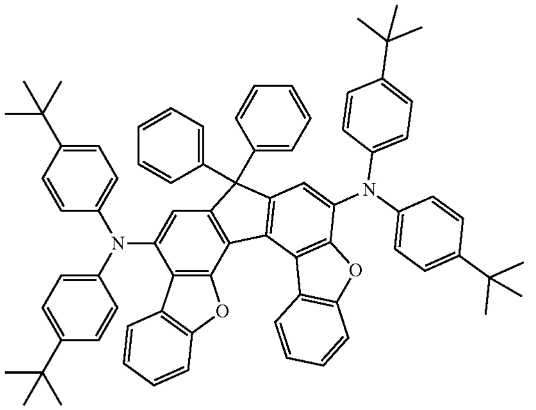

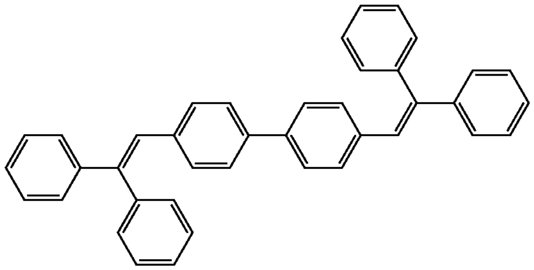

DPVBi

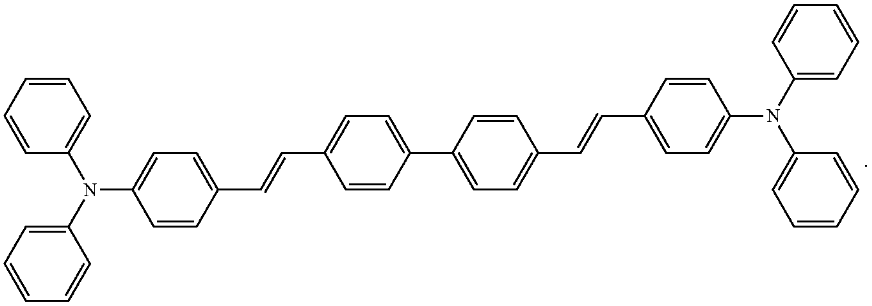

DPAVBi

Delayed Fluorescence Material

In one or more embodiments, the emission layer 130 may include a delayed fluorescence material.

Herein, the delayed fluorescence material may be selected from compounds capable of emitting delayed fluorescence based on a delayed fluorescence emission mechanism.

The delayed fluorescence material included in the emission layer 130 may act as a host or a dopant depending on the type or kind of other materials included in the emission layer 130.

In one or more embodiments, a difference between a triplet energy level (eV) of the delayed fluorescence material and a singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material is satisfied within the range described above, up-conversion from the triplet state to the singlet state of the delayed fluorescence materials may effectively occur, and thus, the light-emitting device 10 may have improved luminescence efficiency.

For example, the delayed fluorescence material may include i) a material including at least one electron donor (for example, a π electron-rich $C_3$-$C_{60}$ cyclic group, such as a carbazole group, etc.) and at least one electron acceptor (for example, a sulfoxide group, a cyano group, a π electron-deficient nitrogen-containing $C_1$-$C_{60}$ cyclic group, etc.), ii) a material including a $C_8$-$C_{60}$ polycyclic group including at least two cyclic groups condensed to each other while sharing boron (B), and/or iii) the like.

Non-limiting examples of the delayed fluorescence material may include at least one selected from Compounds DF1 to DF14:
DF1
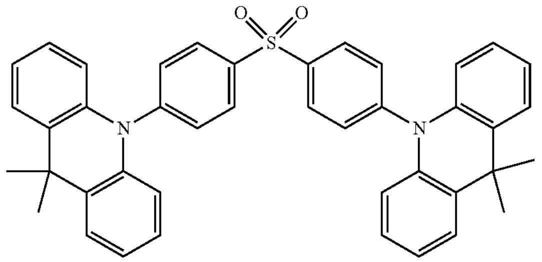
(DMAC-DPS)
DF2
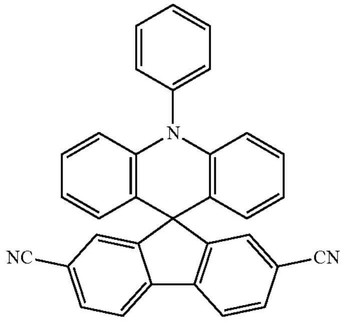
(ACRFLCN)
DF3
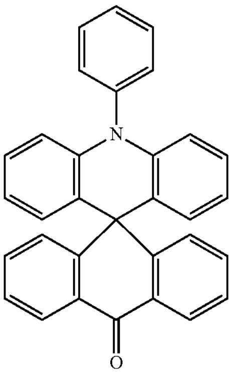
(ACRSA)
-continued
DF4
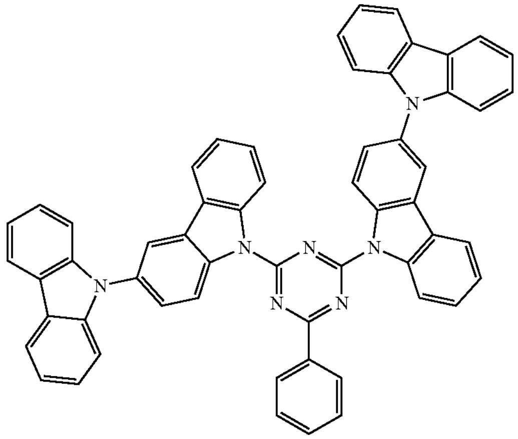
(CC2TA)
DF5
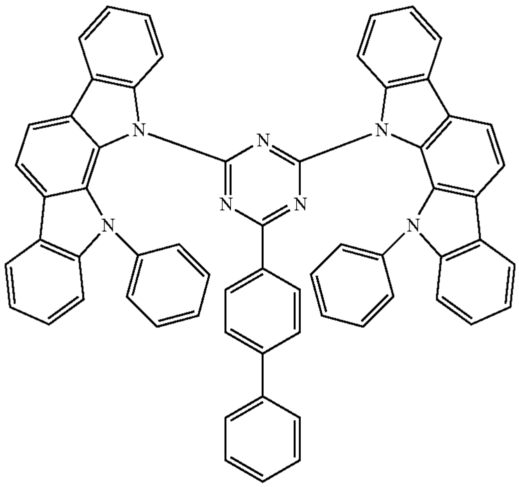
(PiC-TRZ)
DF6
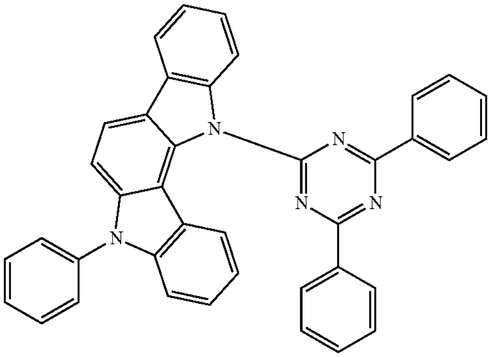
(PiC-TRZ2)

-continued

DF7

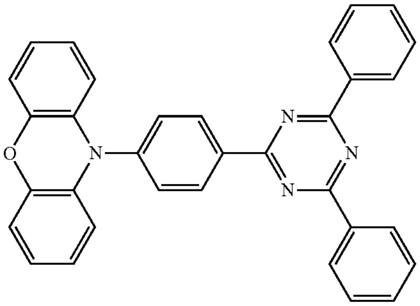

(PXZ-TRZ)

DF8

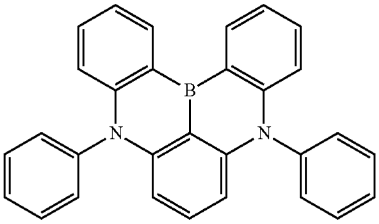

(DABNA-1)

DF9

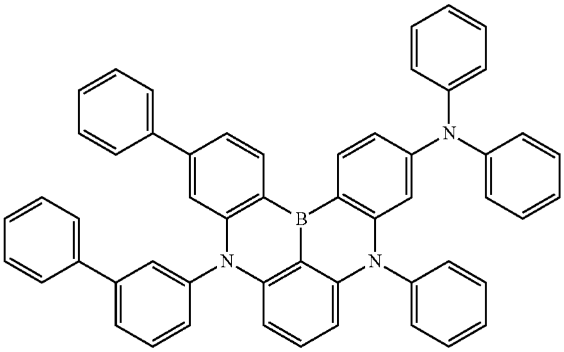

(DABNA-2)

DF10

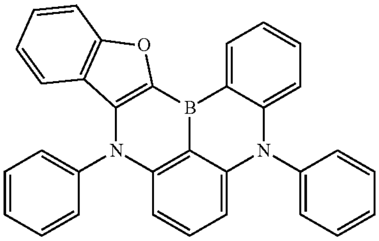

DF11

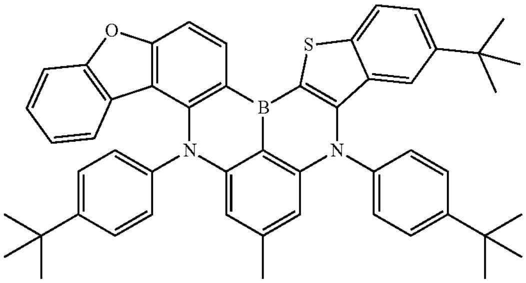

-continued

DF12

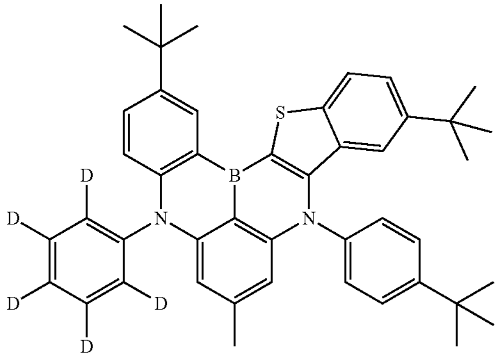

DF13

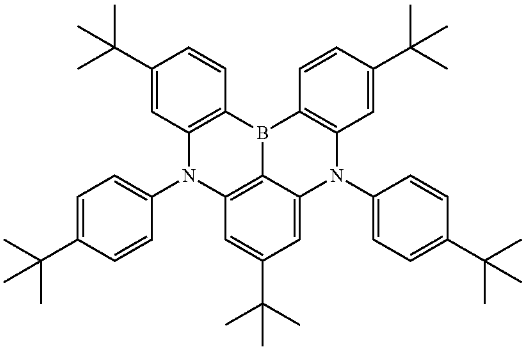

DF14

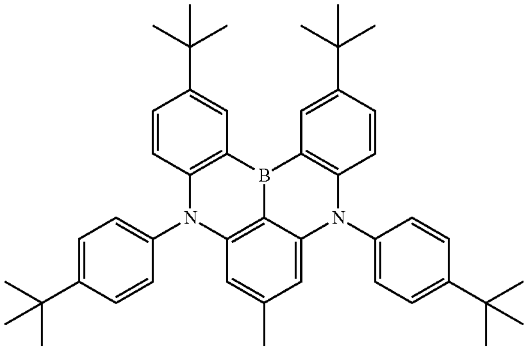

Quantum Dot

In one or more embodiments, the emission layer 130 may include a quantum dot.

The term "quantum dot" as utilized herein refers to a crystal of a semiconductor compound, and may include any material capable of emitting light of one or more suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material of a quantum dot with an organic solvent and then growing quantum dot particle crystals. When the crystal grows, the organic solvent naturally acts as a dispersant coordinated on the surface of the quantum dot crystal and controls the growth of the crystal so that the growth of quantum dot particles can be controlled or selected through a process which costs lower, and is easier than vapor deposition methods, such as metal organic chemical vapor deposition (MOCVD) or molecular beam epitaxy (MBE).

The quantum dot may include: a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Non-limiting examples of the Group II-VI semiconductor compound may be: a binary compound, such as CdS, CdSe, CdTe, ZnS, ZnSe, ZnTe, ZnO, HgS, HgSe, HgTe, MgSe, MgS, and/or the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and/or the like; a quaternary compound, such as CdZnSeS, CdZnSeTe, CdZnSTe, CdHgSeS, CdHgSeTe, CdHgSTe, HgZnSeS, HgZnSeTe, HgZnSTe, and/or the like; or any combination thereof.

Non-limiting examples of the Group III-V semiconductor compound may be: a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GalnNP, GalnNAs, GalnNSb, GalnPAs, GalnPSb, InAlNP, InAlNAs, InAlNSb, InAlPAs, InAlPSb, and/or the like; or any combination thereof. In some embodiments, the Group III-V semiconductor compound may further include a Group II element. Non-limiting examples of the Group III-V semiconductor compound further including the Group II element may be InZnP, InGaZnP, InAlZnP, and/or the like.

Non-limiting examples of the Group III-VI semiconductor compound may be: a binary compound, such as GaS, GaSe, $Ga_2Se_3$, GaTe, InS, InSe, $In_2S_3$, $In_2Se_3$, InTe, and/or the like; a ternary compound, such as $InGaS_3$, $InGaSe_3$, and/or the like; or any combination thereof.

Non-limiting examples of the Group I—III-VI semiconductor compound may be: a ternary compound, such as AgInS, $AgInS_2$, CuInS, $CuInS_2$, $CuGaO_2$, $AgGaO_2$, $AgAlO_2$, and/or the like; a quaternary compound, such as AgInGaS, $AgInGaS_2$, and/or the like; or any combination thereof.

Non-limiting examples of the Group IV-VI semiconductor compound may be: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

Non-limiting examples of the Group IV element or compound may be: a single element, such as Si, Ge, and/or the like; a binary compound, such as SiC, SiGe, and/or the like; or any combination thereof.

Each element included in a multi-element compound, such as the binary compound, the ternary compound, and the quaternary compound, may be present at a substantially uniform concentration or non-substantially uniform concentration in a particle.

In one or more embodiments, the quantum dot may have a single structure in which the concentration of each element in the quantum dot is substantially uniform, or may have a core-shell dual structure. For example, a material included in the core and a material included in the shell may be different from each other.

The shell of the quantum dot may act as a protective layer which prevents chemical denaturation of the core to maintain semiconductor characteristics, and/or as a charging layer which imparts electrophoretic characteristics to the quantum dot. The shell may be a single layer or a multilayer. The interface between the core and the shell may have a concentration gradient in which the concentration of an element existing in the shell decreases toward the center of the core.

Non-limiting examples of the shell of the quantum dot may be an oxide of metal, metalloid, or non-metal, a semiconductor compound, or a combination thereof. Non-limiting examples of the oxide of metal, metalloid, or non-metal may be: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and/or the like; a ternary compound, such as $MgAl_2O_4$, $CoFe_2O_4$, $NiFe_2O_4$, $CoMn_2O_4$, and/or the like; or any combination thereof. Non-limiting examples of the semiconductor compound may be: as described herein, a Group II-VI semiconductor compound; a Group III-V semiconductor compound; a Group III-VI semiconductor compound; a Group I—III-VI semiconductor compound; a Group IV-VI semiconductor compound; or any combination thereof. Non-limiting examples of the semiconductor compound suitable for the shell may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width at half maximum (FWHM) of the emission spectrum of less than or equal to about 45 nm, less than or equal to about 40 nm, or for example, less than or equal to about 30 nm. When the FWHM of the quantum dot is within these ranges, the quantum dot may have improved color purity or improved color reproducibility. In some embodiments, because light emitted through the quantum dot is emitted in all directions, the wide viewing angle may be improved.

In some embodiments, the quantum dot may be in the form of substantially spherical, pyramidal, multi-arm, or cubic nanoparticles, nanotubes, nanowires, nanofibers, or nanoplate particles.

Because the energy band gap may be adjusted by controlling the size of the quantum dot, light having one or more suitable wavelength bands may be obtained from a quantum dot emission layer. Accordingly, by utilizing quantum dots of different sizes, a light-emitting device that emits light of one or more suitable wavelengths may be implemented. In one or more embodiments, the size of the quantum dot may be selected to emit red light, green light, and/or blue light. In some embodiments, the size of the quantum dot may be configured to emit white light by combination of light of one or more suitable colors.

Electron Transport Region 140 in Interlayer

The electron transport region 140 may have i) a single-layer structure including (e.g., consisting of) a single layer including (e.g., consisting of) a single material, ii) a single-layer structure including (e.g., consisting of) a single layer including multiple different materials, or iii) a multi-layer structure including multiple layers including multiple different materials.

The electron transport region 140 may include a buffer layer, a hole blocking layer, an electron control layer, an electron transport layer, an electron injection layer, or any combination thereof.

For example, in one or more embodiments, the electron transport region 140 may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein constituent layers of each structure are sequentially stacked from the emission layer 130 in each stated order.

In one or more embodiments, the electron transport region 140 (for example, the buffer layer, the hole blocking layer, the electron control layer, or the electron transport layer in the electron transport region 140) may include a metal-free compound including at least one π electron-deficient nitrogen-containing $C_1$-$C_{60}$ cyclic group.

For example, in some embodiments, the electron transport region 140 may include a compound represented by Formula 601:

$$[Ar_{601}]_{xe11}-[(L_{601})_{xe1}-R_{601}]_{xe21}. \qquad \text{Formula 601}$$

In Formula 601

$Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be the same as defined with respect to $Q_1$, xe21 may be 1, 2, 3, 4, or 5, and at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked to each other via a single bond.

In one or more embodiments, $Ar_{601}$ in Formula 601 may be an anthracene group unsubstituted or substituted with at least one $R_{10a}$.

In one or more embodiments, the electron transport region 140 may include a compound represented by Formula 601-1:

Formula 601-1

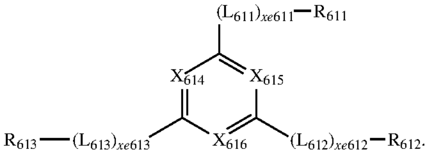

In Formula 601-1, $X_{614}$ may be N or $C(R_{614})$, $X_{615}$ may be N or $C(R_{615})$, $X_{616}$ may be N or $C(R_{616})$, and at least one selected from among $X_{614}$ to $X_{616}$ may be N, $L_{611}$ to $L_{613}$ may each independently be the same as defined with respect to $L_{601}$, Xe611 to xe613 may each independently be the same as defined with respect to xe1, $R_{611}$ to $R_{613}$ may each independently be the same as defined with respect to $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in some embodiments, xe1 and xe611 to xe613 in Formulae 601 and 601-1 may each independently be 0, 1, or 2.

In one or more embodiments, the electron transport region 140 may include: at least one of Compounds ET1 to ET45; 2,9-dimethyl-4,7-diphenyl-1,10-phenanthroline (BCP); 4,7-diphenyl-1,10-phenanthroline (Bphen); tris(8-hydroxyquinolinato)aluminum ($Alq_3$); bis(2-methyl-8-quinolinolato-N1,O8)-(1,1'-biphenyl-4-olato)aluminum (BAlq); 3-(4-biphenyl)-4-phenyl-5-tert-butylphenyl-1,2,4-triazole (TAZ); 4-(naphthalen-1-yl)-3,5-diphenyl-4H-1,2,4-triazole (NTAZ); and/or any combination thereof:

ET1

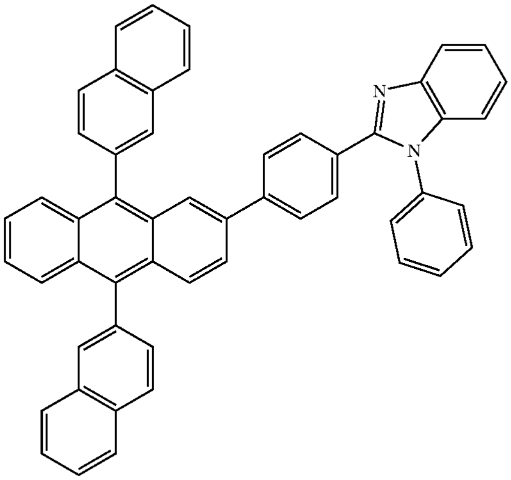

-continued
ET2
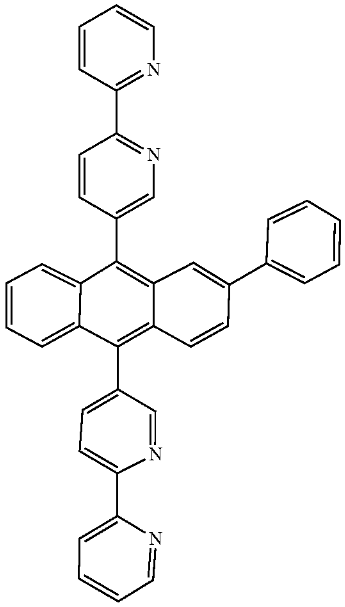
ET3
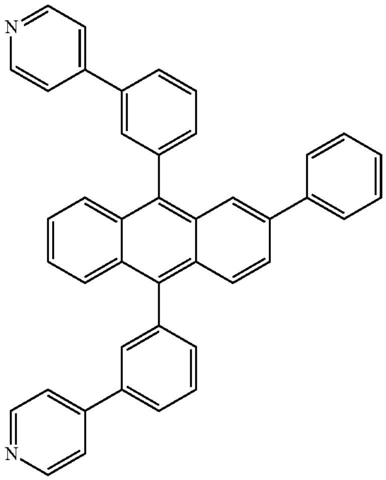
ET4
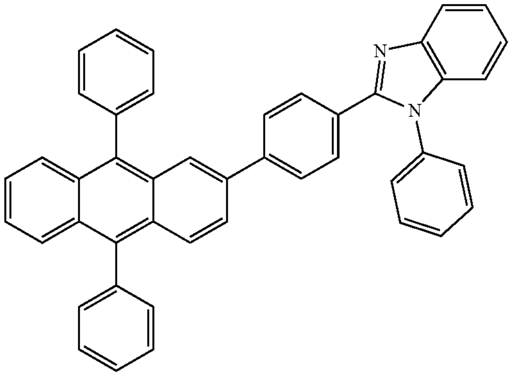
-continued
ET5
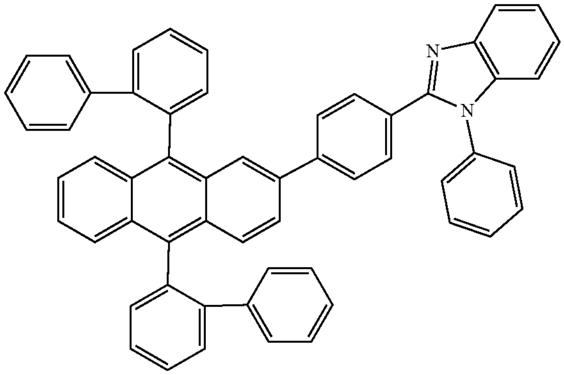
ET6
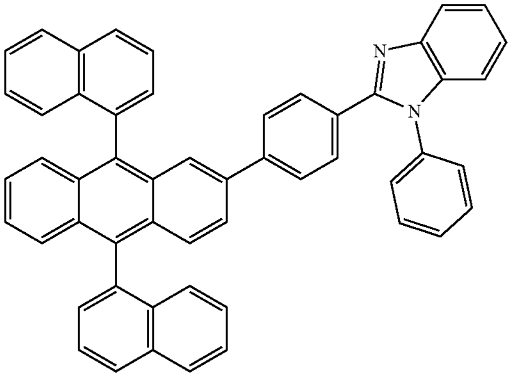
ET7
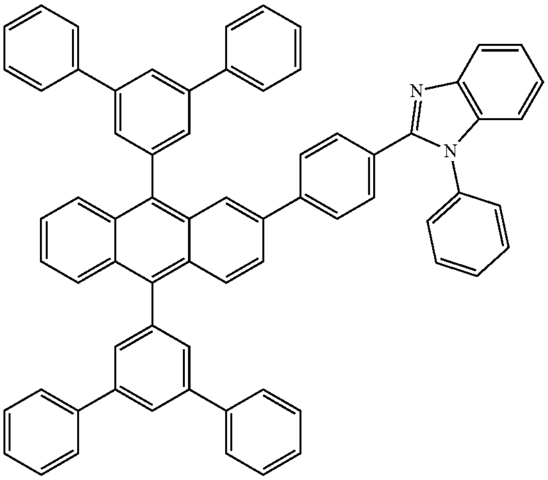

-continued
ET8
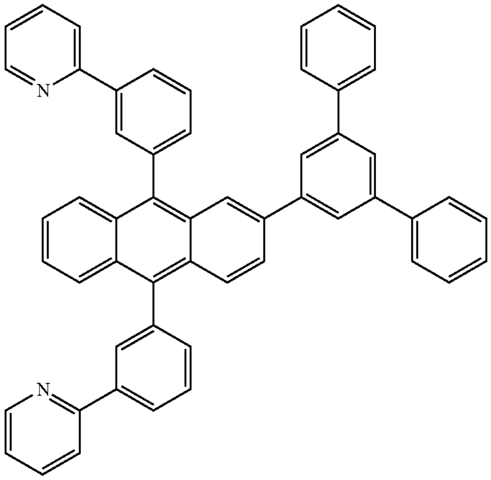
ET9
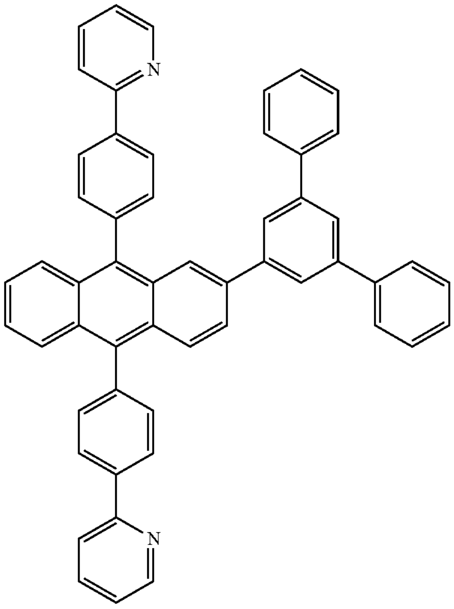
-continued
ET10
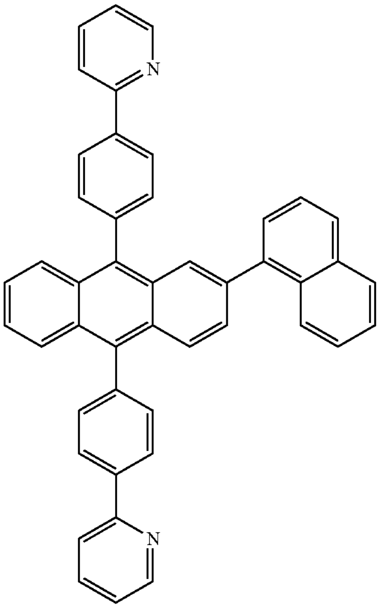
ET11
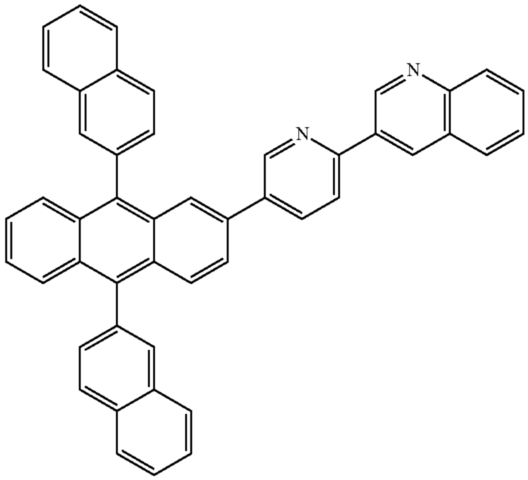
ET12
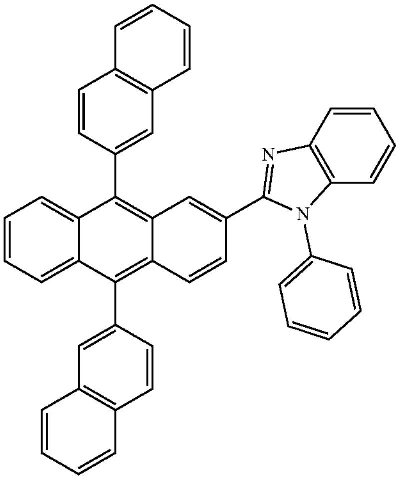

-continued
ET13
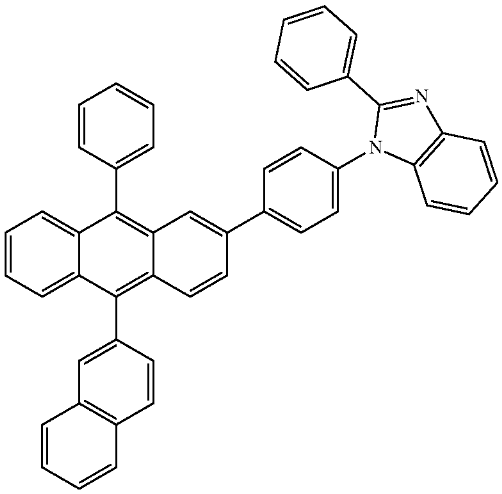
ET14
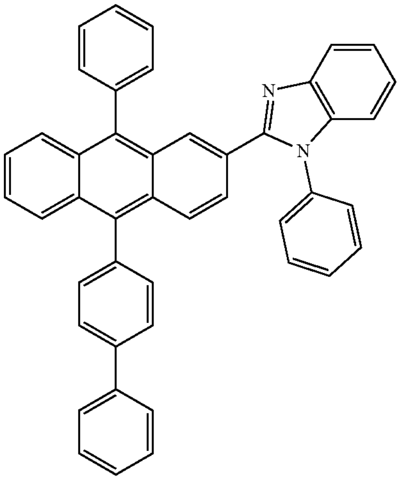
ET15
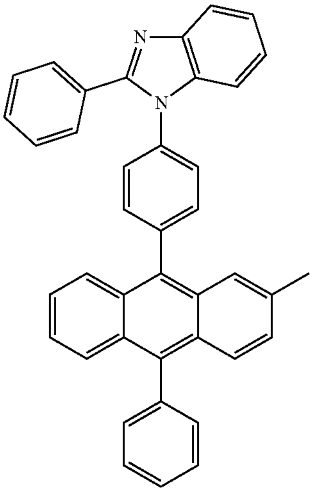
-continued
ET16
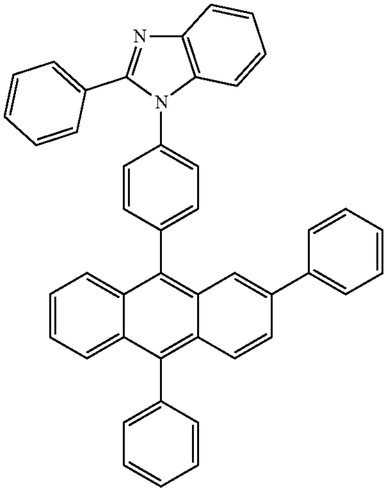
ET17
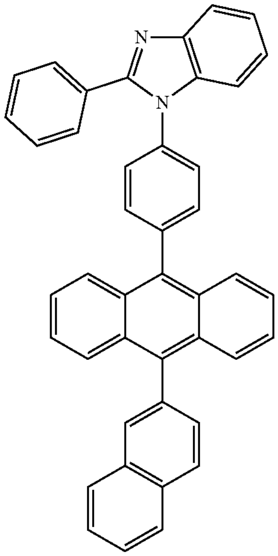
ET18
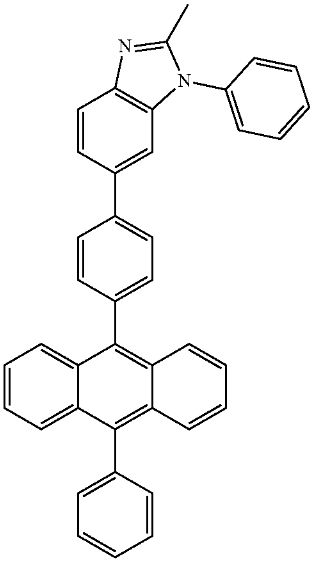

-continued
ET19
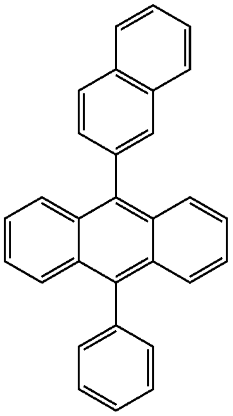
ET20
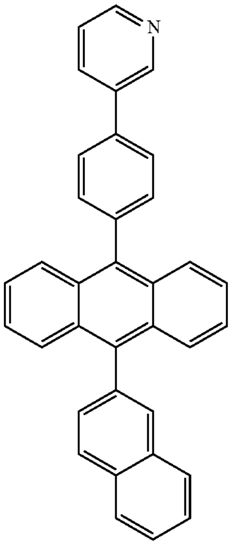
ET21
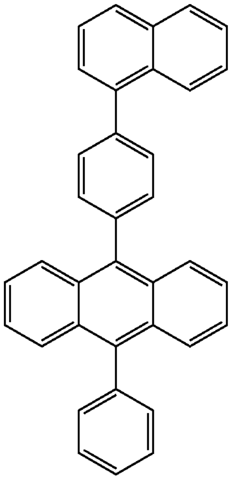
-continued
ET22
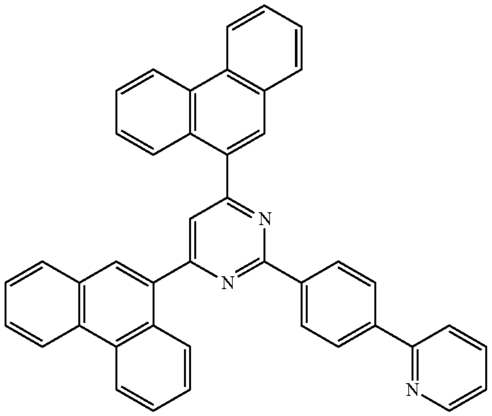
ET23
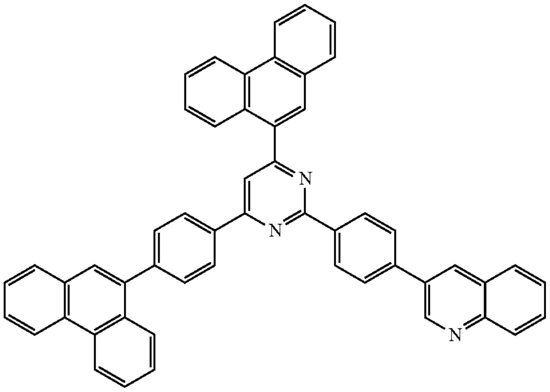
ET24
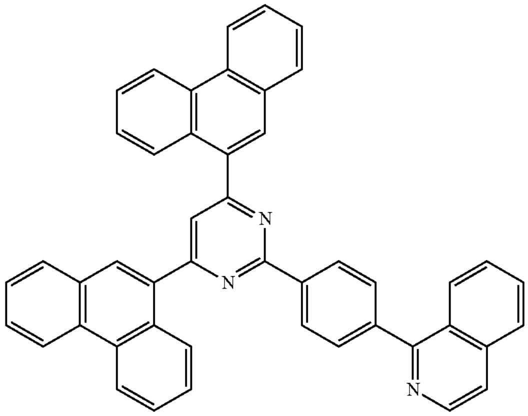

-continued
ET25
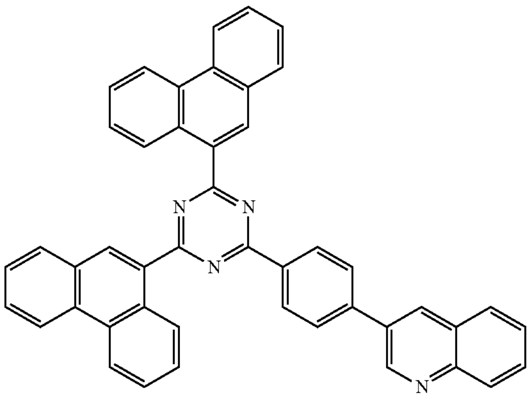
ET26
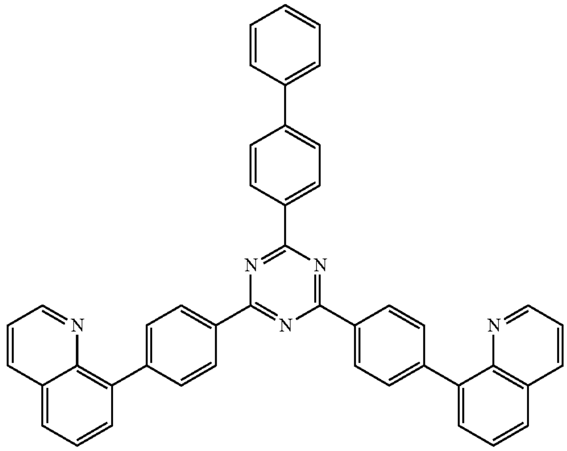
ET27
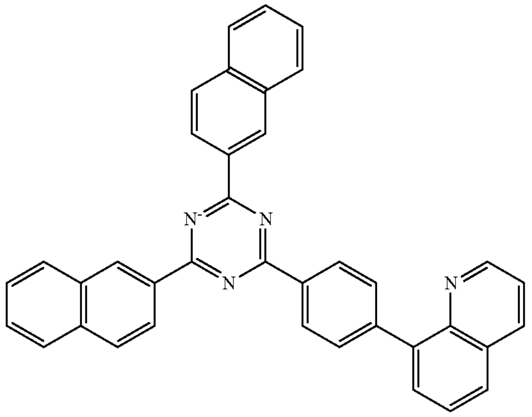
-continued
ET28
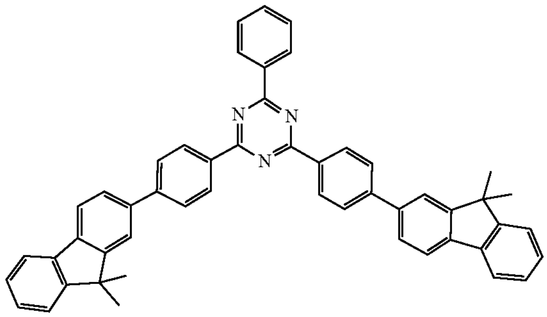
ET29
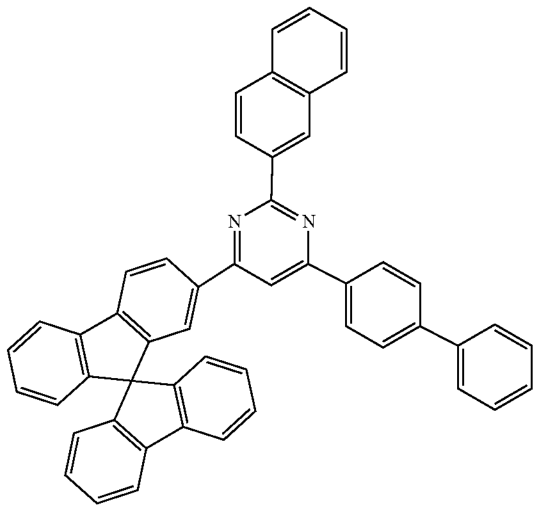
ET30
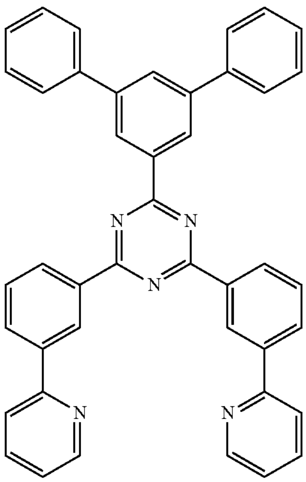

-continued
ET31
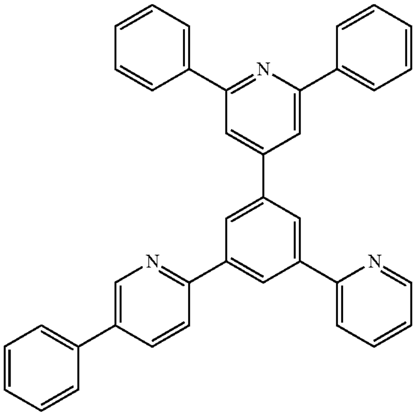
ET32
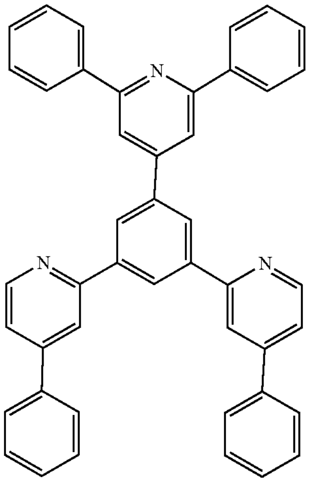
ET33
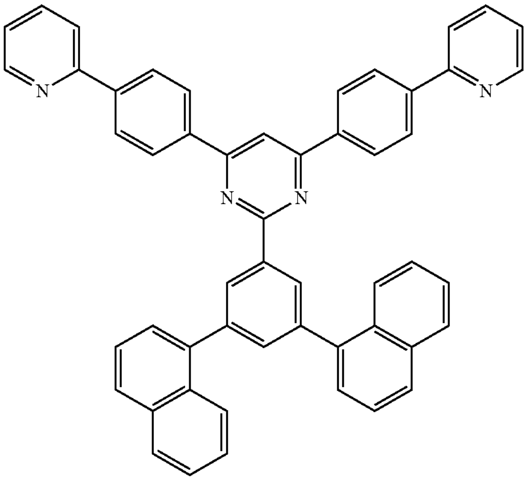
-continued
ET34
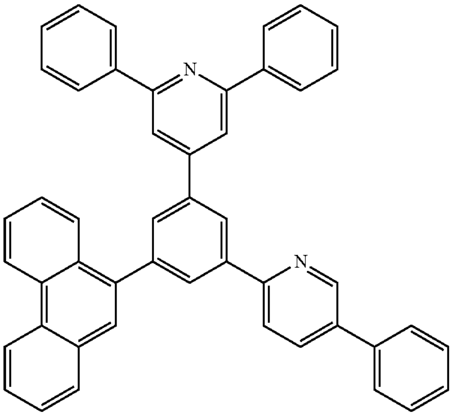
ET35
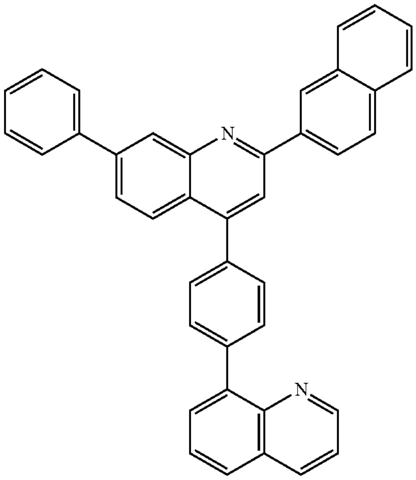
ET36
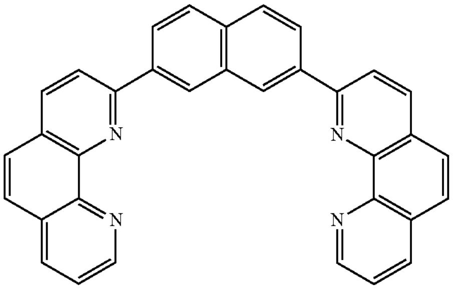
ET37
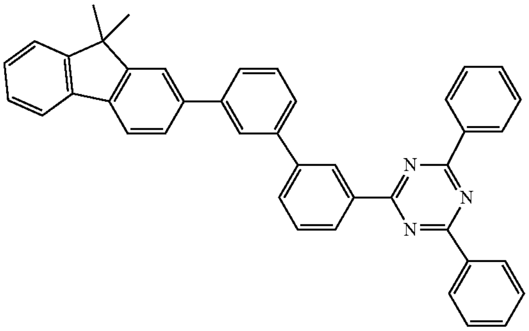

-continued
ET38
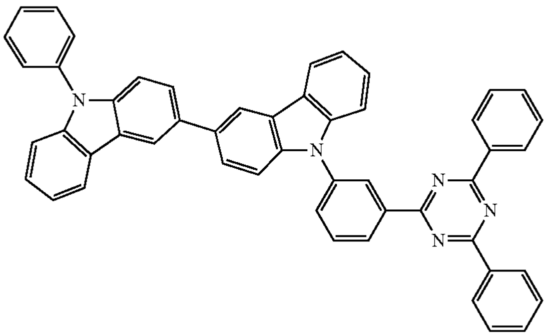
ET39
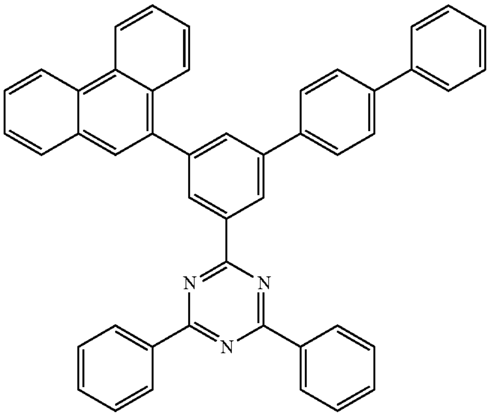
ET40
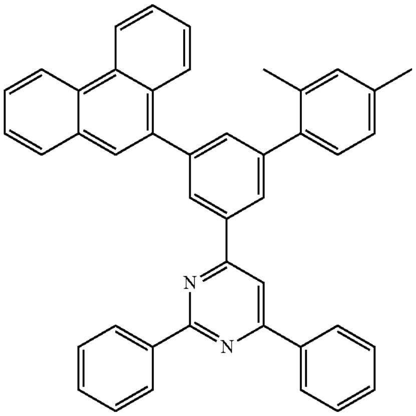
ET41
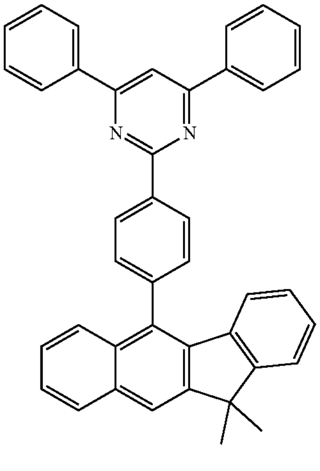
-continued
ET42
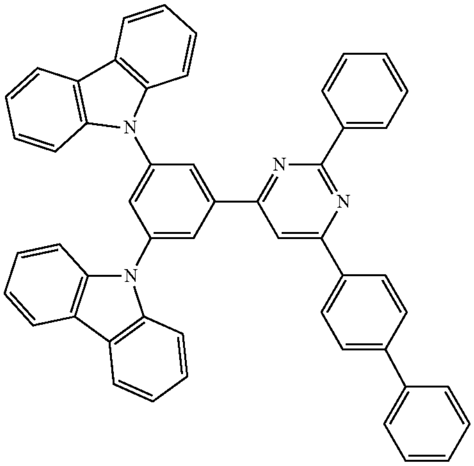
ET43
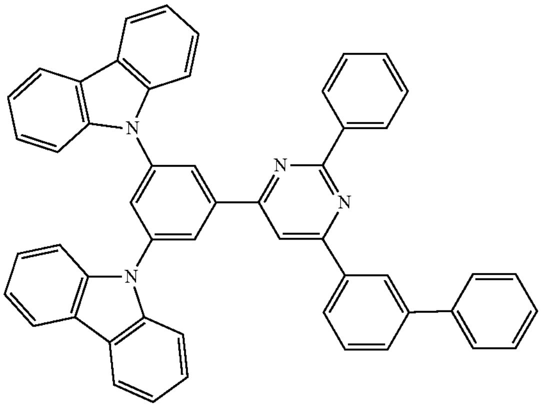
ET44
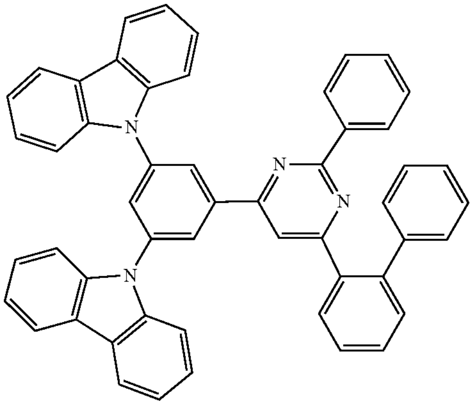
ET45
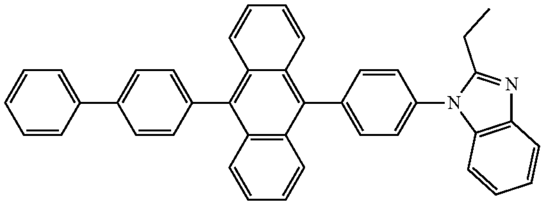

-continued

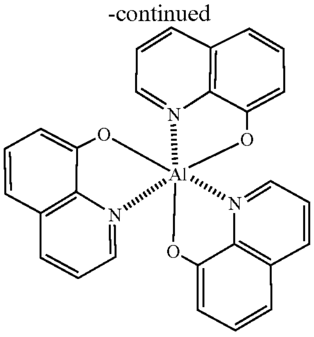

Alq3

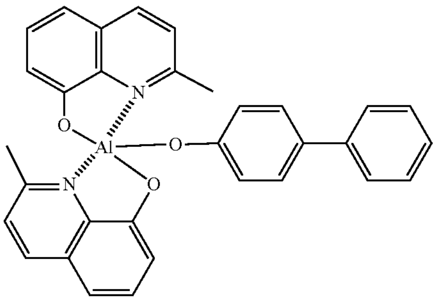

BAlq

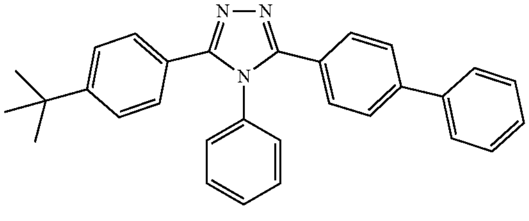

TAZ

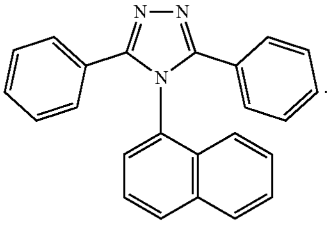

NTAZ

A thickness of the electron transport region 140 may be in a range of about 100 Å to about 5,000 Å, for example, about 160 Å to about 4,000 Å. When the electron transport region 140 includes a buffer layer, a hole blocking layer, an electron control layer, an electron transport layer, or any combination thereof, a thickness of the buffer layer, the hole blocking layer, or the electron control layer may be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thicknesses of the buffer layer, the hole blocking layer, the electron control layer, the electron transport layer, and/or the electron transport region 140 are within the ranges described above, satisfactory electron transporting characteristics may be obtained without a substantial increase in driving voltage.

In one or more embodiments, the electron transport region 140 (for example, the electron transport layer in the electron transport region 140) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, in some embodiments, the metal-containing material may include a $L_1$ complex. The $L_1$ complex may include, for example, Compound ET-D1 (LiQ) or ET-D2:

ET-D1

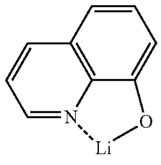

ET-D2

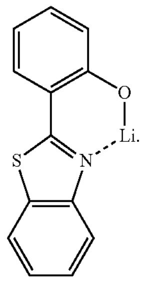

In one or more embodiments, the electron transport region 140 may include an electron injection layer that facilitates the injection of electrons from the second electrode 150. The electron injection layer may directly contact the second electrode 150.

The electron injection layer may have i) a single-layer structure including (e.g., consisting of) a single layer including (e.g., consisting of) a single material, ii) a single-layer structure including (e.g., consisting of) a single layer including multiple different materials, or iii) a multi-layer structure including multiple layers including multiple different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, iodides, etc.), or tellurides of the alkali metal, the alkaline earth metal, and the rare earth metal, respectively, or any combination thereof.

The alkali metal-containing compound may include: an alkali metal oxide, such as $Li_2O$, $Cs_2O$, $K_2O$, and/or the like; an alkali metal halide, such as LiF, NaF, CsF, KF, LiI, NaI, CsI, KI, and/or the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Non-limiting examples of the lanthanide metal telluride may be LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and/or the like.

The alkali metal complex, the alkaline earth-metal complex, and the rare earth metal complex may include i) one of metal ions of the alkali metal, one of metal ions of the alkaline earth metal, and one of metal ions of the rare earth metal, respectively, and ii) a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

In one or more embodiments, the electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, alkali metal halide), or ii) a) an alkali metal-containing compound (for example, alkali metal halide); and b) an alkali metal, an alkaline earth metal, a rare earth metal, or any combination thereof. For example, in some embodiments, the electron injection layer may be a KI:Yb co-deposited layer, an RbI:Yb co-deposited layer, a LiF:Yb co-deposited layer, and/or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be substantially uniformly or non-uniformly dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 150

The second electrode 150 may be on the interlayer described above. In one or more embodiments, the second electrode 150 may be a cathode, which is an electron injection electrode, and as a material for forming the second electrode 150, a metal, an alloy, an electrically conductive compound, or any combination thereof, each having a low-work function, may be utilized.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layer structure or a multi-layer structure including multiple layers.

Capping Layer

A first capping layer may be arranged outside (e.g., on) the first electrode 110, and/or a second capping layer may be arranged outside (e.g., on) the second electrode 150. In one or more embodiments, the light-emitting device 10 may have a structure in which the first capping layer, the first electrode 110, the interlayer, and the second electrode 150 are sequentially stacked in the stated order, a structure in which the first electrode 110, the interlayer, the second electrode 150, and the second capping layer are sequentially stacked in the stated order, or a structure in which the first capping layer, the first electrode 110, the interlayer, the second electrode 150, and the second capping layer are sequentially stacked in the stated order.

In some embodiments, light generated in the emission layer 130 in the interlayer of the light-emitting device 10 may be extracted toward the outside through the first electrode 110, which is a semi-transmissive electrode or a transmissive electrode, and the first capping layer. In some embodiments, light generated in the emission layer 130 in the interlayer of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 may be increased, so that the luminescence efficiency of the light-emitting device 10 may be improved.

Each of the first capping layer and the second capping layer may include a material having a refractive index of greater than or equal to about 1.6 (e.g., at 470 nm).

The first capping layer and the second capping layer may each independently be an organic capping layer including an organic material, an inorganic capping layer including an inorganic material, or an organic-inorganic composite capping layer including an organic material and an inorganic material.

At least one selected from among the first capping layer and the second capping layer may (e.g., the first capping layer and the second capping layer may each) independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof. In one or more embodiments, at least one selected from the first capping layer and the second capping layer may (e.g., the first capping layer and the second capping layer may each) independently include an amine group-containing compound.

In one or more embodiments, at least one selected from the first capping layer and the second capping layer may (e.g., the first capping layer and the second capping layer may each) independently include a compound represented by Formula 201, a compound represented by Formula 202, or any combination thereof.

In one or more embodiments, at least one selected from the first capping layer and the second capping layer may (e.g., the first capping layer and the second capping layer may each) independently include: at least one selected from Compounds HT28 to HT33; Compounds CP1 to CP6; β-NPB; and/or any combination thereof:

CP1

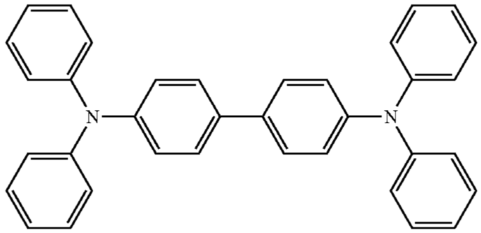

CP2

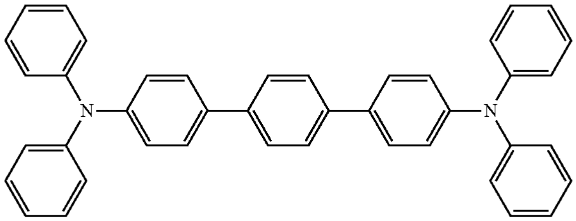

CP3

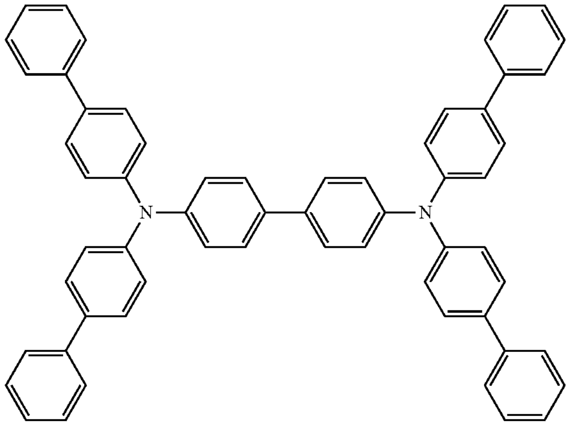

-continued

CP4

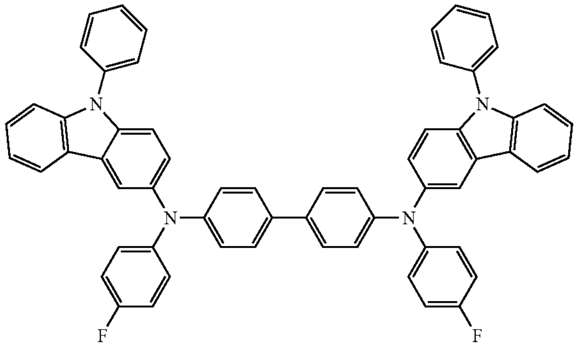

CP5

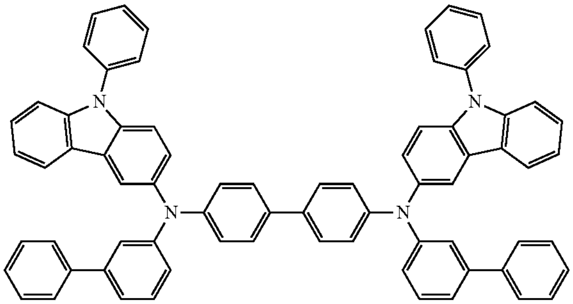

CP6

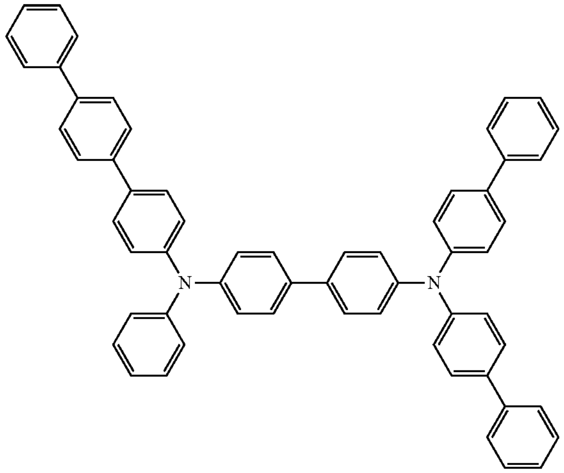

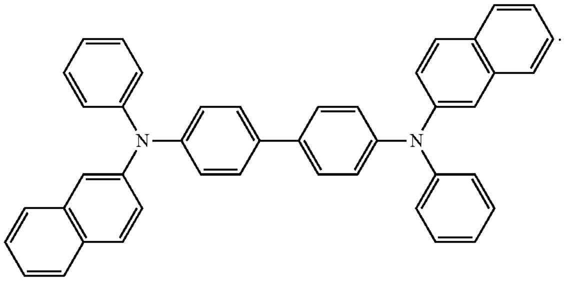

β-NPB

Film

The organic compound represented by Formula 1 may be included in one or more suitable films. Accordingly, one or more aspects of embodiments of the present disclosure are directed toward a film including the organic compound represented by Formula 1. The film may be, for example, an optical member (or a light control member) (for example, a color filter, a color conversion member, a capping layer, a light extraction efficiency enhancement layer, a selective light absorbing layer, a polarizing layer, a quantum dot-containing layer, etc.), a light blocking member (for example, a light reflective layer, a light absorbing layer, etc.), a protective member (for example, an insulating layer, a dielectric layer, etc.), and/or the like.

Electronic Apparatus

The light-emitting device may be included in one or more suitable electronic apparatuses. For example, in one or more embodiments, the electronic apparatus including the light-emitting device may be a display apparatus, an authentication apparatus, and/or the like.

In one or more embodiments, the electronic apparatus (for example, a display apparatus) may further include, in addition to the light-emitting device, i) a color filter, ii) a color conversion layer, or iii) a color filter and a color conversion layer. The color filter and/or the color conversion layer may be arranged in at least one travel direction of light emitted from the light-emitting device. For example, in some embodiments, the light emitted from the light-emitting device may be blue light or white light (e.g., combined white light). Details of the light-emitting device may be as described herein. In one or more embodiments, the color conversion layer may include a quantum dot. The quantum dot may be, for example, the quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel defining layer may be arranged among the subpixel areas to define each of the subpixel areas.

The color filter may further include a plurality of color filter areas and light-shielding patterns arranged among the color filter areas, and the color conversion layer may further include a plurality of color conversion areas and light-shielding patterns arranged among the color conversion areas.

The plurality of color filter areas (or the plurality of color conversion areas) may include a first area to emit first color light, a second area to emit second color light, and/or a third area to emit third color light, wherein the first color light, the second color light, and/or the third color light may have different maximum emission wavelengths. For example, in some embodiments, the first color light may be red light, the second color light may be green light, and the third color light may be blue light. For example, in one or more embodiments, the plurality of color filter areas (or the plurality of color conversion areas) may include quantum dots. In some embodiments, the first area may include a red quantum dot to emit red light, the second area may include a green quantum dot to emit green light, and the third area may not include (e.g., may exclude) a (e.g., any) quantum dot. Details of the quantum dot may be as described herein. The first area, the second area, and/or the third area may each further include a scatter.

For example, in one or more embodiments, the light-emitting device may be to emit first light, the first area may be to absorb the first light to emit first-first color light, the second area may be to absorb the first light to emit second-first color light, and the third area may be to absorb the first light to emit third-first color light. In this regard, the first-first color light, the second-first color light, and the third-first color light may have different maximum emission wavelengths. In some embodiments, the first light may be blue light, the first-first color light may be red light, the second-first color light may be green light, and the third-first color light may be blue light.

In one or more embodiments, the electronic apparatus may further include a thin-film transistor, in addition to the light-emitting device described above. The thin-film transistor may include a source electrode, a drain electrode, and an activation layer, wherein one selected from the source electrode and the drain electrode may be electrically connected to the first electrode or the second electrode of the light-emitting device.

The thin-film transistor may further include a gate electrode, a gate insulating film, and/or the like.

The activation layer may include crystalline silicon, amorphous silicon, an organic semiconductor, an oxide semiconductor, and/or the like.

In one or more embodiments, the electronic apparatus may further include a sealing portion for sealing the light-emitting device. The sealing portion may be arranged between the color filter and/or the color conversion layer and the light-emitting device. The sealing portion allows light from the light-emitting device to be extracted to the outside, and concurrently (e.g., simultaneously) prevents ambient air and moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin-film encapsulation layer, the electronic apparatus may be flexible.

Various functional layers may be additionally arranged on the sealing portion, in addition to the color filter and/or the color conversion layer, according to the utilization of the electronic apparatus. Non-limiting examples of the functional layers may include a touch screen layer, a polarizing layer, and/or the like. The touch screen layer may be a pressure-sensitive touch screen layer, a capacitive touch screen layer, or an infrared touch screen layer.

The authentication apparatus may be, for example, a biometric authentication apparatus that authenticates an individual by utilizing biometric information of a living body (for example, fingertips, pupils, etc.). The authentication apparatus may further include, in addition to the light-emitting device as described above, a biometric information collector.

The electronic apparatus may be applied to one or more of displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, one or more suitable measuring instruments, meters (for example, meters for a vehicle, an aircraft, and a vessel), projectors, and/or the like.

Electronic Equipment

The light-emitting device may be included in one or more suitable electronic equipment.

For example, the electronic equipment including the light-emitting device may be at least one of a flat panel display, a curved display, a computer monitor, a medical monitor, a television, a billboard, a light for indoor or outdoor lighting and/or signaling, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro display, a 3D display, a virtual or augmented reality display, a vehicle, a video wall including multiple displays tiled together, a theater or stadium screen, a phototherapy device, or a signboard.

The light-emitting device may have excellent or suitable luminescence efficiency and long lifespan, and thus, the electronic equipment including the light-emitting device may have characteristics such as high luminance, high resolution, and low power consumption.

Figure 2:
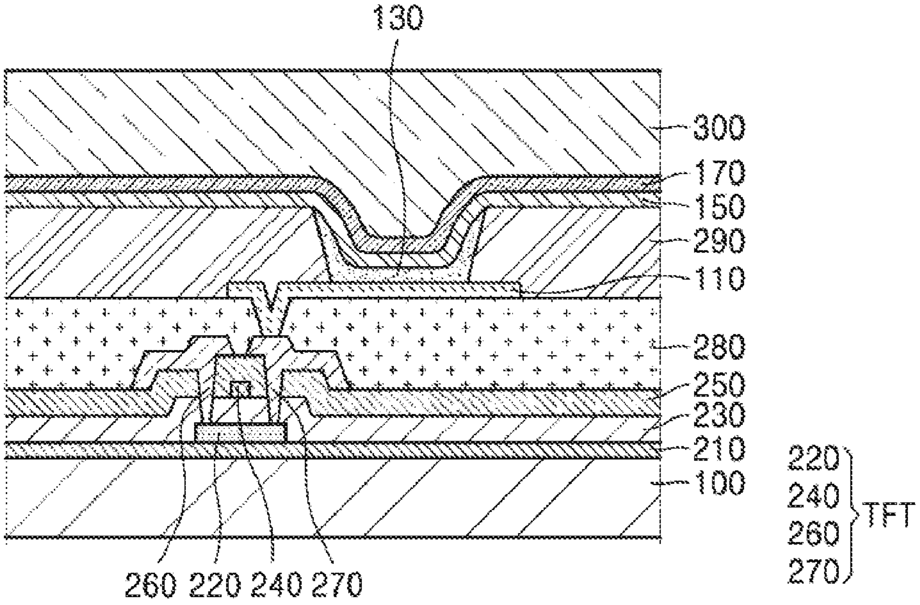
FIG. 2 is a schematic view of an electronic apparatus according to one or more embodiments of the present disclosure.
Figure 3:
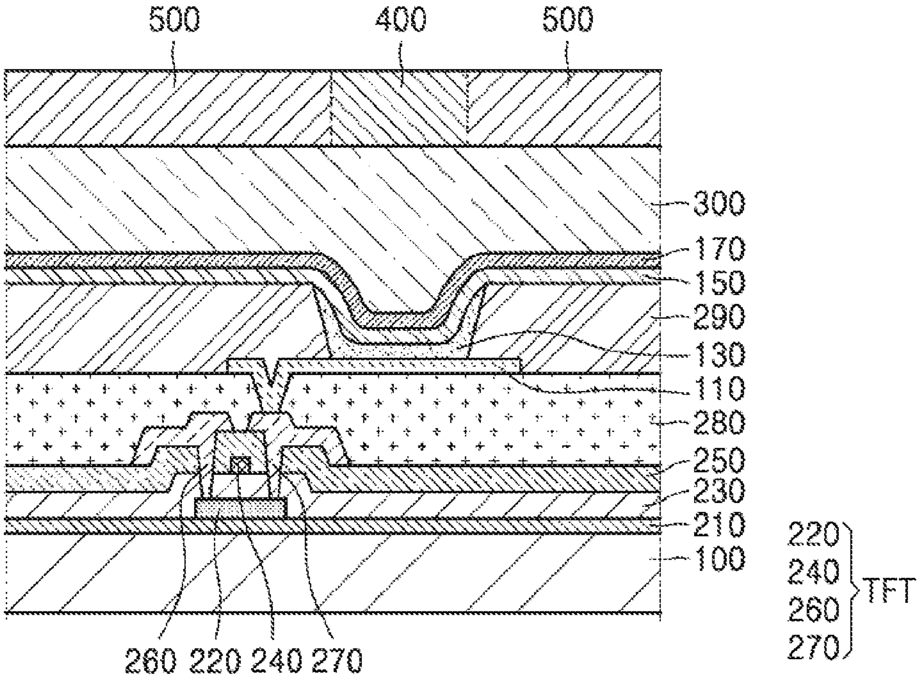
FIG. 3 is a schematic view of an electronic apparatus according to one or more embodiments of the present disclosure.

Description of FIGS. 2 and 3

FIG. 2 is a cross-sectional view of an electronic apparatus according to one or more embodiments of the present disclosure.

The electronic apparatus of FIG. 2 includes a substrate 100, a thin-film transistor TFT, a light-emitting device, and an encapsulation portion 300 that seals the light-emitting device.

The substrate 100 may be a flexible substrate, a glass substrate, or a metal substrate. A buffer layer 210 may be on the substrate 100. The buffer layer 210 may prevent or reduce penetration of impurities through the substrate 100 and may provide a flat surface on the substrate 100.

The thin-film transistor TFT may be on the buffer layer 210. The thin-film transistor TFT may include an activation layer 220, a gate electrode 240, a source electrode 260, and a drain electrode 270.

The activation layer 220 may include an inorganic semiconductor such as silicon or polysilicon, an organic semiconductor, or an oxide semiconductor, and may include a source region, a drain region, and a channel region.

A gate insulating film 230 for insulating the activation layer 220 from the gate electrode 240 may be on the activation layer 220, and the gate electrode 240 may be on the gate insulating film 230.

An interlayer insulating film 250 may be on the gate electrode 240. The interlayer insulating film 250 may be arranged between the gate electrode 240 and the source electrode 260 and between the gate electrode 240 and the drain electrode 270, to insulate from one another.

The source electrode 260 and the drain electrode 270 may be on the interlayer insulating film 250. The interlayer insulating film 250 and the gate insulating film 230 may be formed to expose the source region and the drain region of the activation layer 220, and the source electrode 260 and the drain electrode 270 may be arranged in contact with the exposed portions of the source region and the drain region of the activation layer 220, respectively.

The thin-film transistor TFT may be electrically connected to the light-emitting device to drive the light-emitting device, and may be covered and protected by a passivation layer 280. The passivation layer 280 may include an inorganic insulating film, an organic insulating film, or any combination thereof. The light-emitting device may be provided on the passivation layer 280. The light-emitting device may include a first electrode 110, an interlayer, and a second electrode 150.

The first electrode 110 may be on the passivation layer 280. The passivation layer 280 may be arranged to expose a portion of the drain electrode 270, not fully covering the drain electrode 270, and the first electrode 110 may be arranged to be connected to the exposed portion of the drain electrode 270.

A pixel defining layer 290 including an insulating material may be on the first electrode 110. The pixel defining layer 290 may expose a certain region of the first electrode 110, and the interlayer may be formed in the exposed region of the first electrode 110. The pixel defining layer 290 may be a polyimide-based organic film or a polyacrylic-based organic film. In some embodiments, at least some layers of the interlayer may extend beyond the upper portion of the pixel defining layer 290 to be arranged in the form of a common layer.

The second electrode 150 may be on the interlayer, and a capping layer 170 may be additionally formed on the second electrode 150. The capping layer 170 may be formed to cover the second electrode 150.

The encapsulation portion 300 may be on the capping layer 170. The encapsulation portion 300 may be arranged on the light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, etc.), an epoxy-based resin (for example, aliphatic glycidyl ether (AGE), etc.), or any combination thereof; or a combination of the inorganic film and the organic film.

FIG. 3 is a cross-sectional view of an electronic apparatus according to one or more embodiments of the present disclosure.

The electronic apparatus of FIG. 3 is substantially the same as the electronic apparatus of FIG. 2, except that a light-shielding pattern 500 and a functional region 400 are additionally arranged on the encapsulation portion 300. The functional region 400 may be i) a color filter area, ii) a color conversion area, or iii) a combination of the color filter area and the color conversion area. In one or more embodiments, the light-emitting device included in the electronic apparatus of FIG. 3 may be a tandem light-emitting device.

Figure 4:
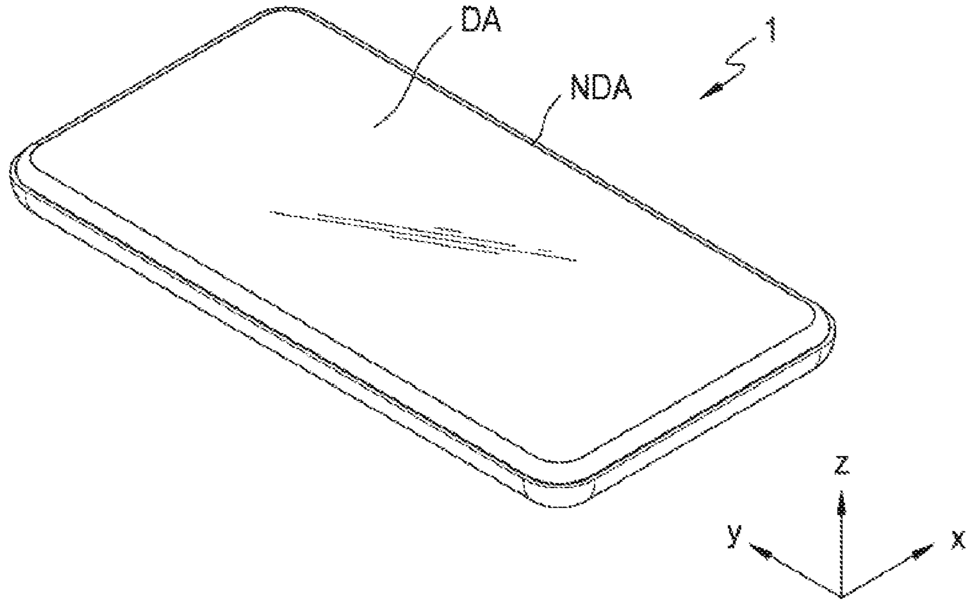
FIG. 4 is a schematic perspective view of electronic equipment including a light-emitting device according to one or more embodiments of the present disclosure.

Description of FIG. 4

FIG. 4 is a schematic perspective view of electronic equipment 1 including a light-emitting device according to one or more embodiments. The electronic equipment 1 may be, as an apparatus that displays a moving image or still image, portable electronic equipment, such as a mobile phone, a smart phone, a tablet personal computer (PC), a mobile communication terminal, an electronic notebook, an electronic book, a portable multimedia player (PMP), a navigation, or a ultra mobile PC (UMPC), as well as one or more suitable products, such as a television, a laptop, a monitor, a billboard, or an Internet of things (IoT). The electronic equipment 1 may be such a product above or a part thereof. In some embodiments, the electronic equipment 1 may be a wearable device, such as a smart watch, a watch phone, a glasses-type or kind display, or a head mounted display (HMD), or a part of the wearable device. However, embodiments of the present disclosure are not limited thereto. For example, in one or more embodiments, the electronic equipment 1 may include a dashboard of a vehicle, a center fascia of a vehicle, a center information display (CID) arranged on a dashboard of a vehicle, a room mirror display replacing a side mirror of a vehicle, an entertainment display for the rear seat of a vehicle or a display arranged on the back of the front seat, or a head up display (HUD) installed in the front of a vehicle or projected on a front window glass, and/or a computer generated hologram augmented reality head up display (CGH AR HUD). FIG. 4 illustrates an embodiment in which the electronic equipment 1 is a smart phone for convenience of explanation.

The electronic equipment 1 may include a display area DA and a non-display area NDA outside the display area DA. The electronic equipment 1 may implement an image through an array of a plurality of pixels that are two-dimensionally arranged in the display area DA.

The non-display area NDA is an area that does not display an image, and may entirely surround the display area DA. On the non-display area NDA, a driver for providing electrical signals or power to display devices arranged on the display area DA may be arranged. On the non-display area NDA, a pad, which is an area to which an electronic device or a printing circuit board may be electrically connected, may be arranged.

In the electronic equipment 1, a length in the x-axis direction and a length in the y-axis direction may be different from each other. In one or more embodiments, as shown in FIG. 4, the length in the x-axis direction may be shorter than the length in the y-axis direction. In one or more embodiments, the length in the x-axis direction may be substantially the same as the length in the y-axis direction. In one or more embodiments, the length in the x-axis direction may be longer than the length in the y-axis direction.

Description of FIGS. 5 and 6A to 6C

Figure 5:
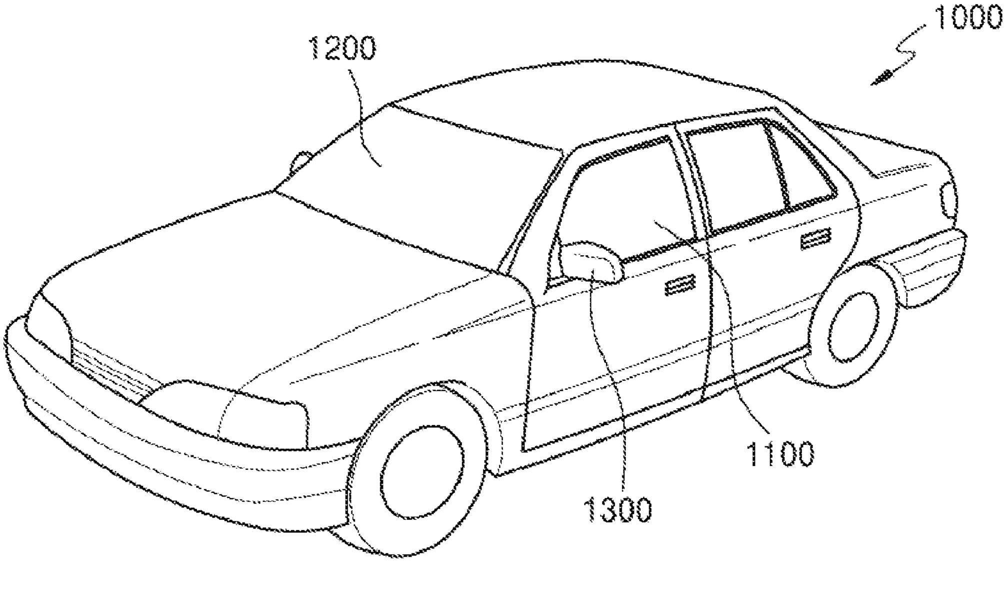
FIG. 5 is a schematic view of an exterior of a vehicle as electronic equipment including a light-emitting device according to one or more embodiments of the present disclosure.
Figure 6A:
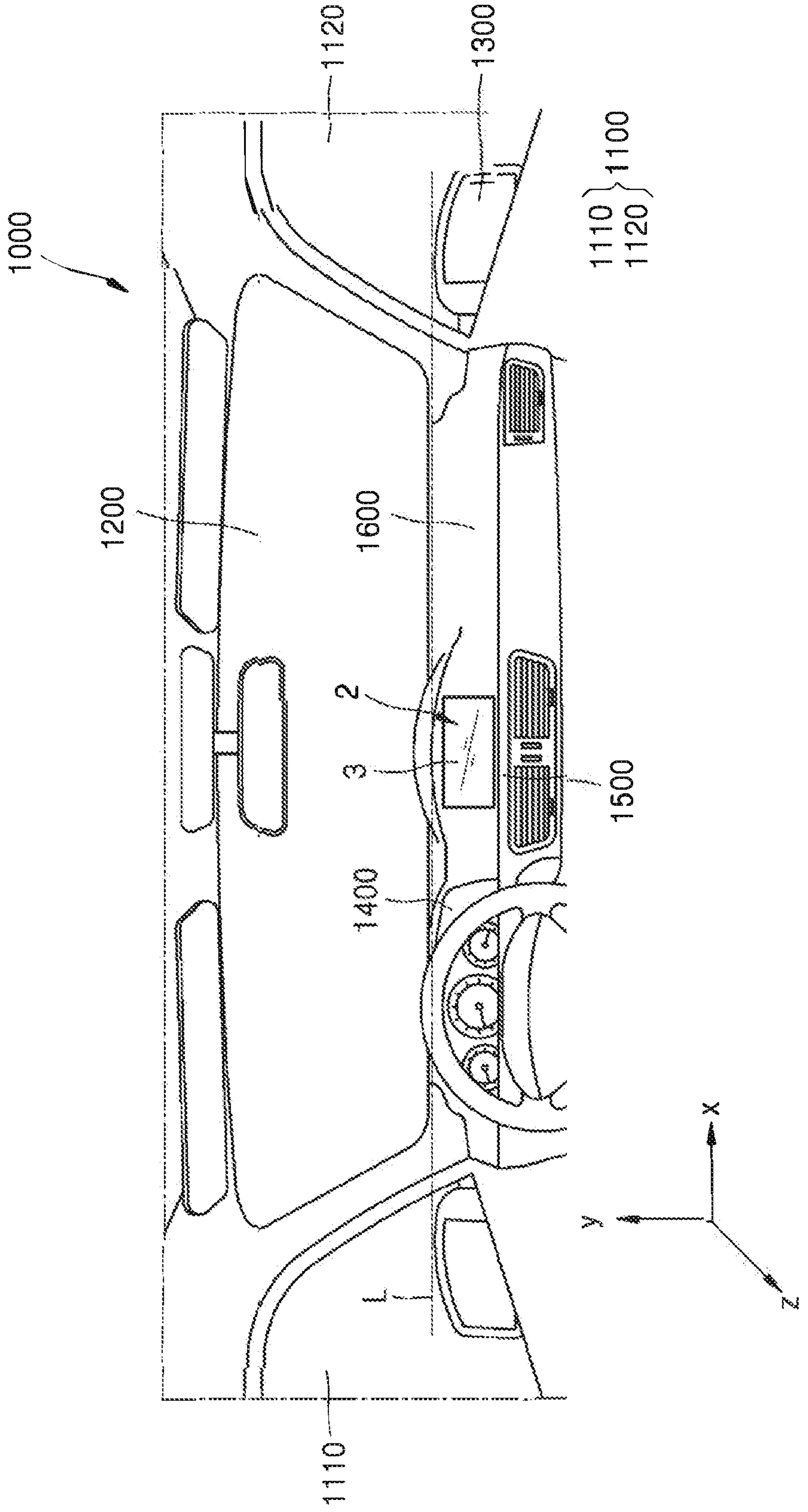
FIGS. 6A, 6B, and 6C are each a schematic view of an interior of the vehicle of FIG. 5.
Figure 6B:
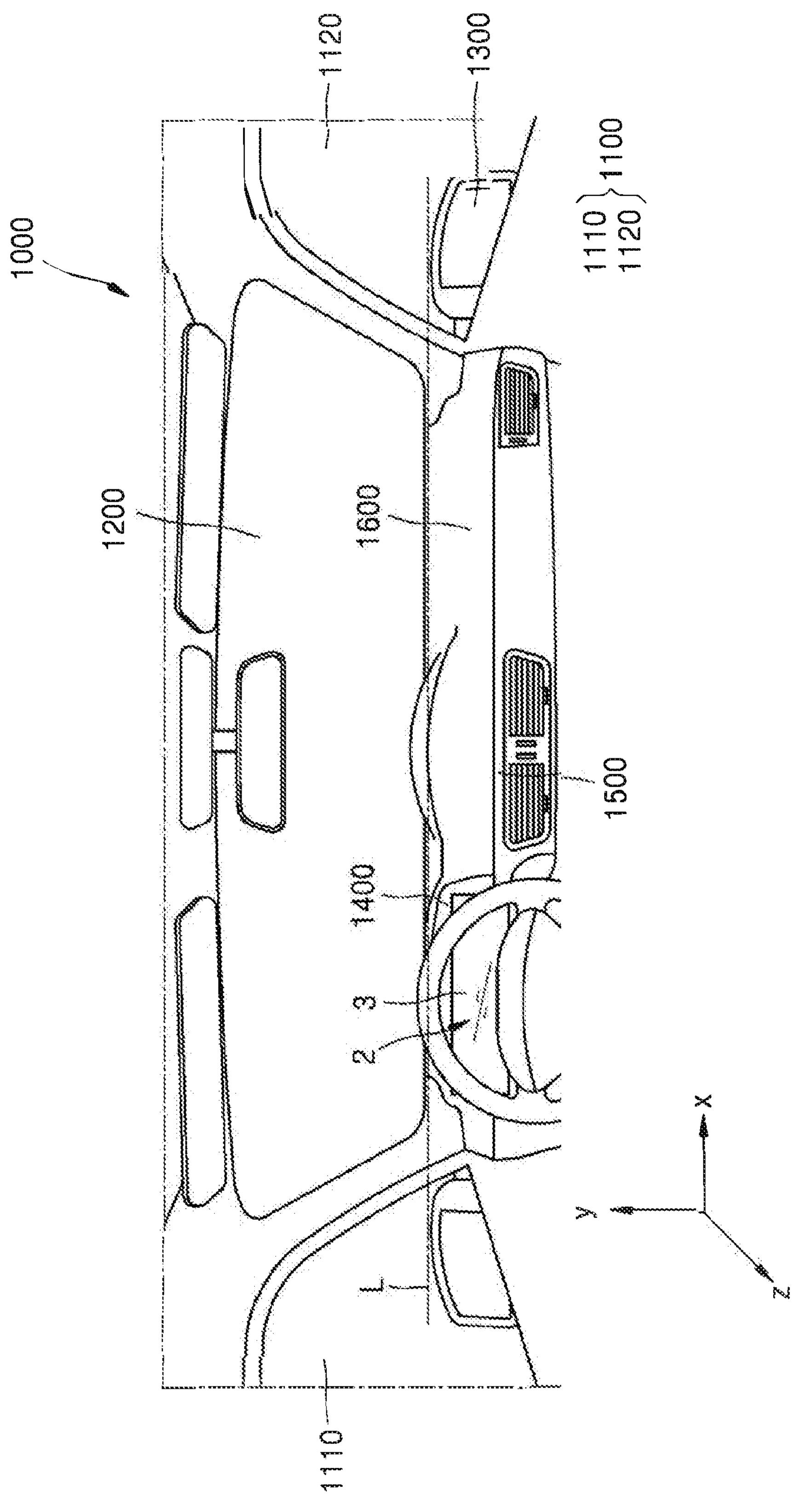
Figure 6C:
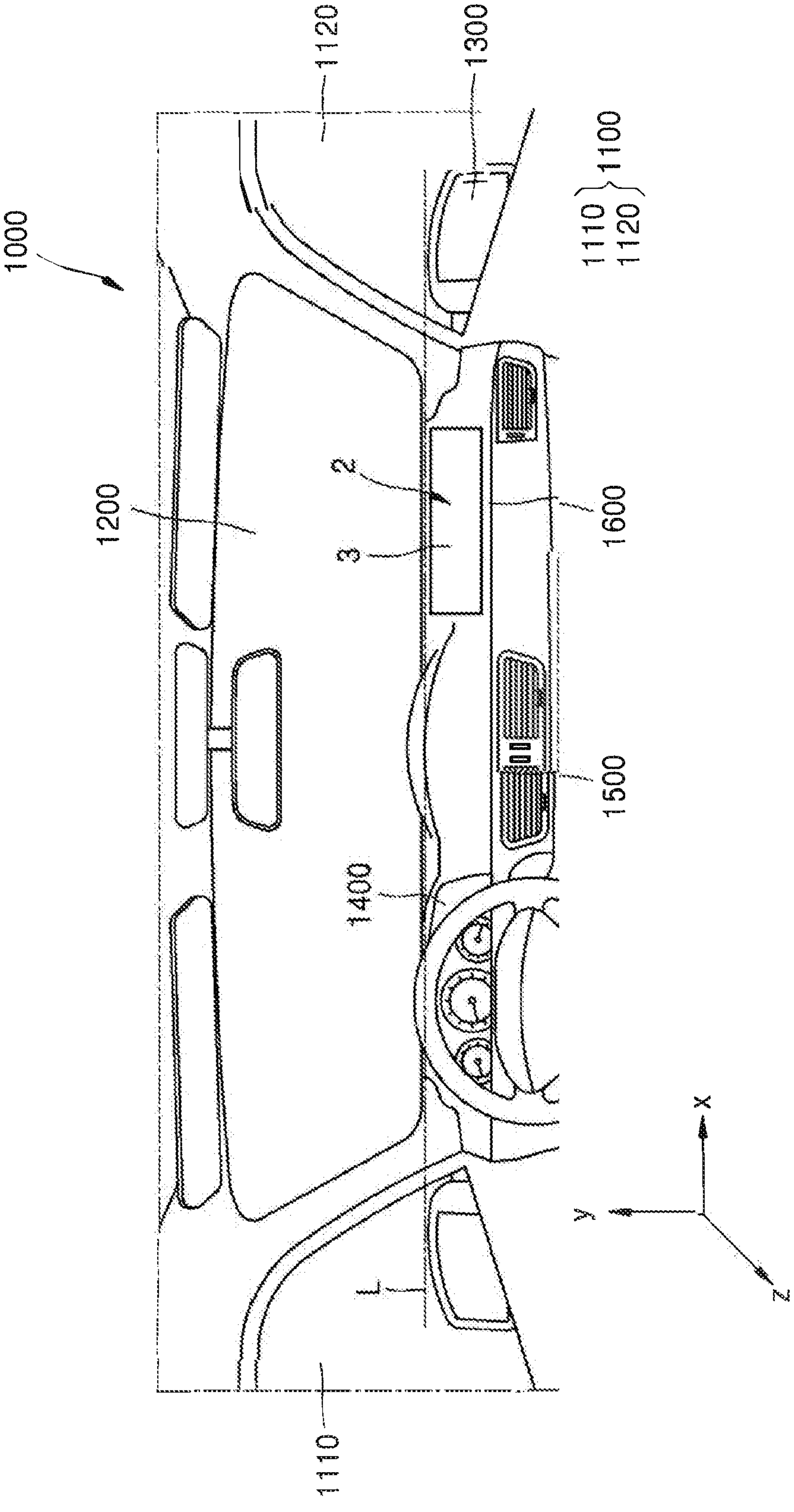

FIG. 5 is a schematic view of an exterior of a vehicle 1000 as electronic equipment including a light-emitting device according to one or more embodiments. FIGS. 6A to 6C are each a schematic view of an interior of the vehicle 1000 according to one or more embodiments.

Referring to FIGS. 5, 6A, 6B, and 6C, the vehicle 1000 may refer to one or more suitable apparatuses for moving an object to be transported, such as a human, an object, or an animal, from a departure point to a destination point. The vehicle 1000 may include a vehicle traveling on a road or a track, a vessel moving over a sea or a river, an airplane flying in the sky utilizing the action of air, and/or the like.

In one or more embodiments, the vehicle 1000 may travel on a road or a track. The vehicle 1000 may move in a certain direction according to rotation of at least one wheel thereof. For example, the vehicle 1000 may include a three-wheeled or four-wheeled vehicle, a construction machine, a two-wheeled vehicle, a prime mover apparatus, a bicycle, or a train running on a track.

The vehicle 1000 may include a body having an interior and an exterior, and a chassis in which mechanical apparatuses necessary for driving are installed as other parts except for the body. The exterior of the body may include a front panel, a bonnet, a roof panel, a rear panel, a trunk, a pillar provided at a boundary between doors, and/or the like. The chassis of the vehicle 1000 may include a power generating apparatus, a power transmitting apparatus, a driving apparatus, a steering apparatus, a braking apparatus, a suspension apparatus, a transmission apparatus, a fuel apparatus, front and rear wheels, left and right wheels, and/or the like.

The vehicle 1000 may include a side window glass 1100, a front window glass 1200, a side mirror 1300, a cluster 1400, a center fascia 1500, a passenger seat dashboard 1600, and a display apparatus 2.

The side window glass 1100 and the front window glass 1200 may be partitioned by a pillar arranged between the side window glass 1100 and the front window glass 1200.

The side window glass 1100 may be installed on a side of the vehicle 1000. In an embodiment, the side window glass 1100 may be installed on a door of the vehicle 1000. A plurality of side window glasses 1100 may be provided and may face each other. In an embodiment, the side window glass 1100 may include a first side window glass 1110 and a second side window glass 1120. In an embodiment, the first side window glass 1110 may be arranged adjacent to the cluster 1400. The second side window glass 1120 may be arranged adjacent to the passenger seat dashboard 1600.

In an embodiment, the side window glasses 1100 may be spaced apart from each other in the x-direction or the −x-direction. For example, in some embodiments, the first side window glass 1110 and the second side window glass 1120 may be spaced apart from each other in the x-direction or the −x-direction. In other words, an imaginary straight line L connecting the side window glasses 1100 to each other may extend in the x-direction or the −x-direction. For example, the imaginary straight line L connecting the first side window glass 1110 and the second side window glass 1120 to each other may extend in the x-direction or the −x-direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the body. In an embodiment, a plurality of side mirrors 1300 may be provided. Any one of the plurality of side mirrors 1300 may be arranged outside the first side window glass 1110. The other one of the plurality of side mirrors 1300 may be arranged outside the second side window glass 1120.

The cluster 1400 may be arranged in front of the steering wheel. The cluster 1400 may include a tachometer, a speedometer, a coolant thermometer, a fuel gauge, a turn indicator, a high beam indicator, a warning light, a seat belt warning light, an odometer, a hodometer, an automatic shift selector indicator light, a door open warning light, an engine oil warning light, and/or a low fuel warning light.

The center fascia 1500 may include a control panel on which a plurality of buttons for adjusting an audio apparatus, an air conditioning apparatus, and/or a heater of a seat are arranged. The center fascia 1500 may be arranged on one side of the cluster 1400.

The passenger seat dashboard 1600 may be spaced apart from the cluster 1400 with the center fascia 1500 arranged therebetween. In an embodiment, the cluster 1400 may be arranged to correspond to a driver seat, and the passenger seat dashboard 1600 may be arranged to correspond to a front passenger seat. In an embodiment, the cluster 1400 may be adjacent to the first side window glass 1110, and the passenger seat dashboard 1600 may be adjacent to the second side window glass 1120.

In an embodiment, the display apparatus 2 may include a display panel 3, and the display panel 3 may display an image. The display apparatus 2 may be arranged inside the vehicle 1000. In an embodiment, the display apparatus 2 may be arranged between the side window glasses 1100 facing each other. The display apparatus 2 may be arranged on at least one of the cluster 1400, the center fascia 1500, or the passenger seat dashboard 1600.

The display apparatus 2 may include an organic light-emitting display apparatus, an inorganic light-emitting display apparatus, a quantum dot display apparatus, and/or the like. Hereinafter, as the display apparatus 2 according to one or more embodiments of the present disclosure, an organic light-emitting display apparatus including the light-emitting device according to the disclosure will be described as an example, but one or more suitable types (kinds) of display apparatuses as described above may be utilized in embodiments of the present disclosure.

Referring to FIG. 6A, in one or more embodiments, the display apparatus 2 may be arranged on the center fascia 1500. In one embodiment, the display apparatus 2 may display navigation information. In one embodiment, the display apparatus 2 may display audio, video, and/or information regarding vehicle settings.

Referring to FIG. 6B, in one or more embodiments, the display apparatus 2 may be arranged on the cluster 1400. When the display apparatus 2 is arranged on the cluster 1400, the cluster 1400 may display driving information and/or the like through the display apparatus 2. For example, in some embodiments, the cluster 1400 may be implemented digitally. The digital cluster 1400 may display vehicle information and driving information as images. For example, a needle and a gauge of a tachometer and one or more suitable warning light icons may be displayed by a digital signal.

Referring to FIG. 6C, in one or more embodiments, the display apparatus 2 may be arranged on the passenger seat dashboard 1600. The display apparatus 2 may be embedded in the passenger seat dashboard 1600 or arranged on the passenger seat dashboard 1600. In an embodiment, the display apparatus 2 arranged on the passenger seat dashboard 1600 may display an image related to information displayed on the cluster 1400 and/or information displayed on the center fascia 1500.

In one or more embodiments, the display apparatus 2 arranged on the passenger seat dashboard 1600 may display information different from information displayed on the cluster 1400 and/or information displayed on the center fascia 1500.

Manufacturing Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, laser-induced thermal imaging, and/or the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as utilized herein refers to a cyclic group including (e.g., consisting of) carbon only as a ring-forming atom and having 3 to 60 carbon atoms. The term "$C_1$-$C_{60}$ heterocyclic group" as utilized herein refers to a cyclic group that has 1 to 60 carbon atoms and further has, in addition to carbon, a heteroatom as a ring-forming atom. The $C_3$-$C_{60}$ carbocyclic group and the $C_1$-$C_{60}$ heterocyclic group may each be a monocyclic group including (e.g., consisting of) one ring or a polycyclic group in which two or more rings are condensed with each other. For example, the $C_1$-$C_{60}$ heterocyclic group may have 3 to 61 ring-forming atoms.

The "cyclic group" as utilized herein may include both (e.g., simultaneously) the $C_3$-$C_{60}$ carbocyclic group and the $C_1$-$C_{60}$ heterocyclic group.

The term "π electron-rich $C_3$-$C_{60}$ cyclic group" as utilized herein refers to a cyclic group that has 3 to 60 carbon atoms and does not include *—N=*' as a ring-forming moiety.

The term "π electron-deficient nitrogen-containing $C_1$-$C_{60}$ heterocyclic group" as utilized herein refers to a heterocyclic group that has 1 to 60 carbon atoms and includes *—N=*' as a ring-forming moiety.

For example, the $C_3$-$C_{60}$ carbocyclic group may be i) Group T1 or ii) a condensed cyclic group in which two or more of Group T1 are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), and the $C_1$-$C_{60}$ heterocyclic group may be i) Group T2, ii) a condensed cyclic group in which two or more of Group T2 are condensed with each other, or iii) a condensed cyclic group in which at least one Group T2 and at least one Group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.).

The π electron-rich $C_3$-$C_{60}$ cyclic group may be i) Group T1, ii) a condensed cyclic group in which two or more of Group T1 are condensed with each other, iii) Group T3, iv) a condensed cyclic group in which two or more of Group T3 are condensed with each other, or v) a condensed cyclic group in which at least one Group T3 and at least one Group T1 are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.).

The π electron-deficient nitrogen-containing $C_1$-$C_{60}$ heterocyclic group may be i) Group T4, ii) a condensed cyclic group in which two or more of Group T4 are condensed with each other, iii) a condensed cyclic group in which at least one Group T4 and at least one Group T1 are condensed with each other, iv) a condensed cyclic group in which at least one Group T4 and at least one Group T3 are condensed with each other, or v) a condensed cyclic group in which at least one Group T4, at least one Group T1, and at least one Group T3 are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.).

Group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group.

Group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group.

Group T3 may be a furan group, a thiophene group, a 1H-pyrrole group, a silole group, or a borole group.

Group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group," "$C_3$-$C_{60}$ carbocyclic group," "$C_1$-$C_{60}$ heterocyclic group," "π electron-rich $C_3$-$C_{60}$ cyclic group," or "π electron-deficient nitrogen-containing $C_1$-$C_{60}$ heterocyclic group" as utilized herein refers to i) a group condensed to any cyclic group, ii) a monovalent group, or iii) a polyvalent group (for example, a divalent group, a trivalent group, a tetravalent group, etc.), according to the structure of a formula for which the corresponding term is utilized.

For example, the "benzene group" may be a benzo group, a phenyl group, a phenylene group, and/or the like, which may be easily understood by one of ordinary skill in the art according to the structure of a formula including the "benzene group."

Depending on context, in the present disclosure, a divalent group may refer or be a polyvalent group (e.g., trivalent, tetravalent, etc., and not just divalent) per, e.g., the structure of a formula in connection with which of the terms are utilized.

Non-limiting examples of the monovalent $C_3$-$C_{60}$ carbocyclic group and monovalent $C_1$-$C_{60}$ heterocyclic group may be a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{10}$ aryl group, a $C_1$-$C_{60}$ heteroaryl group, a monovalent non-aromatic condensed polycyclic group, and a monovalent non-aromatic condensed heteropolycyclic group.

Non-limiting examples of the divalent $C_3$-$C_{60}$ carbocyclic group and the divalent $C_1$-$C_{60}$ heterocyclic group may be a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{10}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as utilized herein refers to a linear or branched aliphatic hydrocarbon monovalent group that has 1 to 60 carbon atoms, and non-limiting examples thereof may be a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a secnonyl group, a tert-nonyl group, an n-decyl group, an isodecyl group, a sec-decyl group, a tert-decyl group, and/or the like.

The term "$C_1$-$C_{60}$ alkylene group" as utilized herein refers to a divalent group having substantially the same structure as the $C_1$-$C_{60}$ alkyl group.

The term "$C_2$-$C_{60}$ alkenyl group" as utilized herein refers to a monovalent hydrocarbon group having at least one carbon-carbon double bond in the middle or at the terminus of a $C_2$-$C_{60}$ alkyl group, and non-limiting examples thereof may be an ethenyl group, a propenyl group, a butenyl group, and/or the like.

The term "$C_2$-$C_{60}$ alkenylene group" as utilized herein refers to a divalent group having substantially the same structure as the $C_2$-$C_{60}$ alkenyl group.

The term "$C_2$-$C_{60}$ alkynyl group" as utilized herein refers to a monovalent hydrocarbon group having at least one carbon-carbon triple bond in the middle or at the terminus of a $C_2$-$C_{60}$ alkyl group, and non-limiting examples thereof may be an ethynyl group, a propynyl group, and/or the like.

The term "$C_2$-$C_{60}$ alkynylene group" as utilized herein refers to a divalent group having substantially the same structure as the $C_2$-$C_{60}$ alkynyl group.

The term "$C_1$-$C_{60}$ alkoxy group" as utilized herein refers to a monovalent group represented by $—OA_{101}$ (wherein $A_{101}$ is a $C_1$-$C_{60}$ alkyl group), and non-limiting examples thereof may be a methoxy group, an ethoxy group, an isopropyloxy group, and/or the like.

The term "$C_3$-$C_{10}$ cycloalkyl group" as utilized herein refers to a monovalent saturated hydrocarbon cyclic group having 3 to 10 carbon atoms, and non-limiting examples thereof may be a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and/or the like.

The term "$C_3$-$C_1$ cycloalkylene group" as utilized herein refers to a divalent group having substantially the same structure as the $C_3$-$C_1$ cycloalkyl group.

The term "$C_1$-$C_{10}$ heterocycloalkyl group" as utilized herein refers to a monovalent cyclic group of 1 to 10 carbon atoms, further including, in addition to carbon atoms, at least one heteroatom, as ring-forming atoms, and non-limiting examples thereof may be a 1,2,3,4-oxatriazolidinyl group, a tetrahydrofuranyl group, a tetrahydrothiophenyl group, and/or the like.

The term "$C_1$-$C_{10}$ heterocycloalkylene group" as utilized herein refers to a divalent group having substantially the same structure as the $C_1$-$C_{10}$ heterocycloalkyl group.

The term "$C_3$-$C_1$a cycloalkenyl group" as utilized herein refers to a monovalent cyclic group that has 3 to 10 carbon atoms and at least one carbon-carbon double bond in the ring thereof and no aromaticity, and non-limiting examples thereof may be a cyclopentenyl group, a cyclohexenyl group, a cycloheptenyl group, and/or the like.

The term "$C_3$-$C_1$a cycloalkenylene group" as utilized herein refers to a divalent group having substantially the same structure as the $C_3$-$C_1$a cycloalkenyl group.

The term "$C_1$-$C_{10}$ heterocycloalkenyl group" as utilized herein refers to a monovalent cyclic group of 1 to 10 carbon atoms, further including, in addition to carbon atoms, at least one heteroatom, as ring-forming atoms, and having at least one double bond in the cyclic structure thereof. Non-limiting examples of the $C_1$-$C_{10}$ heterocycloalkenyl group may be a 4,5-dihydro-1,2,3,4-oxatriazolyl group, a 2,3-dihydrofuranyl group, a 2,3-dihydrothiophenyl group, and/or the like.

The term "$C_1$-$C_{10}$ heterocycloalkenylene group" as utilized herein refers to a divalent group having substantially the same structure as the $C_1$-$C_{10}$ heterocycloalkenyl group.

The term "$C_6$-$C_{60}$ aryl group" as utilized herein refers to a monovalent group having a carbocyclic aromatic system of 6 to 60 carbon atoms.

The term "$C_6$-$C_{60}$ arylene group" as utilized herein refers to a divalent group having a carbocyclic aromatic system of 6 to 60 carbon atoms.

Non-limiting examples of the $C_6$-$C_{60}$ aryl group may be a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and/or the like.

When the $C_6$-$C_{60}$ aryl group and the $C_6$-$C_{60}$ arylene group each include two or more rings, the rings may be condensed with each other.

The term "$C_1$-$C_{60}$ heteroaryl group" as utilized herein refers to a monovalent group having a heterocyclic aromatic system of 1 to 60 carbon atoms, further including, in addition to carbon atoms, at least one heteroatom, as ring-forming atoms.

The term "$C_1$-$C_{60}$ heteroarylene group" as utilized herein refers to a divalent group having a heterocyclic aromatic system of 1 to 60 carbon atoms, further including, in addition to carbon atoms, at least one heteroatom, as ring-forming atoms.

Non-limiting examples of the $C_1$-$C_{60}$ heteroaryl group may be a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a naphthyridinyl group, and/or the like.

When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as utilized herein refers to a monovalent group (for example, having 8 to 60 carbon atoms) having two or more rings condensed to each other, only carbon atoms as ring-forming atoms, and no aromaticity in its entire molecular structure as a whole. Non-limiting examples of the monovalent non-aromatic condensed polycyclic group may be an indenyl group, a fluorenyl group, a spiro-bifluorenyl group, a benzofluorenyl group, an indenophenanthrenyl group, an indenoanthracenyl group, and/or the like.

The term "divalent non-aromatic condensed polycyclic group" as utilized herein refers to a divalent group having substantially the same structure as the monovalent non-aromatic condensed polycyclic group.

The term "monovalent non-aromatic condensed heteropolycyclic group" as utilized herein refers to a monovalent group (for example, having 1 to 60 carbon atoms) having two or more rings condensed to each other, further including, in addition to carbon atoms, at least one heteroatom, as ring-forming atoms, and having non-aromaticity in its entire molecular structure as a whole. Non-limiting examples of the monovalent non-aromatic condensed heteropolycyclic group may be a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and/or the like.

The term "divalent non-aromatic condensed heteropolycyclic group" as utilized herein refers to a divalent group having substantially the same structure as the monovalent non-aromatic condensed heteropolycyclic group.

The term "$C_6$-$C_{60}$ aryloxy group" as utilized herein refers to —$OA_{102}$ (wherein $A_{102}$ is a $C_6$-$C_{10}$ aryl group).

The term "$C_6$-$C_{60}$ arylthio group" as utilized herein refers to —$SA_{103}$ (wherein $A_{103}$ is a $C_6$-$C_{60}$ aryl group).

The term "$C_7$-$C_{60}$ arylalkyl group" as utilized herein refers to -$A_{104}A_{105}$ (wherein $A_{104}$ is a $C_1$-$C_{54}$ alkylene group, and $A_{105}$ is a $C_6$-$C_{59}$ aryl group).

The term "$C_2$-$C_{60}$ heteroarylalkyl group" as utilized herein refers to -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as utilized herein refers to:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ utilized herein may each independently be: hydrogen; deuterium; —F; —$C_1$; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as utilized herein refers to any atom other than a carbon atom. Non-limiting examples of the heteroatom may be O, S, N, P, Si, B, Ge, Se, and any combination thereof.

The term "third-row transition metal" as utilized herein may include hafnium (Hf), tantalum (Ta), tungsten (W), rhenium (Re), osmium (Os), iridium (Ir), platinum (Pt), gold (Au), and/or the like.

The term "Ph" as utilized herein refers to a phenyl group, the term "Me" as utilized herein refers to a methyl group, the term "Et" as utilized herein refers to an ethyl group, the term "tert-Bu" or "$Bu^t$" as utilized herein refers to a tert-butyl group, and the term "OMe" as utilized herein refers to a methoxy group.

The term "biphenyl group" as utilized herein refers to "a phenyl group substituted with a phenyl group." In other words, the "biphenyl group" may be a substituted phenyl group having a $C_6$-$C_{10}$ aryl group as a substituent.

The term "terphenyl group" as utilized herein refers to "a phenyl group substituted with a biphenyl group." In other words, the "terphenyl group" may be a substituted phenyl group having, as a substituent, a $C_6$-$C_{10}$ aryl group substituted with a $C_6$-$C_{10}$ aryl group.

* and *' as utilized herein, unless defined otherwise, each refer to a binding site to a neighboring atom in a corresponding formula or moiety.

The x-axis, y-axis, and z-axis as utilized herein are not limited to three axes in an orthogonal coordinate system, and may be interpreted in a broad sense including these axes. For example, the x-axis, y-axis, and z-axis may refer to those orthogonal to each other, or may refer to those in different directions that are not orthogonal to each other.

Hereinafter, compounds according to one or more embodiments and light-emitting devices according to one or more embodiments will be described in more detail with reference to Synthesis Examples and Examples. The wording "B was utilized instead of A" utilized in describing Synthesis Examples refers to that an identical molar equivalent of B was utilized in place of A.

Synthesis methods of the organic compound represented by Formula 1 may be recognizable by one of ordinary skill in the art by referring to Synthesis Examples and/or Examples provided herein.

Synthesis Example 1 Synthesis of Compound 5
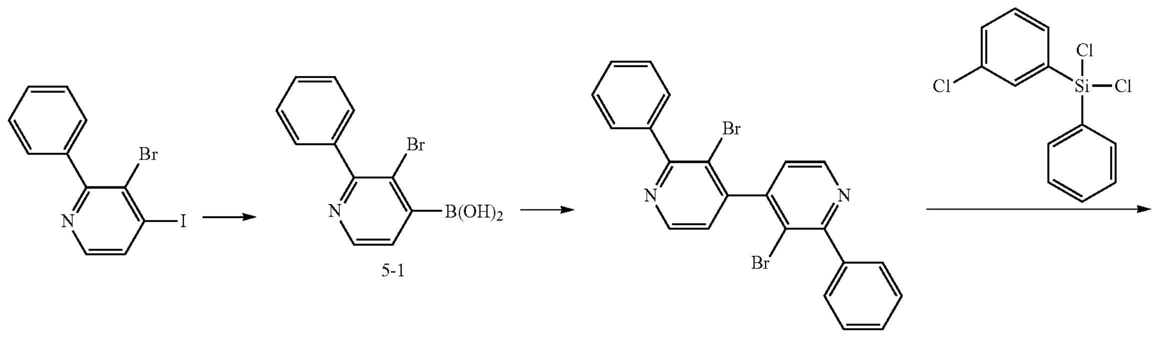
5-1
5-2
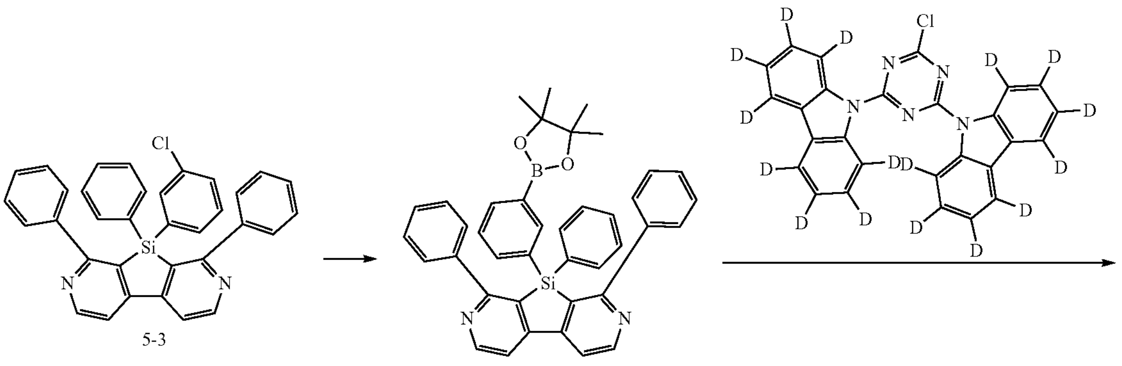
5-3
5-4
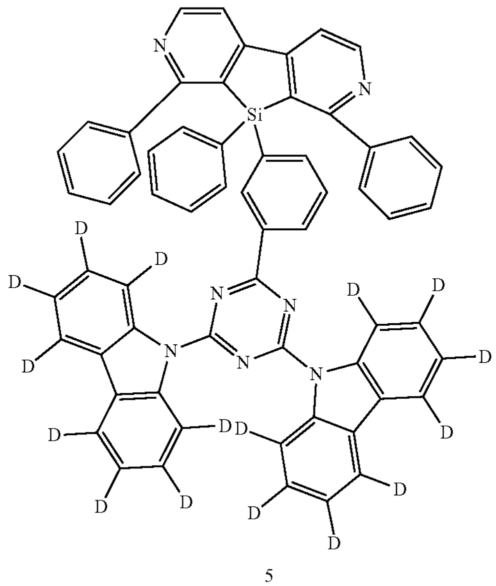
5

1) Synthesis of Intermediate 5-1

3-bromo-4-iodo-2-phenylpyridine (CAS: 1838582-73-2) (1 eq) was reacted with trimethyl borate (1.5 eq) in the presence of n-BuLi (1.2 eq) to obtain Intermediate 5-1. Intermediate 5-1 was identified by liquid chromatograph/mass spectrometry (LC/MS).

$C_{11}H_9BBrNO_2$ M+1:278.39

2) Synthesis of Intermediate 5-2

Intermediate 5-1 (1 eq) was reacted with 3-bromo-4-iodo-2-phenylpyridine (CAS: 1838582-73-2) (1 eq) in the presence of potassium carbonate and tetrakis(triphenylphosphine)palladium(0) to obtain Intermediate 5-2. Intermediate 5-2 was identified by LC/MS.

$C_{22}H_{14}Br_2N_2$ M+1:464.97

3) Synthesis of Intermediate 5-3

Intermediate 5-2 (1 eq) was reacted with dichloro(3-chlorophenyl)(phenyl)silane (1 eq) in the presence of n-BuLi (2 eq) to obtain Intermediate 5-3. Intermediate 5-3 was identified by LC/MS.

$C_{34}H_{23}ClN_2Si$ M+1:523.45

4) Synthesis of Intermediate 5-4

Intermediate 5-3 (1 eq) was reacted with bispinacolatodiboron (1.5 eq) in the presence of tris(dibenzylideneacetone)dipalladium(0) ($Pd_2(dba)_3$) (0.1 eq) to obtain Intermediate 5-4. Intermediate 5-4 was identified by LC/MS.

$C_{40}H_{35}BN_2O_2Si$ M+1:615.37

5) Synthesis of Compound 5

3.37 g of Intermediate 5-4, 2.3 g of 9,9'-(6-chloro-1,3,5-triazine-2,4-diyl)bis(9H-carbazole-1,2,3,4,5,6,7,8-d8), 1.38 g of potassium carbonate, and 0.25 g of tetrakis(triphenylphosphine)palladium(0) were added to a round-bottom flask (RB) and then dissolved in 40 mL of tetrahydrofuran (THF) and 10 mL of deionized water (DW), followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 3.41 g (yield: 75%) of Compound 5. Compound 5 was identified by LC-MS and $^1$H-NMR (proton nuclear magnetic resonance spectroscopy).

$C_{61}H_{23}D_{16}N_7Si$ M+1:9134.44

Synthesis Example 2 Synthesis of Compound 16

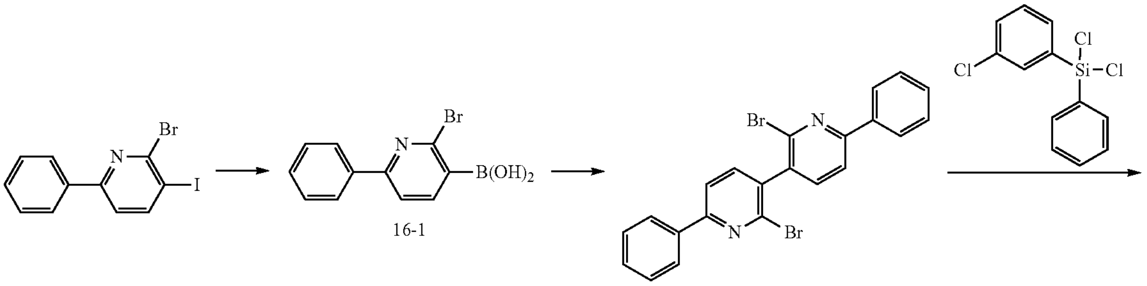

16-1

16-2

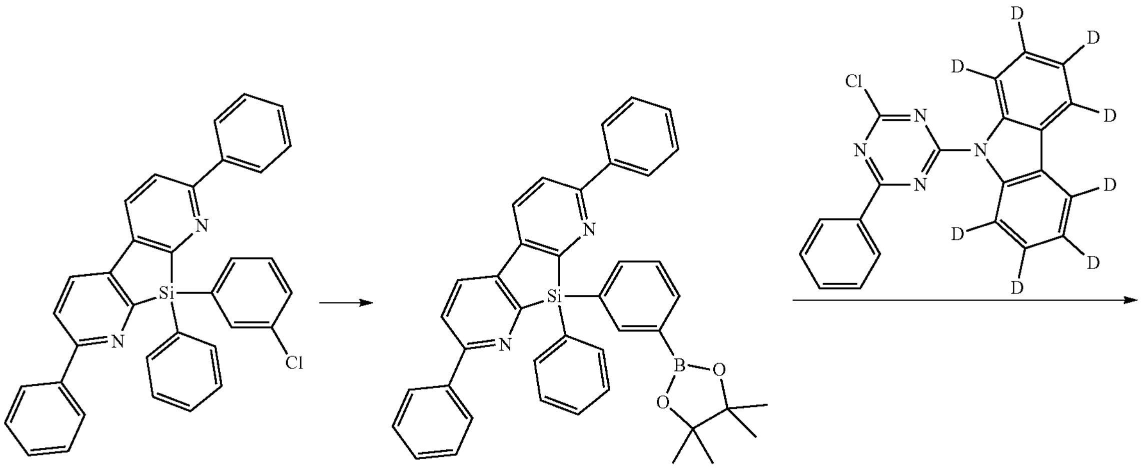

16-3

16-4

-continued

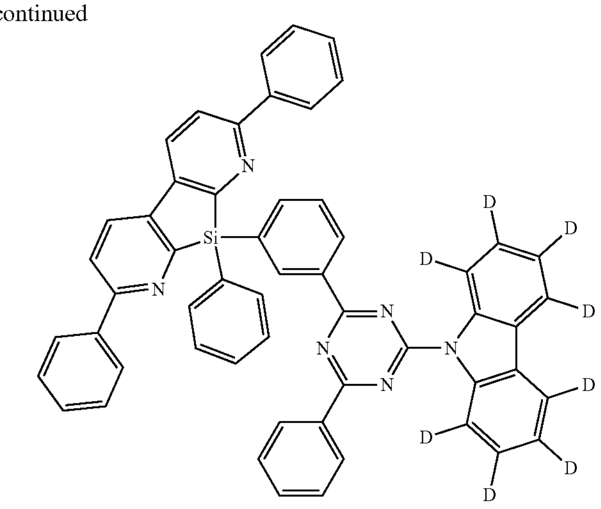

16

1) Synthesis of Intermediate 16-1

2-bromo-3-iodo-6-phenylpyridine (CAS: 1478669-70-3) (1 eq) was reacted with trimethyl borate (1.5 eq) in the presence of n-BuLi (1.2 eq) to obtain Intermediate 16-1. Intermediate 16-1 was identified by LC/MS.

$C_{11}H_9BBrNO_2$ M+1:278.39

2) Synthesis of Intermediate 16-2

Intermediate 16-1 (1 eq) was reacted with 2-bromo-3-iodo-6-phenylpyridine (CAS: 1478669-70-3) (1 eq) in the presence of potassium carbonate and tetrakis(triphenylphosphine)palladium(0) to obtain Intermediate 16-2. Intermediate 16-2 was identified by LC/MS.

$C_{22}H_{14}Br_2N_2$ M+1:464.97

3) Synthesis of Intermediate 16-3

Intermediate 16-2 (1 eq) was reacted with dichloro(3-chlorophenyl)(phenyl)silane (1 eq) in the presence of n-BuLi (2 eq) to obtain Intermediate 16-3. Intermediate 16-3 was identified by LC/MS.

$C_{34}H_{23}ClN_2Si$ M+1:523.45

4) Synthesis of Intermediate 16-4

Intermediate 16-3 (1 eq) was reacted with bispinacolatodiboron (1.5 eq) in the presence of $Pd_2(dba)_3$ (0.1 eq) to obtain Intermediate 16-4. Intermediate 16-4 was identified by LC/MS.

$C_{40}H_{35}BN_2O_2Si$ M+1:615.37

5) Synthesis of Compound 16

3.34 g of Intermediate 16-4, 1.8 g of 9-(4-chloro-6-phenyl-1,3,5-triazin-2-yl)-9H-carbazole-1,2,3,4,5,6,7,8-d8, 1.36 g of potassium carbonate, and 0.25 g of tetrakis (triphenylphosphine)palladium(0) were added to an RB and then dissolved in 50 mL of THF and 10 mL of DW, followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 3.34 g (yield: 83%) of Compound 16. Compound 16 was identified by LC-MS and $^1H$-NMR.

$C_{55}H_{28}D_8N_6Si$ M+1:817.41

Synthesis Example 3 Synthesis of Compound 25

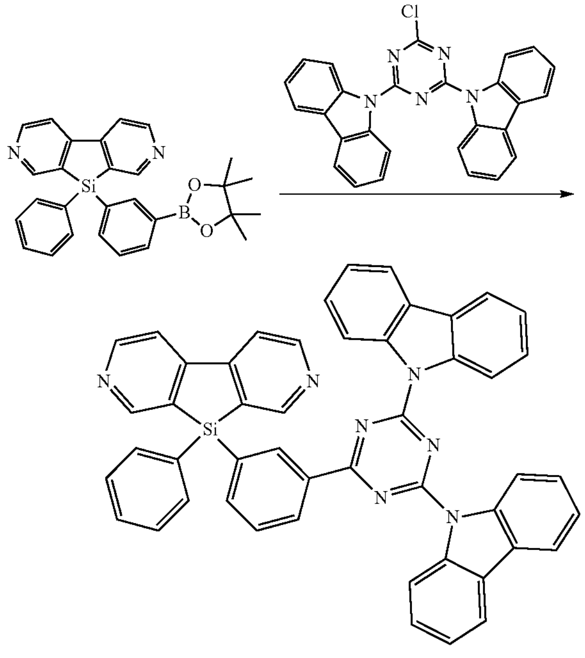

25

2.05 g of 9-phenyl-9-(3-(4,4,5,5-tetramethyl-1,3,2-dioxaborolan-2-yl)phenyl)-9H-silolo[2,3-c:5,4-c']dipyridine, 1.8 g of 9,9'-(6-chloro-1,3,5-triazine-2,4-diyl)bis(9H-carbazole), 1.12 g of potassium carbonate, and 0.21 g of tetrakis (triphenylphosphine)palladium(0) were added to an RB and then dissolved in 40 mL of THF and 10 mL of DW, followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 2.47 g (yield: 82%) of Compound 25. Compound 25 was identified by LC-MS and $^1$H-NMR.

$C_{49}H_{31}N_7Si$ M+1:746.40

-continued

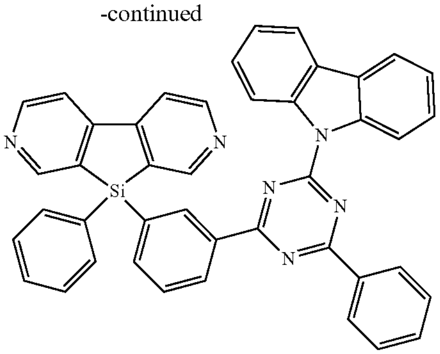

33

Synthesis Example 4 Synthesis of Compound 33

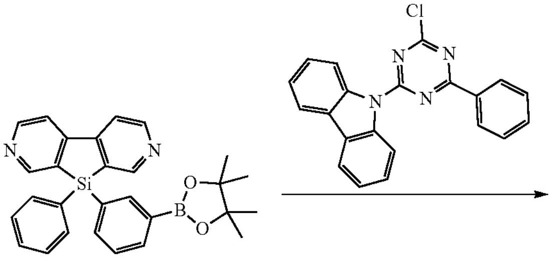

2.57 g of 9-phenyl-9-(3-(4,4,5,5-tetramethyl-1,3,2-dioxaborolan-2-yl)phenyl)-9H-silolo[2,3-c:5,4-c']dipyridine, 1.8 g of 9-(4-chloro-6-phenyl-1,3,5-triazin-2-yl)-9H-carbazole, 1.39 g of potassium carbonate, and 0.26 g of tetrakis (triphenylphosphine)palladium(0) were added to an RB and then dissolved in 50 mL of THF and 10 mL of DW, followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 2.91 g (yield: 88%) of Compound 33. Compound 33 was identified by LC-MS and $^1$H-NMR.

$C_{43}H_{28}N_6Si$ M+1:657.32

Synthesis Example 5 Synthesis of Compound 38

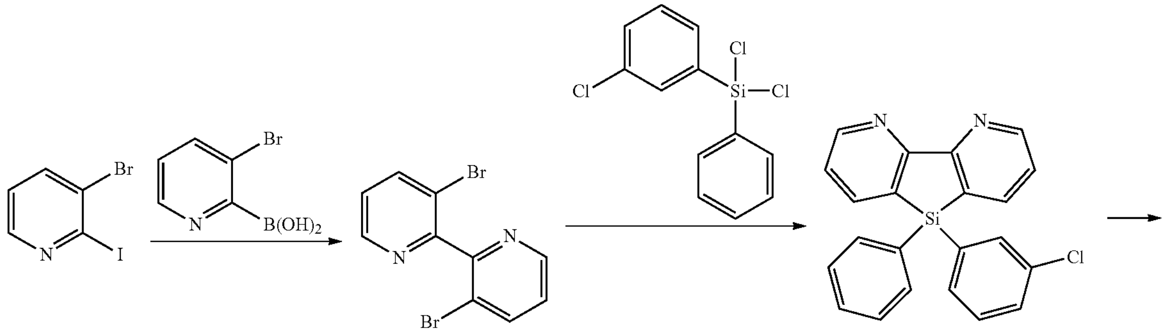

38-1

38-2

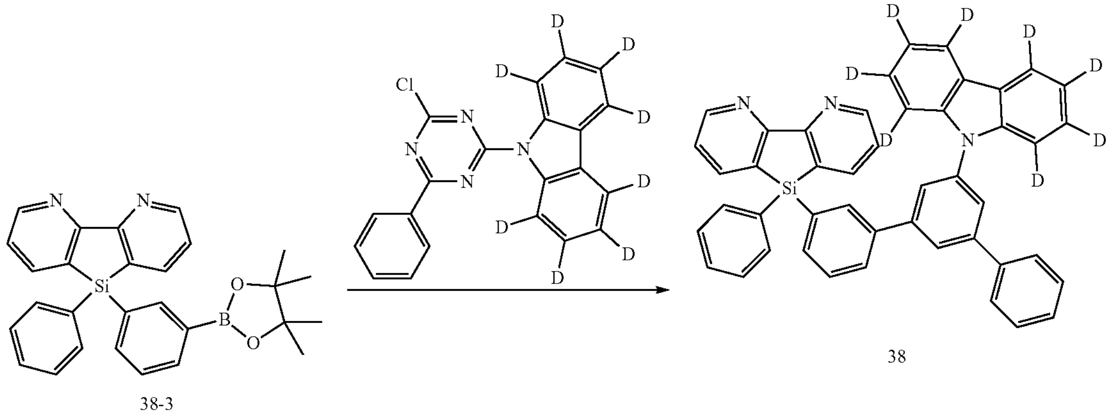

38-3

38

1) Synthesis of Intermediate 38-1

3-bromo-2-iodopyridine (CAS: 408502-43-2) (1 eq) was reacted with (3-bromopyridin-2-yl)boronic acid (CAS: 2098254-77-2) (1 eq) in the presence of potassium carbonate and tetrakis(triphenylphosphine)palladium(0) to obtain Intermediate 38-1. Intermediate 38-1 was identified by LC/MS.

$C_{10}H_6Br_2N_2$ M+1:312.92

2) Synthesis of Intermediate 38-2

Intermediate 38-1 (1 eq) was reacted with dichloro(3-chlorophenyl)(phenyl)silane (1 eq) in the presence of n-BuLi(2 eq) to obtain Intermediate 38-2. Intermediate 38-2 was identified by LC/MS.

$C_{22}H_{15}ClN_2Si$ M+1:371.24

3) Synthesis of Intermediate 38-3

Intermediate 38-2 (1 eq) was reacted with bispinacolatodiboron (1.5 eq) in the presence of $Pd_2(dba)_3$ (0.1 eq) to obtain Intermediate 38-3. Intermediate 38-3 was identified by LC/MS.

$C_{28}H_{27}BN_2O_2Si$ M+1:463.72

4) Synthesis of Compound 38

2.79 g of Intermediate 38-3, 2.0 g of 9-(4-chloro-6-phenyl-1,3,5-triazin-2-yl)-9H-carbazole-1,2,3,4,5,6,7,8-d8 (CAS: 2574571-56-3), 1.52 g of potassium carbonate, and 0.28 g of tetrakis(triphenylphosphine)palladium(0) were added to an RB and then dissolved in 55 mL of THF and 15 mL of DW, followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 2.91 g (yield: 80%) of Compound 38. Compound 38 was identified by LC-MS and $^1$H-NMR.

$C_{43}H_{20}D_8N_6Si$ M+1:665.72

Synthesis Example 6 Synthesis of Compound 41

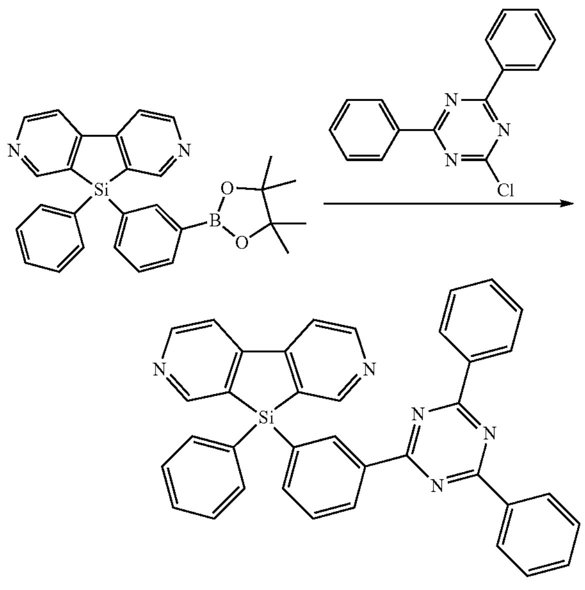

41

3.8 g of 9-phenyl-9-(3-(4,4,5,5-tetramethyl-1,3,2-dioxaborolan-2-yl)phenyl)-9H-silolo[2,3-c:5,4-c']dipyridine (CAS: 2124201-98-3), 2.0 g of 2-chloro-4,6-diphenyl-1,3,5-triazine (CAS: 3842-55-5), 2.06 g of potassium carbonate, and 0.38 g of tetrakis(triphenylphosphine)palladium(0) were added to an RB and then dissolved in 75 mL of THF and 20 mL of DW, followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 3.39 g (yield: 80%) of Compound 41. Compound 41 was identified by LC-MS and $^1$H-NMR.

$C_3H_{25}N_5Si$ M+1:568.51

Synthesis Example 7 Synthesis of Compound 47

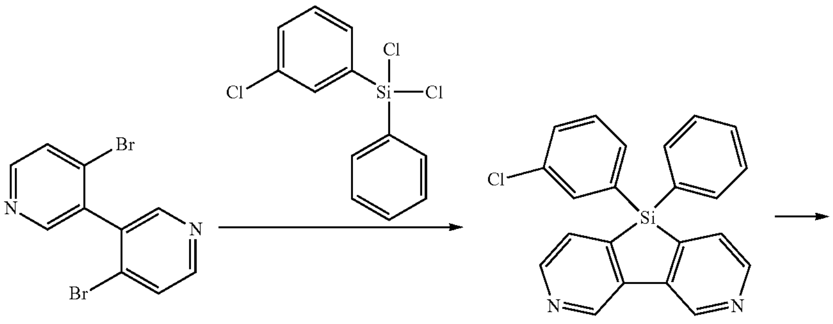

47-1

-continued

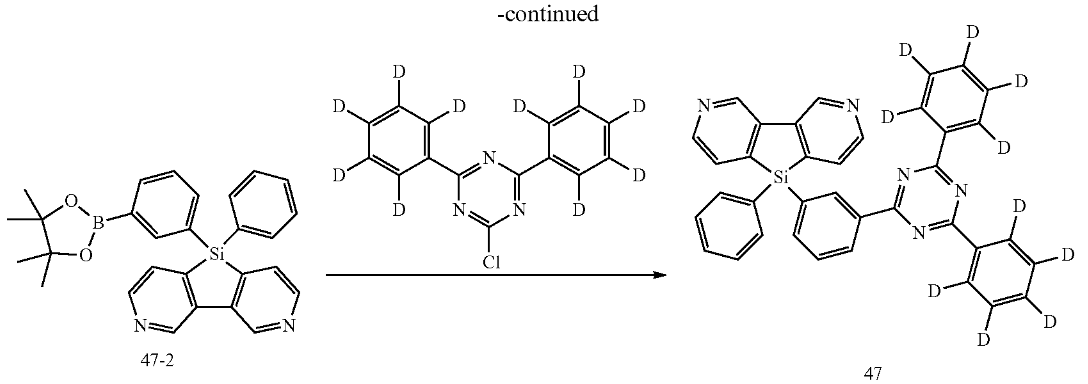

1) Synthesis of Intermediate 47-1

4,4'-dibromo-3,3'-bipyridine (CAS: 2380001-81-8) (1 eq) was reacted with dichloro(3-chlorophenyl)(phenyl)silane (1 eq) in the presence of n-BuLi (2 eq) to obtain Intermediate 47-1. Intermediate 47-1 was identified by LC/MS.

$C_{22}H_{15}ClN_2Si$ M+1:371.49

2) Synthesis of Intermediate 47-2

Intermediate 47-1 (1 eq) was reacted with bispinacolatodiboron (1.5 eq) in the presence of $Pd_2(dba)_3$ (0.1 eq) to obtain Intermediate 47-2. Intermediate 47-2 was identified by LC/MS.

$C_{28}H_{27}BN_2O_2Si$ M+1:463.22

3) Synthesis of Compound 47

2.56 g of Intermediate 47-2, 3.1 g of 2-chloro-4,6-bis(phenyl-d5)-1,3,5-triazine (CAS: 1300115-09-6), 1.39 g of potassium carbonate, and 0.26 g of tetrakis(triphenylphosphine)palladium(0) were added to an RB and then dissolved in 50 mL of THF and 15 mL of DW, followed by refluxing for 12 hours. After the reaction was completed, an extraction process was performed on the reaction solution by utilizing ethylacetate to collect an organic layer. The organic layer was dried by utilizing magnesium sulfate to obtain a residue. The residue was separated and purified by silica gel column chromatography to obtain 2.33 g (yield: 80%) of Compound 47. Compound 47 was identified by LC-MS and $^1$H-NMR.

$C_{37}H_{15}D_{10}N_5Si$ M+1:558.29

Example 1

As an anode, a Corning 15 Ω/cm$^2$ (1,200 Å) ITO glass substrate was cut to a size of 50 mm×50 mm×0.7 mm, sonicated by with isopropyl alcohol and pure water each for 5 minutes, and then cleaned by irradiation of ultraviolet rays and exposure of ozone thereto for 30 minutes. Then, the resultant ITO glass substrate was loaded onto a vacuum deposition apparatus.

NPB was vacuum-deposited on the substrate to form a hole injection layer having a thickness of 300 Å. mCP was vacuum-deposited on the hole injection layer to form a hole transport layer having a thickness of 200 Å.

Compound 5 and $Ir(pmp)_3$ were co-deposited at a weight ratio of 92:8 on the hole transport layer to form an emission layer having a thickness of 250 Å.

TAZ was deposited on the emission layer to form an electron transport layer having a thickness of 200 Å. LiF, which is a halogenated alkali metal, was deposited on the electron transport layer to form an electron injection layer having a thickness of 10 Å, and Al was vacuum-deposited thereon to form a LiF/Al electrode (cathode) having a thickness of 100 Å, thereby completing the manufacture of a light-emitting device.

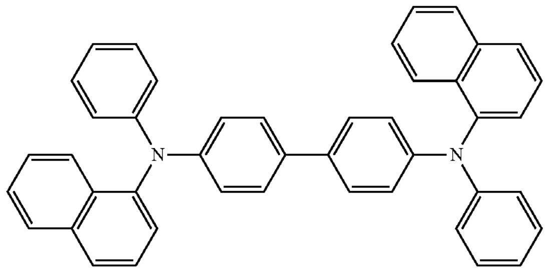

NPB

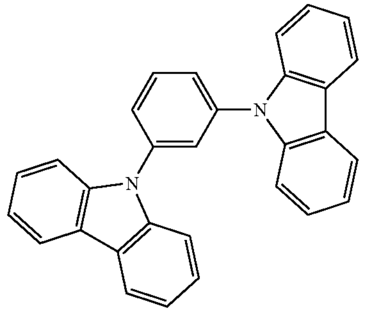

mCP

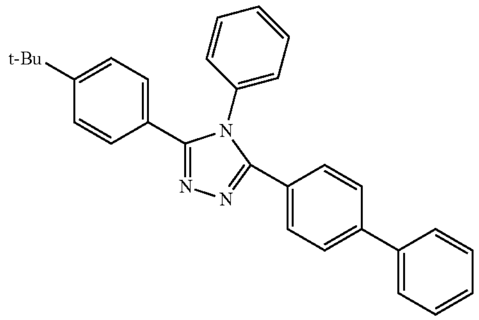

TAZ

-continued

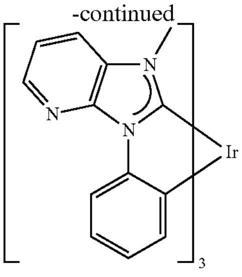

Ir(pmp)$_3$

Examples 2 to 7 and Comparative Examples 1 to 6

Light-emitting devices were each manufactured in substantially the same manner as in Example 1, except that compounds shown in Table 1 were each utilized instead of Compound 5 in forming a respective emission layer.

Evaluation Example 1

The driving voltage, luminescence efficiency, maximum quantum efficiency, and triplet energy ($T_1$) of each of the light-emitting devices according to Examples 1 to 7 and Comparative Examples 1 to 6 at a current density of 10 mA/cm$^2$ were measured.

The driving voltage, current density, and luminescence efficiency were each measured by utilizing a source meter (Keithley Instrument Inc., 2400 series). The maximum quantum efficiency was measured by utilizing the external quantum efficiency measurement apparatus C9920-2-12 of Hamamatsu Photonics Inc. In evaluating the maximum quantum efficiency, the luminance/current density was measured utilizing a luminance meter that was calibrated for wavelength sensitivity, and the maximum quantum efficiency was converted by assuming an angular luminance distribution (Lambertian) which introduced a perfect reflecting diffuser. The triplet energy ($T_1$) was calculated by utilizing the Gaussian 16 program, and singlet ground state geometry was optimized at the level of B3LYP/6-31 G(d). Then, TD-DFT (time-dependent density-functional theory) singlet and triplet excitation energies (vertical transitions) were calculated by utilizing optimized ground state geometry and the same method (B3LYP/6-31G(d)), and default settings were applied for self-consistent field (SCF) and geometry convergence.

The evaluation results of the characteristics of each of the light-emitting devices are shown in Table 1.

TABLE 1

| | Dopant in emission layer | Driving voltage (V) | Luminescence efficiency (cd/A) | Maximum quantum efficiency (%) | $T_1$ (eV) | Emission color |
|---|---|---|---|---|---|---|
| Example 1 | Compound 5 | 3.9 | 25.6 | 28.9 | 3.00 | Blue |
| Example 2 | Compound 16 | 4.4 | 24.3 | 27.2 | 2.94 | Blue |
| Example 3 | Compound 25 | 4.2 | 25.5 | 28.6 | 3.00 | Blue |
| Example 4 | Compound 33 | 3.7 | 25.0 | 27.4 | 3.00 | Blue |
| Example 5 | Compound 38 | 4.1 | 24.5 | 28.0 | 3.01 | Blue |
| Example 6 | Compound 41 | 3.4 | 24.0 | 25.9 | 3.00 | Blue |
| Example 7 | Compound 47 | 3.8 | 24.2 | 27.8 | 2.99 | Blue |
| Comparative Example 1 | Compound CE1 | 4.9 | 15.2 | 26.2 | 2.89 | Blue |
| Comparative Example 2 | Compound CE2 | 4.3 | 20.7 | 24.1 | 2.78 | Blue |
| Comparative Example 3 | Compound CE3 | 4.2 | 17.1 | 23.1 | 2.83 | Blue |
| Comparative Example 4 | Compound CE4 | 4.5 | 17.4 | 23.5 | 2.86 | Blue |
| Comparative Example 5 | Compound CE5 | 4.6 | 15.8 | 23.2 | 2.72 | Blue |
| Comparative Example 6 | Compound CE6 | 4.5 | 15.0 | 23.0 | 2.74 | Blue |

5
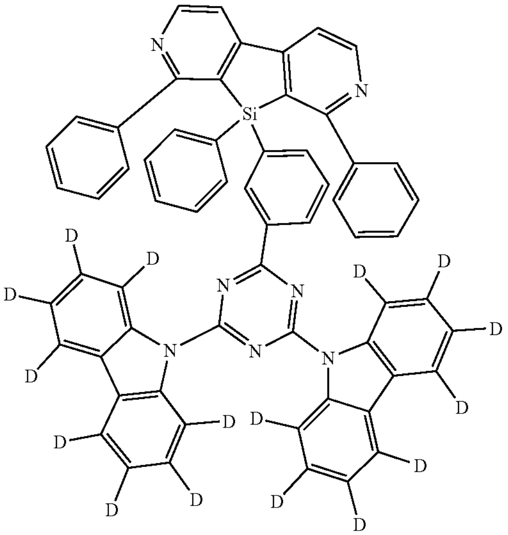
16
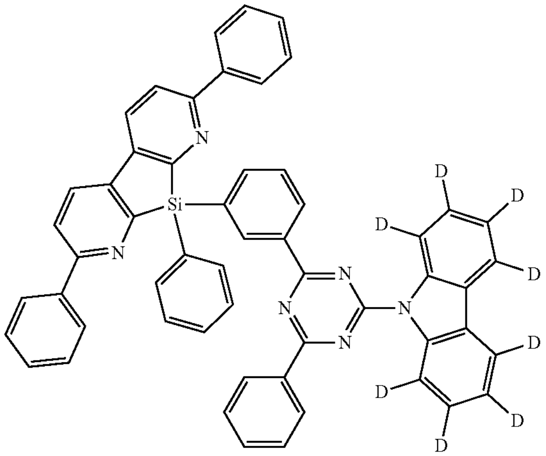
25
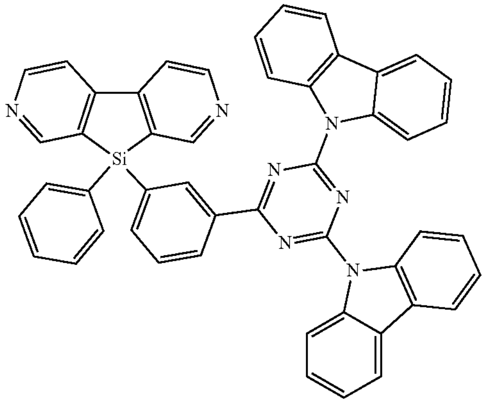
-continued
33
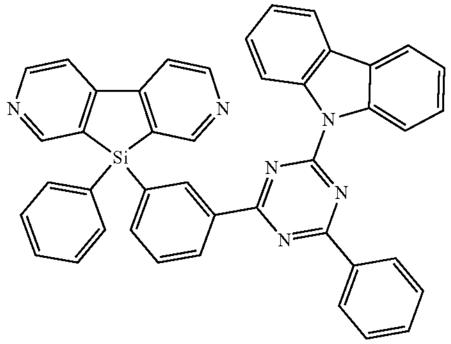
38
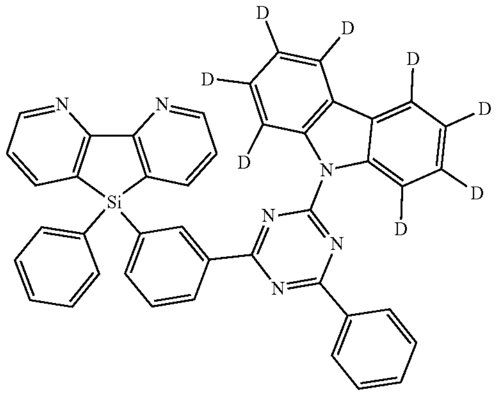
41
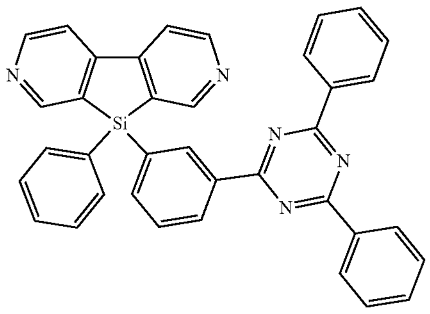
47
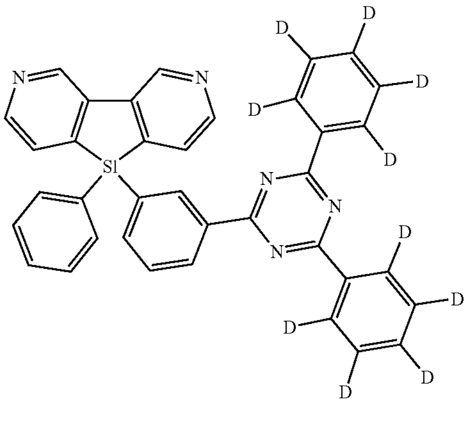

-continued
CE1
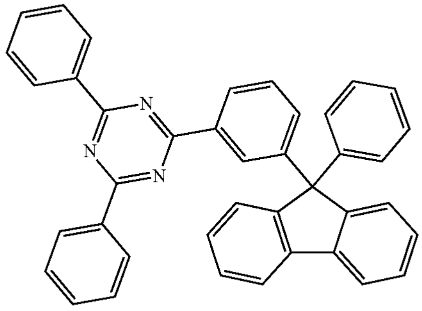
CE2
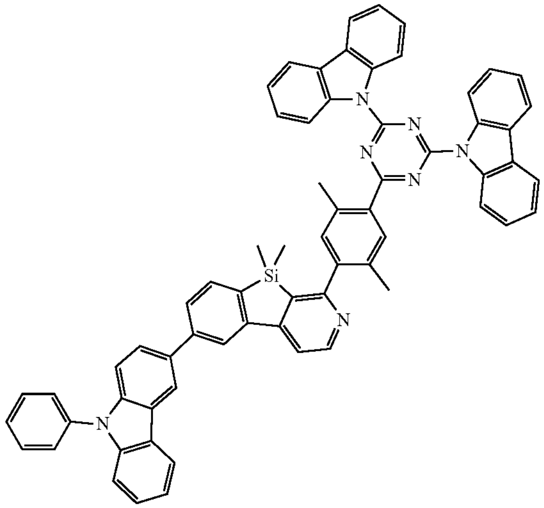
CE3
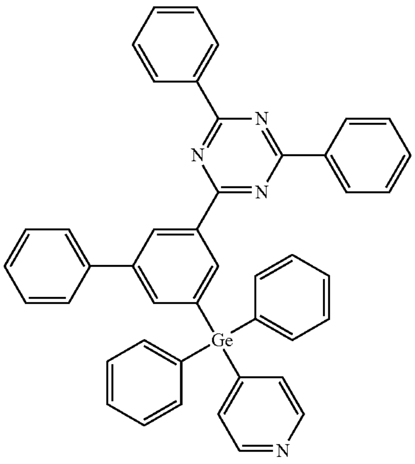
-continued
CE4
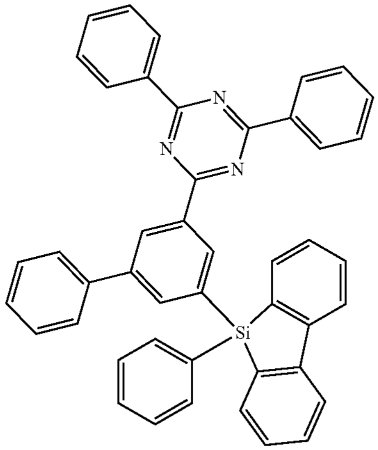
CE5
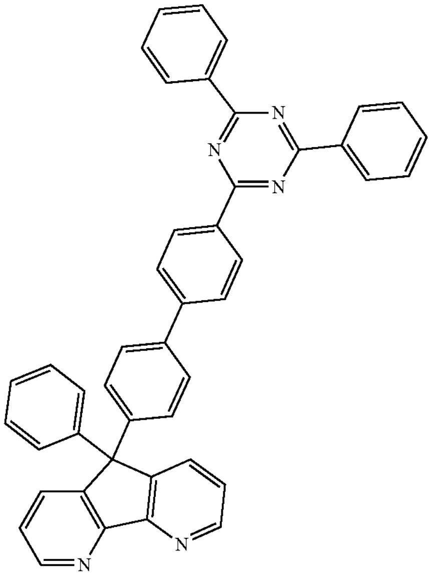
CE6
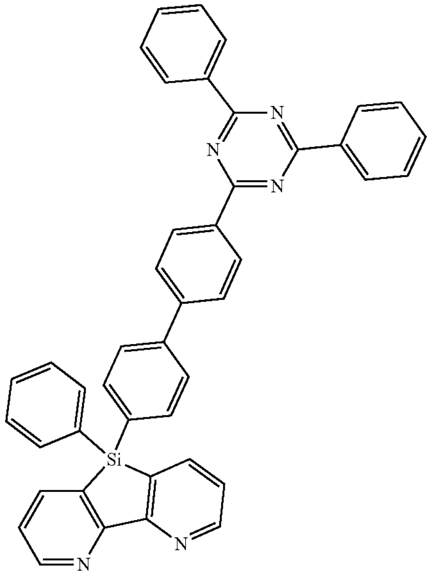
From Table 1, it was confirmed that the light-emitting devices according to Examples 1 to 7 were each a blue light-emitting device having lower driving voltage, higher luminescence efficiency, higher maximum quantum efficiency, and/or higher triplet energy than the light-emitting devices according to Comparative Examples 1 to 6.

According to the one or more embodiments, an organic compound represented by Formula 1 may have improved charge transfer characteristics, suppress or reduce an increase in conjugation, and have high triplet energy. Accordingly, a light-emitting device utilizing the organic compound may have improved luminescence efficiency and maximum quantum efficiency.

In the present disclosure, it will be understood that the terms “comprise(s),” “include(s),” or “have/has” specify the presence of stated features, integers, steps, operations, elements, and/or components, but do not preclude the presence or addition of one or more other features, integers, steps, operations, elements, components, and/or groups thereof.

Throughout the present disclosure, when a component such as a layer, a film, a region, or a plate is mentioned to be placed “on” another component, it will be understood that it may be directly on another component or that another component may be interposed therebetween. In some embodiments, “directly on” may refer to that there are no additional layers, films, regions, plates, etc., between a layer, a film, a region, a plate, etc. and the other part. For example, “directly on” may refer to two layers or two members are disposed without utilizing an additional member such as an adhesive member therebetween.

In the present disclosure, although the terms “first,” “second,” etc., may be utilized herein to describe one or more elements, components, regions, and/or layers, these elements, components, regions, and/or layers should not be limited by these terms. These terms are only utilized to distinguish one component from another component.

As utilized herein, the singular forms “a,” “an,” “one,” and “the” are intended to include the plural forms as well, unless the context clearly indicates otherwise. Further, the use of “may” when describing embodiments of the present disclosure refers to “one or more embodiments of the present disclosure”.

As utilized herein, the terms “substantially,” “about,” or similar terms are used as terms of approximation and not as terms of degree, and are intended to account for the inherent deviations in measured or calculated values that would be recognized by those of ordinary skill in the art. “About” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value.

Any numerical range recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in the present disclosure is intended to include all higher numerical limitations subsumed therein. Accordingly, Applicant reserves the right to amend the disclosure, including the claims, to expressly recite any sub-range subsumed within the ranges expressly recited herein.

In the present disclosure, when particles are spherical, “size” indicates a particle diameter or an average particle diameter, and when the particles are non-spherical, the “size” indicates a major axis length or an average major axis length. The diameter (or size) of the particles may be measured utilizing a scanning electron microscope or a particle size analyzer. As the particle size analyzer, for example, HORIBA, LA-950 laser particle size analyzer, may be utilized. When the size of the particles is measured utilizing a particle size analyzer, the average particle diameter (or size) is referred to as D50. D50 refers to the average diameter (or size) of particles whose cumulative volume corresponds to 50 vol % in the particle size distribution (e.g., cumulative distribution), and refers to the value of the particle size corresponding to 50% from the smallest particle when the total number of particles is 100% in the distribution curve accumulated in the order of the smallest particle size to the largest particle size.

The light-emitting device, the light-emitting apparatus, the display device, the electronic apparatus, the electronic device, or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A light-emitting device, comprising:

a first electrode;

a second electrode facing the first electrode;

an interlayer between the first electrode and the second electrode and comprising an emission layer; and an organic compound represented by Formula 1:

Formula 1

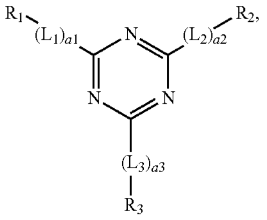

wherein, in Formula 1, $L_1$ to $L_3$, $R_1$, and $R_2$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, each of a1 to a3 is an integer from 0 to 2, when a1 is 0, $(L_1)_{a1}$ is a single bond, and when a1 is 2, two of $L_1$(s) are identical to or different from each other, when a2 is 0, $(L_2)_{a2}$ is a single bond, and when a2 is 2, two of $L_2$(s) are identical to or different from each other, when a3 is 0, $(L_3)_{a3}$ is a single bond, and when a3 is 2, two of $L_3$(s) are identical to or different from each other, and $R_3$ is a group represented by Formula 2:

Formula 2

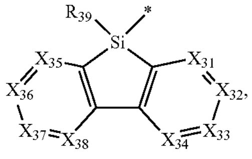

wherein, in Formula 2, $X_{31}$ is N or $C(R_{31})$, $X_{32}$ is N or $C(R_{32})$, $X_{33}$ is N or $C(R_{33})$, $X_{34}$ is N or $C(R_{34})$, $X_{35}$ is N or $C(R_{35})$, $X_{36}$ is N or $C(R_{36})$, $X_{37}$ is N or $C(R_{37})$, $X_{38}$ is N or $C(R_{38})$, and at least one selected from among $X_{31}$ to $X_{38}$ is N, at least one of $R_1$ or $R_2$ is represented by Formula 4-2:

Formula 4-2

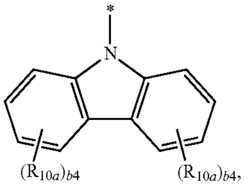

wherein, in Formula 4-2, b4 is an integer from 0 to 4, $R_{10a}$ and $R_{31}$ to $R_{39}$ are each independently:

hydrogen, deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, $Q_{11}$ to $Q_{13}$, $Q_{21}$ to $Q_{23}$, and $Q_{31}$ to $Q_{33}$ are each independently:

hydrogen, deuterium, —F, a cyano group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a biphenyl group, or a terphenyl group;

a $C_3$-$C_{60}$ carbocyclic group unsubstituted or substituted with deuterium, —F, a cyano group, a $C_1$-$C_{60}$ alkyl group, a phenyl group, a biphenyl group, a terphenyl group, or any combination thereof;

a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof; or a $C_3$-$C_{60}$ carbocyclic group or a $C_1$-$C_{60}$ heterocyclic group, each unsubstituted or substituted with a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof, and

* indicates a binding site to a neighboring atom.

2. The light-emitting device of claim 1, wherein the interlayer comprises the organic compound.

3. The light-emitting device of claim 1, wherein the emission layer is to emit blue light.

4. The light-emitting device of claim 1, further comprising:

a hole transport region between the first electrode and the emission layer;

an electron transport region between the emission layer and the second electrode; and a first capping layer outside the first electrode, a second capping layer outside the second electrode, or any combination thereof, wherein at least one of the emission layer, the first capping layer, or the second capping layer comprises the organic compound.

5. An electronic apparatus, comprising:

the light-emitting device of claim 1;

a thin-film transistor electrically connected to the light-emitting device; and a color filter, a color conversion layer, a touch screen layer, a polarizing layer, or any combination thereof.

6. An electronic equipment comprising the light-emitting device of claim 1, wherein the electronic equipment is at least one of a flat panel display, a curved display, a computer monitor, a medical monitor, a television, a billboard, a light for indoor or outdoor lighting and/or signaling, a head-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro display, a 3D display, a virtual or augmented reality display, a vehicle, a video wall comprising multiple displays tiled together, a theater or stadium screen, a phototherapy device, or a signboard.

7. An organic compound represented by Formula 1:

Formula 1

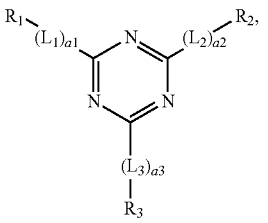

wherein, in Formula 1, $L_1$ to $L_3$, $R_1$, and $R_2$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, each of a1 to a3 is an integer from 0 to 2, when a1 is 0, $(L_1)_{a1}$ is a single bond, and when a1 is 2, two of $L_1$(s) are identical to or different from each other, when a2 is 0, $(L_2)_{a2}$ is a single bond, and when a2 is 2, two of $L_2$(s) are identical to or different from each other, when a3 is 0, $(L_3)_{a3}$ is a single bond, and when a3 is 2, two of $L_3$(s) are identical to or different from each other, and $R_3$ is a group represented by Formula 2:

Formula 2

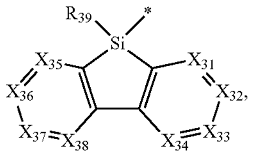

wherein, in Formula 2, $X_{31}$ is N or $C(R_{31})$, $X_{32}$ is N or $C(R_{32})$, $X_{33}$ is N or $C(R_{33})$, $X_{34}$ is N or $C(R_{34})$, $X_{35}$ is N or $C(R_{35})$, $X_{36}$ is N or $C(R_{36})$, $X_{37}$ is N or $C(R_{37})$, $X_{38}$ is N or $C(R_{38})$, and at least one selected from among $X_{31}$ to $X_{38}$ is N, at least one of $R_1$ or $R_2$ is represented by Formula 4-2:

Formula 4-2

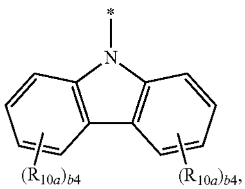

wherein, in Formula 4-2, b4 is an integer from 0 to 4, $R_{10a}$ and $R_{31}$ to $R_{39}$ are each independently:

hydrogen, deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, $Q_{11}$ to $Q_{13}$, $Q_{21}$ to $Q_{23}$, and $Q_{31}$ to $Q_{33}$ are each independently:

hydrogen, deuterium, —F, a cyano group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a biphenyl group, or a terphenyl group;

a $C_3$-$C_{60}$ carbocyclic group unsubstituted or substituted with deuterium, —F, a cyano group, a $C_1$-$C_{60}$ alkyl group, a phenyl group, a biphenyl group, a terphenyl group, or any combination thereof;

a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof; or a $C_3$-$C_{60}$ carbocyclic group or a $C_1$-$C_{60}$ heterocyclic group, each unsubstituted or substituted with a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a phenyl group, a biphenyl group, a terphenyl group, or any combination thereof, and

* indicates a binding site to a neighboring atom.

8. The organic compound of claim 7, wherein, in Formula 1, a3 is 1.

9. The organic compound of claim 7, wherein, in Formula 1, $L_3$ is a benzene group unsubstituted or substituted with at least one $R_{10a}$.

10. The organic compound of claim 7, wherein, in Formula 2, at least two selected from among $X_{31}$ to $X_{38}$ are each N.

11. The organic compound of claim 7, wherein, in Formula 2, at least one selected from among $X_{31}$ to $X_{34}$ is N, and at least one selected from among $X_{35}$ to $X_{38}$ is N.

12. The organic compound of claim 7, wherein, in Formula 2, i) each of $X_{31}$ and $X_{35}$ is N, ii) each of $X_{32}$ and $X_{36}$ is N, iii) each of $X_{33}$ and $X_{37}$ is N, or iv) each of $X_{34}$ and $X_{38}$ is N.

13. The organic compound of claim 7, wherein, in Formula 1, $R_3$ is represented by one selected from among Formulae 2-1 to 2-4:

Formula 2-1

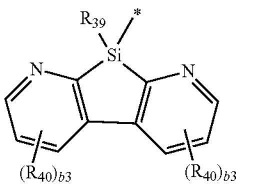

Formula 2-2

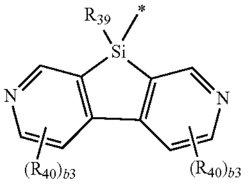

Formula 2-3

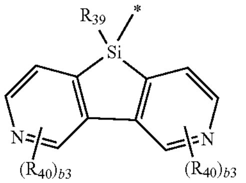

Formula 2-4

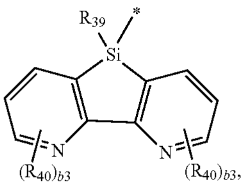

and wherein, in Formulae 2-1 to 2-4, $R_{40}$ is a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a $C_3$-$C_{60}$ carbocyclic group, a $C_1$-$C_{60}$ heterocyclic group, or any combination thereof, b3 is an integer from 0 to 3, and

* indicates a binding site to a neighboring atom.

14. The organic compound of claim 13, wherein, in Formulae 2-1 to 2-4, b3 is 1, and $R_{40}$ is a phenyl group.

15. The organic compound of claim 7, wherein $R_{31}$ to $R_{39}$ are each independently: hydrogen; deuterium; or a phenyl group unsubstituted or substituted with deuterium.

16. The organic compound of claim 7, wherein, in Formula 2, $R_{39}$ is a phenyl group.

17. The organic compound of claim 7, wherein the organic compound is one selected from Compounds 1 to 16 and 25 to 40:

1

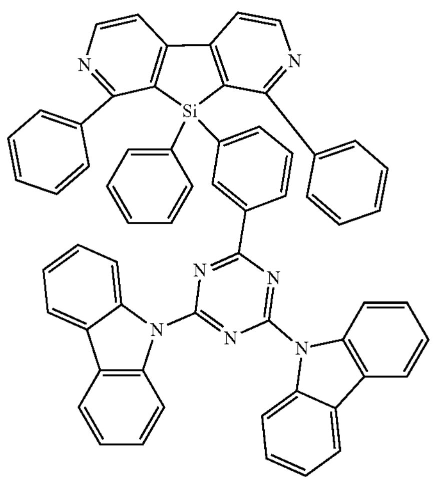

2

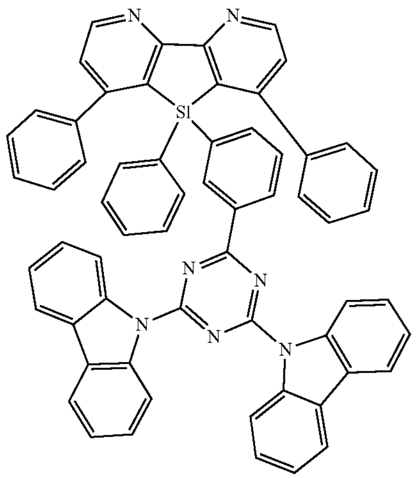

-continued
3
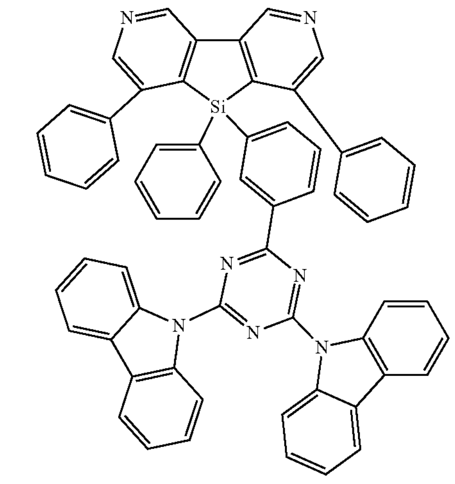
4
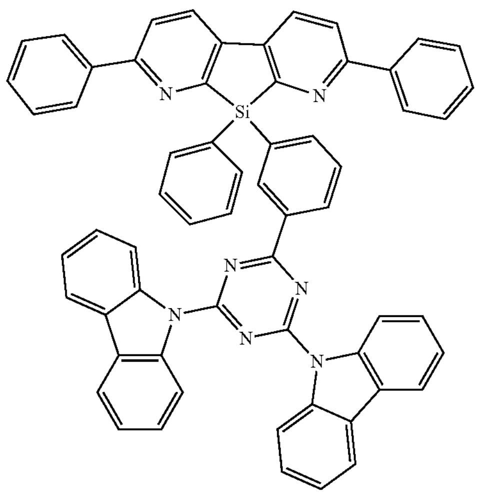
5
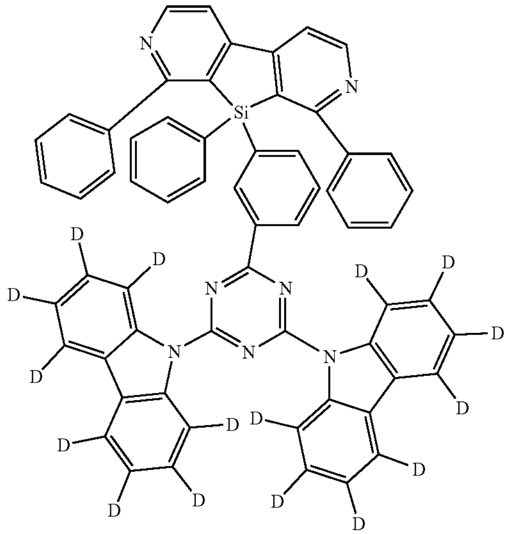
-continued
6
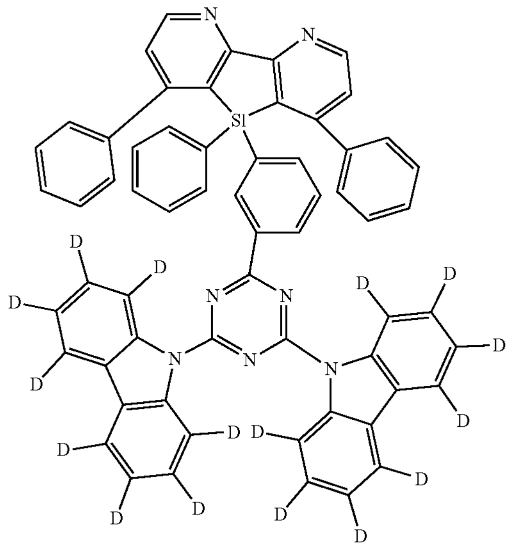
7
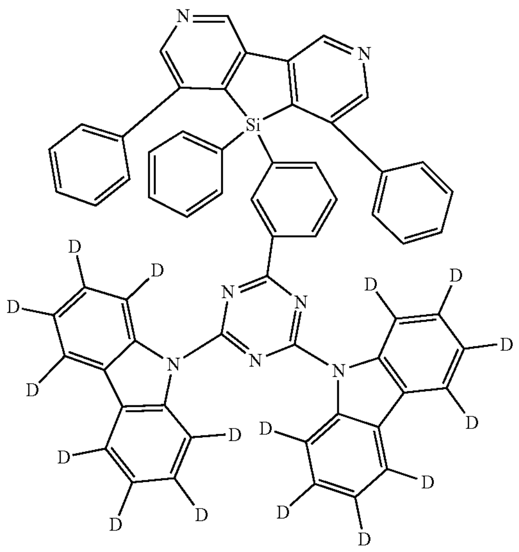
8
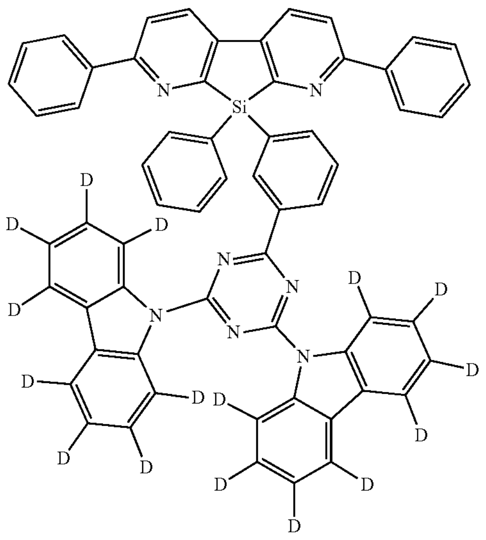

-continued
9
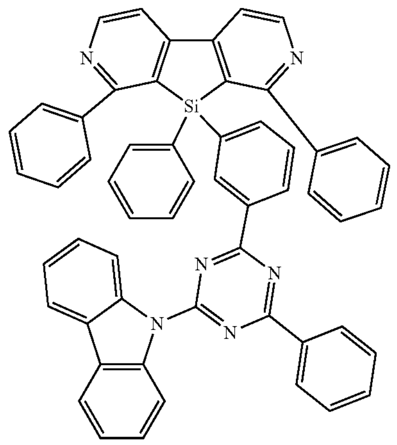
12
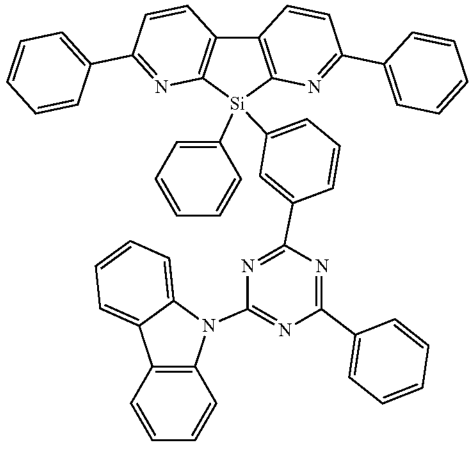
10
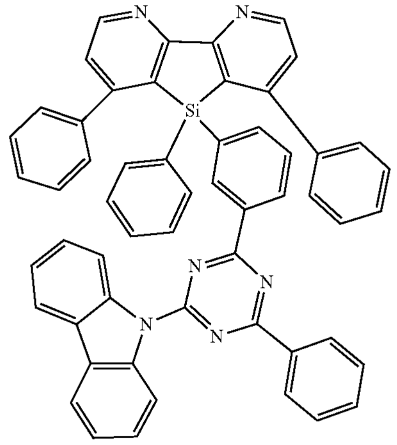
13
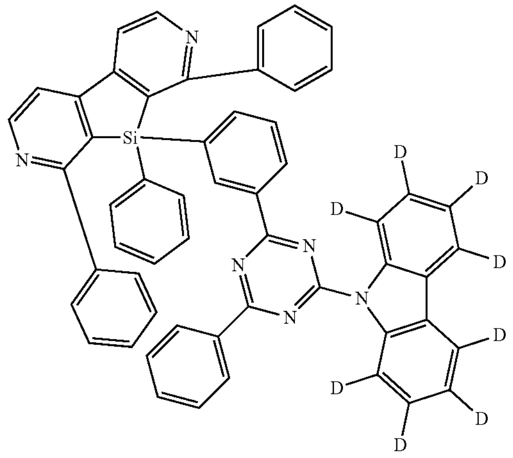
11
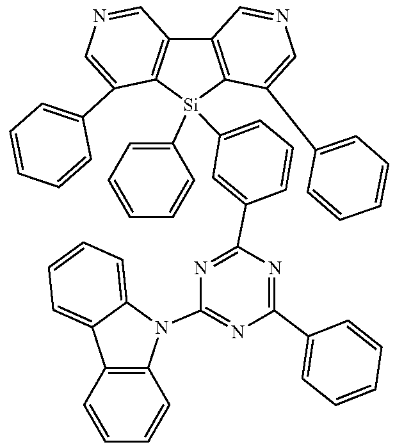
14
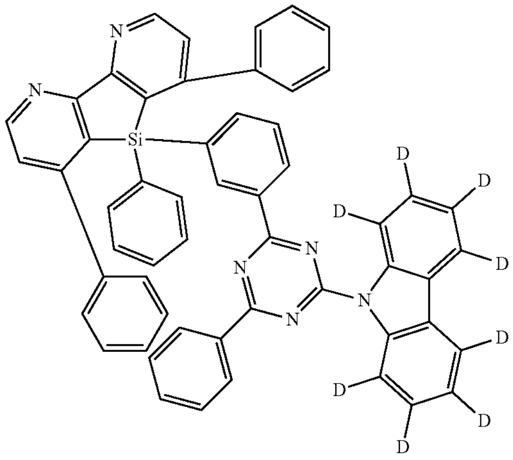

-continued
15
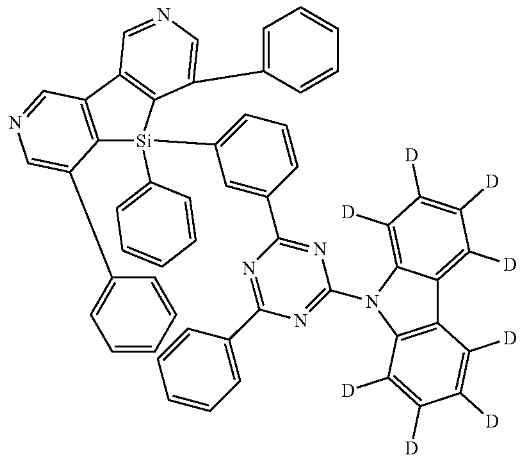
16
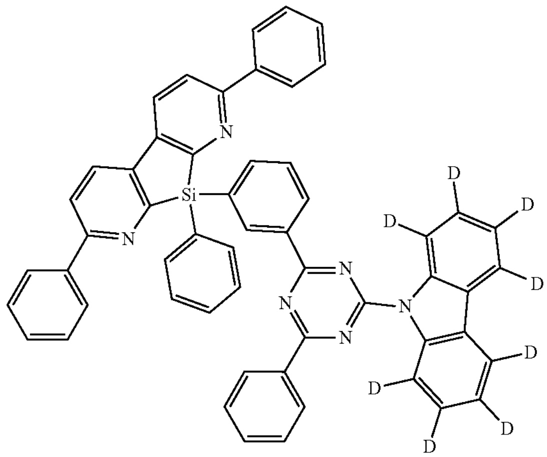
25
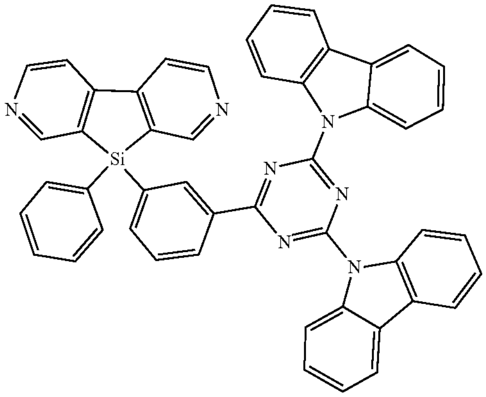
-continued
26
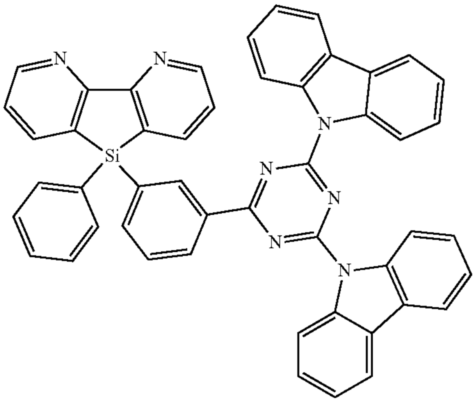
27
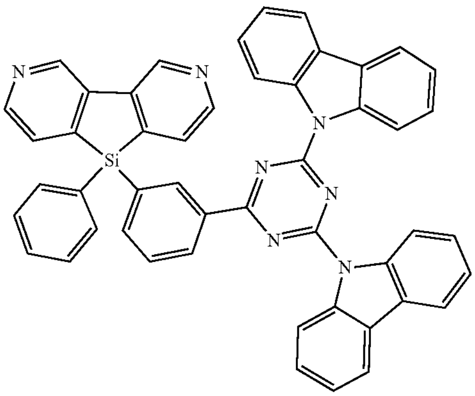
28
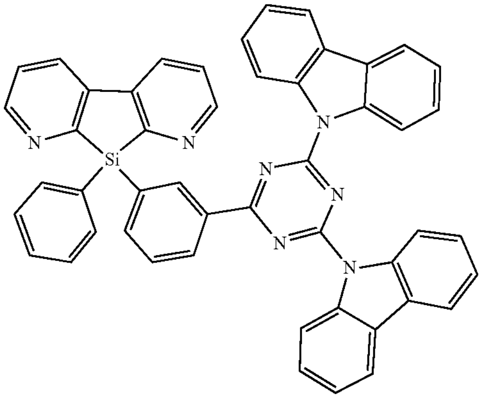

-continued
29
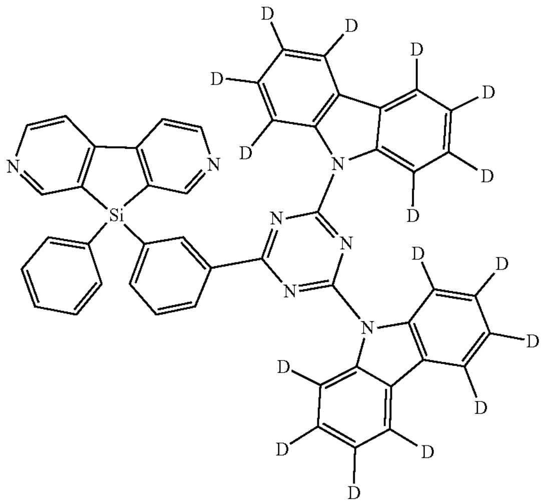
30
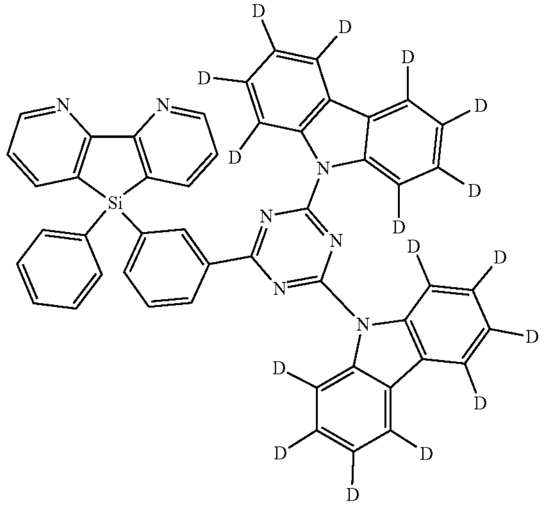
31
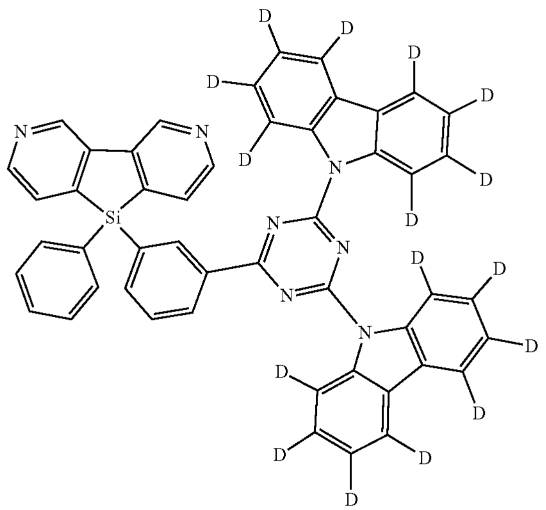
-continued
32
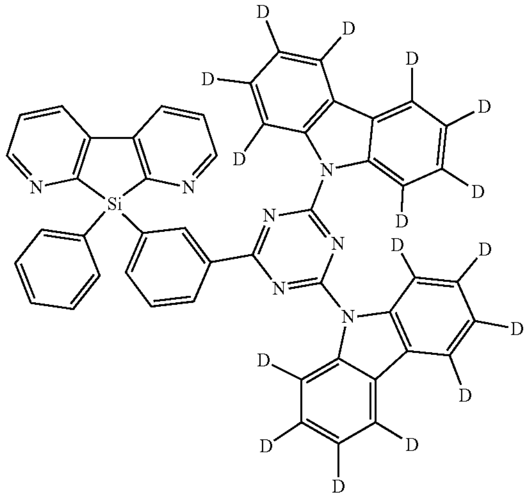
33
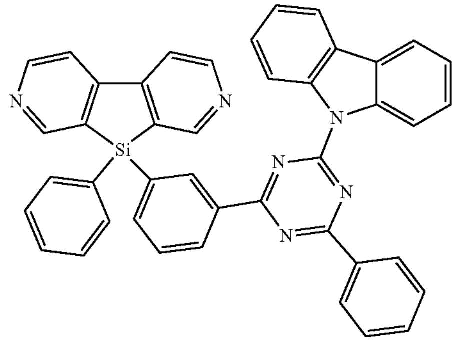
34
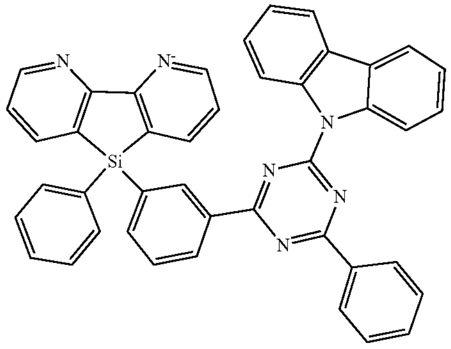
35
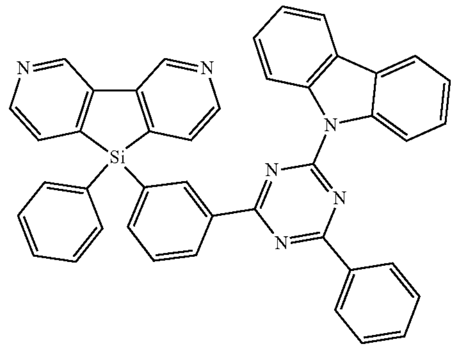

-continued
36
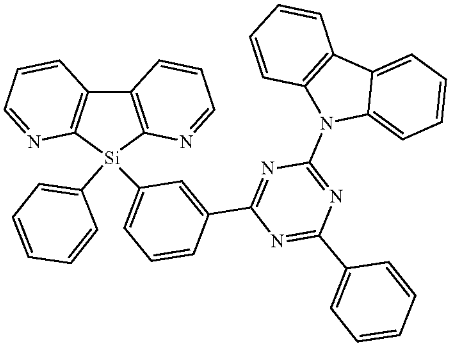
37
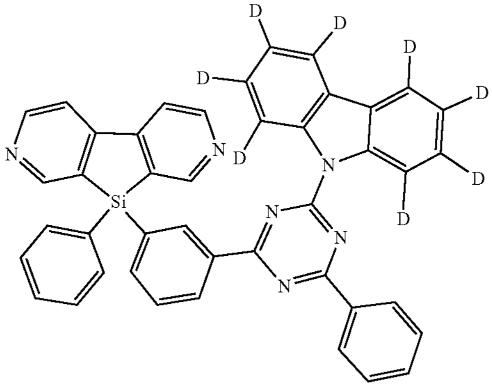
38
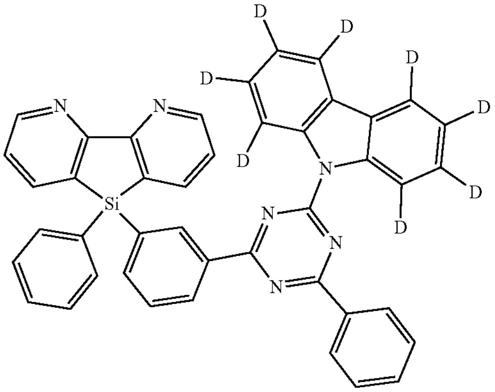
-continued
39
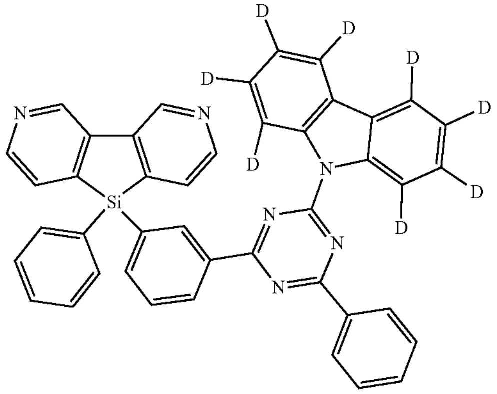
40
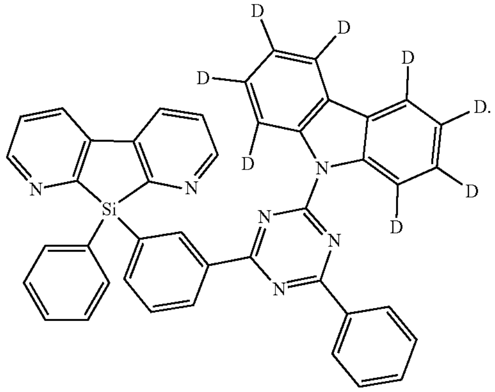
* * * * *